(12) United States Patent
Toyama et al.

(10) Patent No.: US 11,239,401 B2
(45) Date of Patent: Feb. 1, 2022

(54) SEMICONDUCTOR LIGHT-EMITTING DEVICE

(71) Applicant: ROHM CO., LTD., Kyoto (JP)

(72) Inventors: Tomoichiro Toyama, Kyoto (JP); Hideaki Anzai, Kyoto (JP); Kenya Hashimoto, Kyoto (JP); Ryo Yatagai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/933,756

(22) Filed: Jul. 20, 2020

(65) Prior Publication Data

US 2020/0350478 A1 Nov. 5, 2020

Related U.S. Application Data

(63) Continuation of application No. 16/214,990, filed on Dec. 10, 2018, now Pat. No. 10,763,414.

(30) Foreign Application Priority Data

| Dec. 18, 2017 | (JP) | JP2017-241495 |
| Dec. 18, 2017 | (JP) | JP2017-241805 |
| Nov. 15, 2018 | (JP) | JP2018-214743 |

(51) Int. Cl.
*H01L 33/62* (2010.01)
*H01L 33/48* (2010.01)
*H01L 33/24* (2010.01)

(52) U.S. Cl.
CPC .............. *H01L 33/62* (2013.01); *H01L 33/24* (2013.01); *H01L 33/486* (2013.01)

(58) Field of Classification Search
CPC ........ H01L 33/62; H01L 33/24; H01L 33/486
USPC ........................................................ 257/79
See application file for complete search history.

(56) References Cited

U.S. PATENT DOCUMENTS

| 2004/0104391 | A1* | 6/2004 | Maeda ................. C09K 11/025 257/79 |
| 2004/0135504 | A1* | 7/2004 | Tamaki ............... C01B 21/0602 313/512 |
| 2007/0259206 | A1* | 11/2007 | Oshio ................ C09K 11/7715 428/690 |
| 2009/0140630 | A1 | 6/2009 | Kijima et al. |
| 2010/0013373 | A1 | 1/2010 | Hata et al. |
| 2010/0230691 | A1 | 9/2010 | Inoue et al. |

(Continued)

FOREIGN PATENT DOCUMENTS

JP 2017-126743 A 7/2017

*Primary Examiner* — Dzung Tran
(74) *Attorney, Agent, or Firm* — Hamre, Schumann, Mueller & Larson, P.C.

(57) ABSTRACT

A semiconductor light-emitting device includes a substrate having a base, a conductive layer and an insulating layer, a semiconductor light-emitting element and a resin member. The base has a pair of base first side surfaces and a pair of base third side surfaces. The conductive layer includes a front-surface segment and a side-surface segment. The front surface segment includes a front-surface first part. The insulating layer includes an insulating-layer first part and an insulating-layer second part. The resin member covers the insulating-layer first part and the insulating-layer second part of the insulating layer. A first thickness of the insulating-layer first part is greater than a second thickness of the insulating-layer second part.

17 Claims, 47 Drawing Sheets

(56) References Cited

U.S. PATENT DOCUMENTS

| | | |
|---|---|---|
| 2011/0186868 A1 | 8/2011 | Watari et al. |
| 2014/0054634 A1 | 2/2014 | Fukuda et al. |
| 2017/0200876 A1 | 7/2017 | Iino |

* cited by examiner

FIG.42

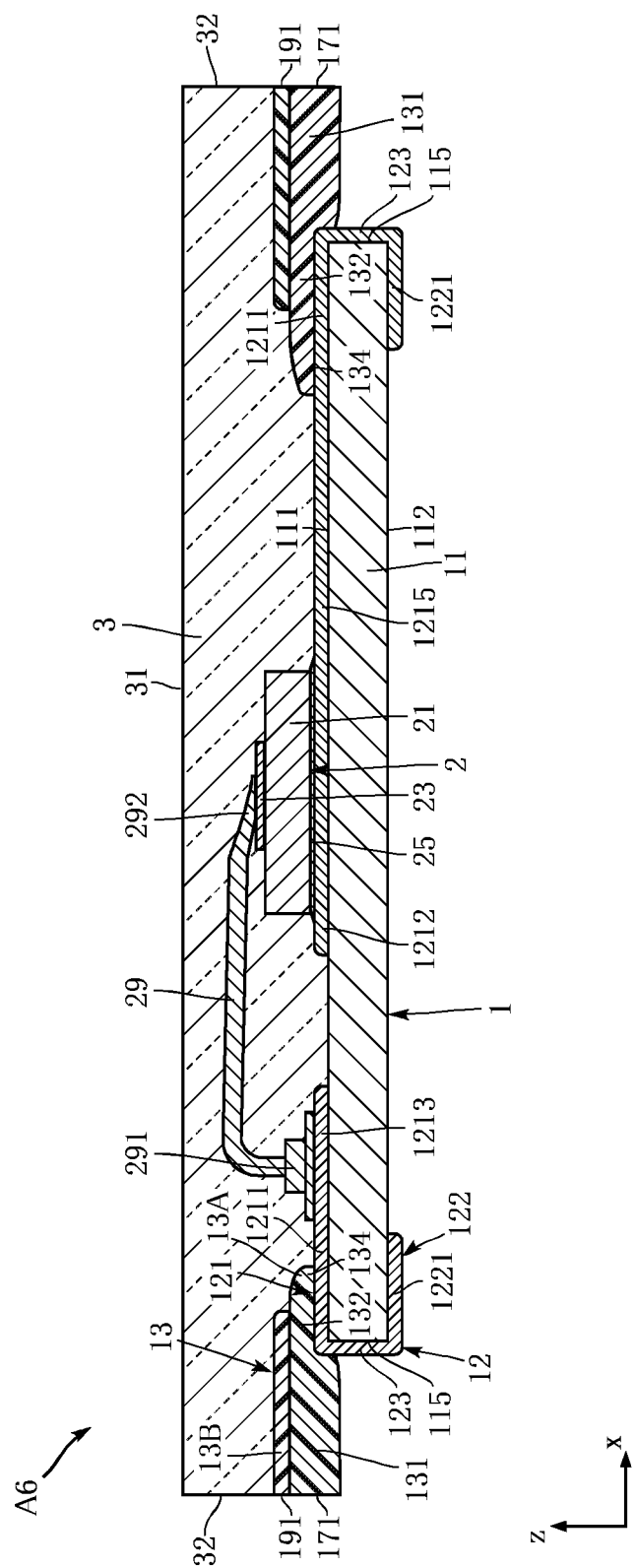

SEMICONDUCTOR LIGHT-EMITTING DEVICE

BACKGROUND OF THE INVENTION

1. Field of the Invention

The present disclosure relates to semiconductor light-emitting devices.

2. Description of the Related Art

Patent document 1 discloses a conventional example of a semiconductor light-emitting device. The semiconductor light-emitting device disclosed in the document includes a substrate, a semiconductor light-emitting element and a resin member. The resin member transmits light from the semiconductor light-emitting element.

The shape of the resin member affect the output of light from the semiconductor light-emitting device. Depending on the shape of the resin member, the color of light produced by the semiconductor light-emitting device may be inconsistent. In addition, variations in the shape of the resin member are not preferable either. JP-A-2017-126743 is a document related to semiconductor light-emitting devices.

SUMMARY OF THE INVENTION

The present disclosure has been conceived in the circumstances described above, and aims to provide a semiconductor light-emitting device configured to reduce color inconsistencies. Additionally, the present disclosure aims to provide a semiconductor light-emitting device configured to ensure that variations in the shape of the resin member are reduced.

The present disclosure provides a semiconductor light-emitting device including: a substrate that includes an insulating base having a base front surface facing in one direction along a thickness direction and a base back surface facing in another direction along the thickness direction, a conductive layer formed on the base, and an insulating layer covering a part of the conductive layer; a semiconductor light-emitting element mounted on the base front surface of the substrate; and a resin member covering the semiconductor light-emitting element, the resin member being configured to transmit light from the semiconductor light-emitting element. The base of the substrate has: a pair of base first side surfaces connecting the base front surface and the base back surface and spaced apart from each other in a first direction; and a pair of base third side surfaces connecting the base front surface and the base back surface and each being recessed from one of the base first side surfaces toward the semiconductor light-emitting element as viewed in the thickness direction. The conductive layer has: a front-surface segment formed on the base front surface; and a side surface segment formed on one of the base third side surfaces. The front-surface segment has a front-surface first part that is integral with the side surface segment and adjacent to the base third side surface at a position closer to the semiconductor light-emitting element. The insulating layer has: an insulating-layer first part located opposite from the semiconductor light-emitting element across the base third side surface as viewed in the thickness direction; and an insulating-layer second part overlapping the front-surface first part of the conductive layer as viewed in the thickness direction. The resin member covers the insulating-layer first part and the insulating-layer second part of the insulating layer. The insulating-layer first part has an insulating-layer first surface that is in contact with the resin member. The insulating-layer second part has an insulating-layer second surface that is in contact with the resin member. A first distance from an insulating-layer first region on the insulating-layer first surface to a resin first region on a resin front surface of the resin member is longer than a second distance from an insulating-layer second region on the insulating-layer second surface to a resin second surface on the resin front surface of the resin member, the resin first region overlapping the insulating-layer first region as viewed in the thickness direction, the resin second region overlapping the insulating-layer second region as viewed in the thickness direction.

Other features and advantages of the present disclosure will be more apparent by reading the following detailed description with reference to the accompanying drawings.

BRIEF DESCRIPTION OF THE DRAWINGS

FIG. 42 is a sectional view taken along line XLII-XLII of FIG. 41.

FIG. 47 is a sectional view taken along line XLVII-XLVII of FIG. 46.

MODE FOR CARRYING OUT THE INVENTION

The terms such as "first", "second" and "third" are used merely as labels and not necessarily intended to imply any orderly relation among the items referred to by the terms.

First Embodiment

FIGS. 1 to 10 are views showing a semiconductor light-emitting device according to a first embodiment of the present disclosure. The semiconductor light-emitting device A1 of the present embodiment includes a substrate 1, a semiconductor light-emitting element 2 and a resin member 3. In these figures, the x direction corresponds to a first direction, the y direction to a second direction, and the z direction to a thickness direction. The x, y and z directions are perpendicular to each other. The semiconductor light-emitting device A1 is not limited to any specific shape and dimensions. In the present embodiment, the semiconductor light-emitting device has a rectangular shape as viewed in the z direction, measuring about 0.7 to 2.5 mm in the x direction, about 0.4 to 1.0 mm in the y direction and about 0.15 to 0.3 mm in the z direction.

Figure 1:
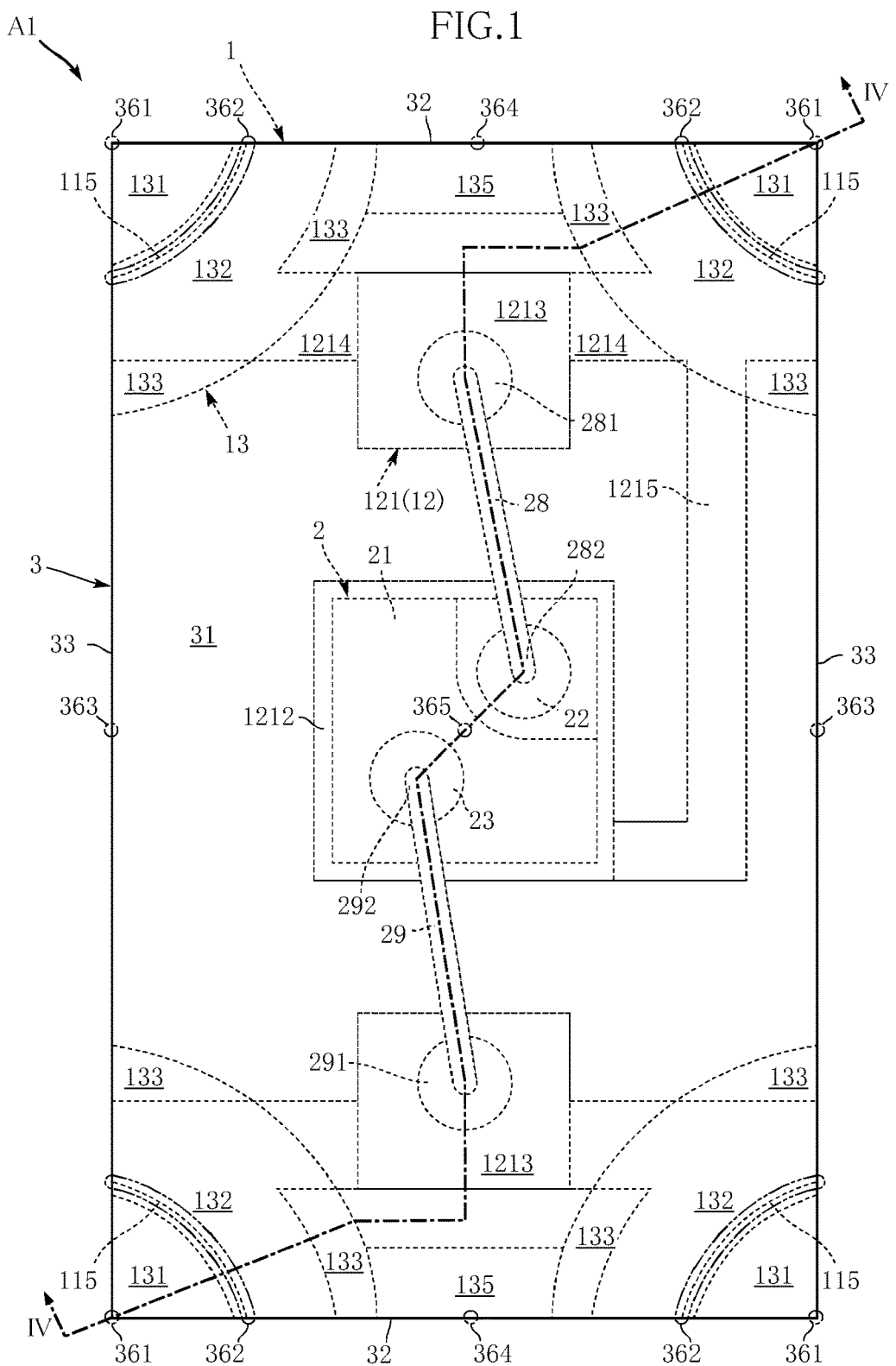
FIG. 1 is a plan view of a semiconductor light-emitting device according to a first embodiment of the present disclosure.
Figure 2:
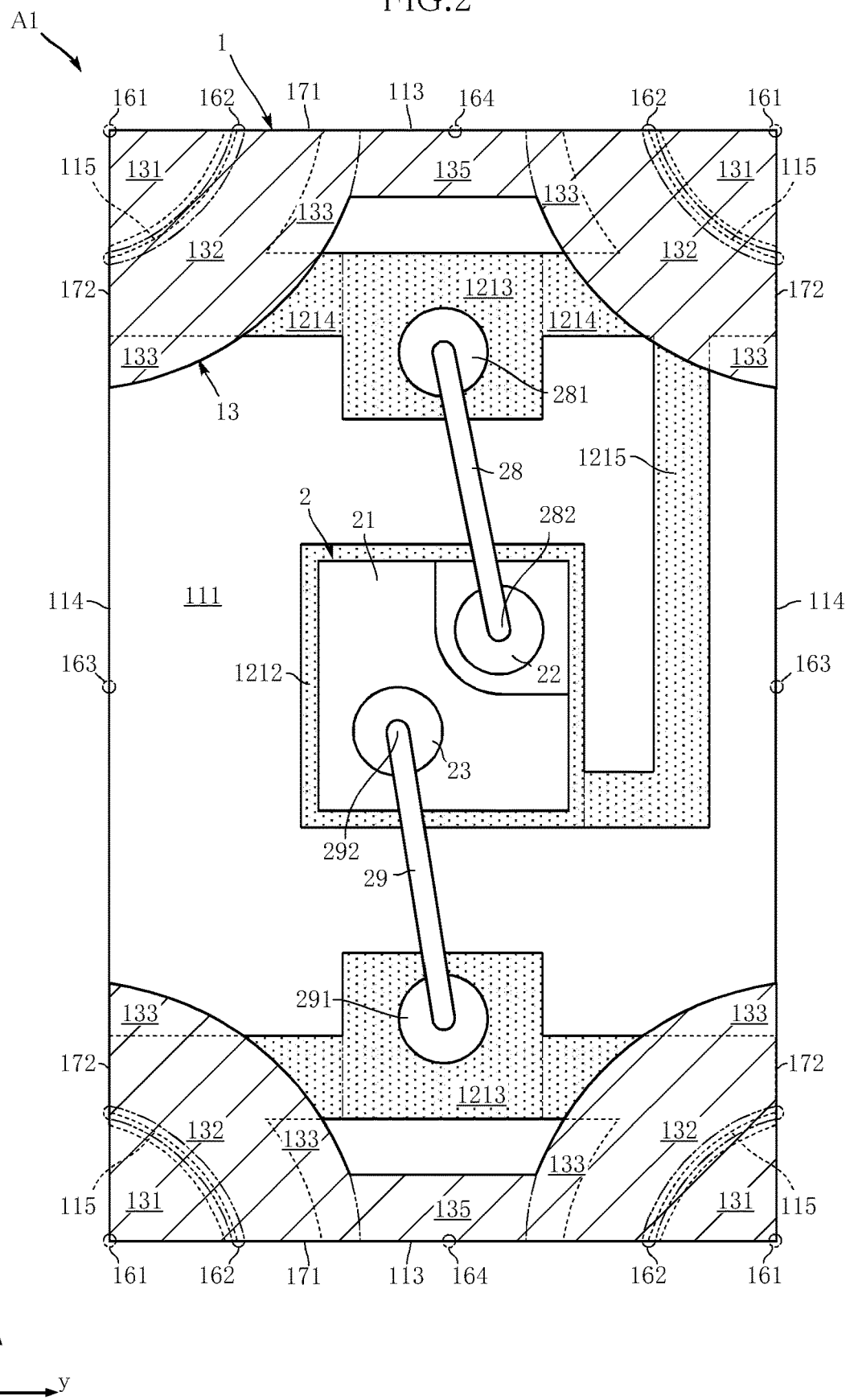
FIG. 2 is a fragmentary plan view of the semiconductor light-emitting device according to the first embodiment of the present disclosure.
Figure 3:
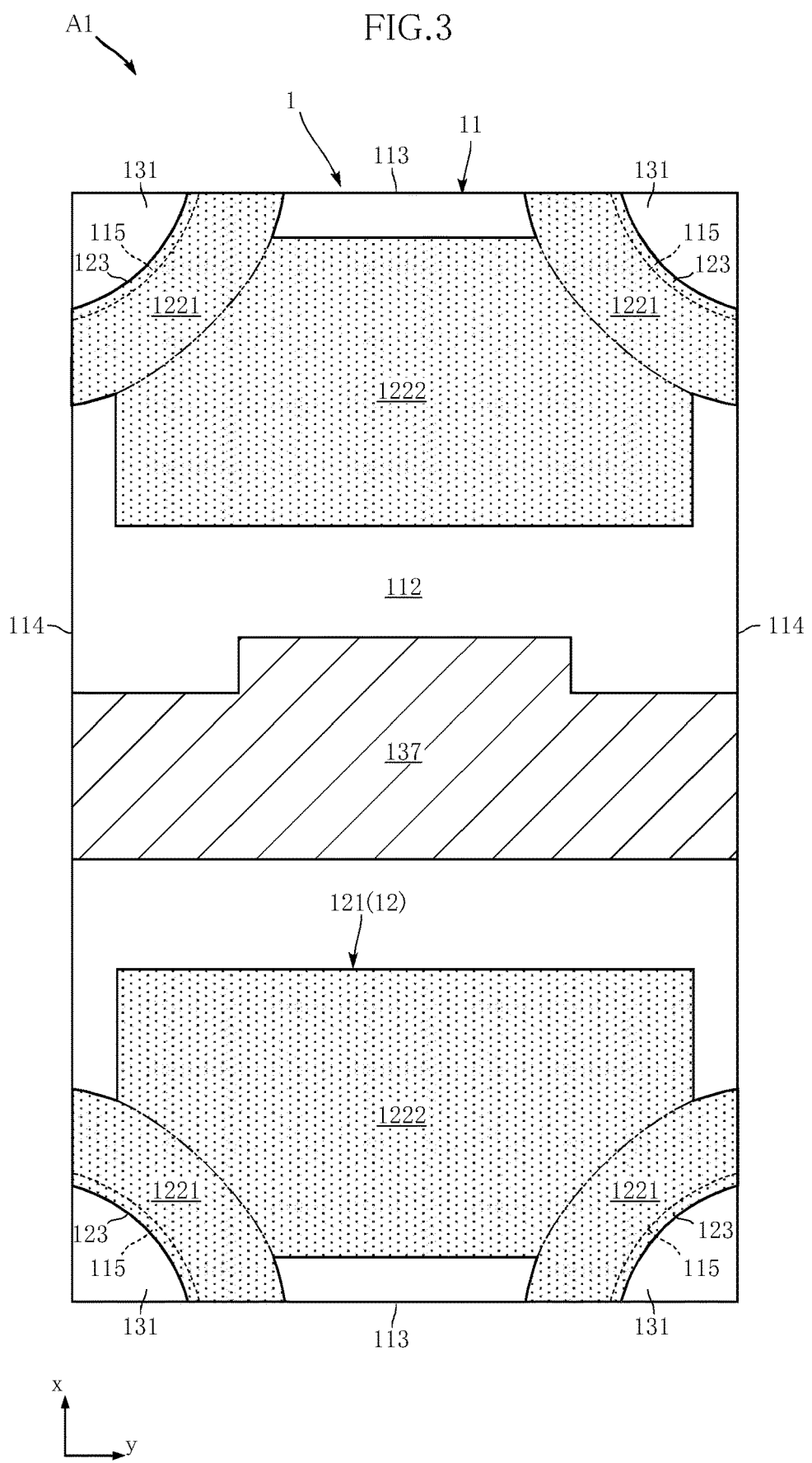
FIG. 3 is a bottom view of the semiconductor light-emitting device according to the first embodiment of the present disclosure.
Figure 4:
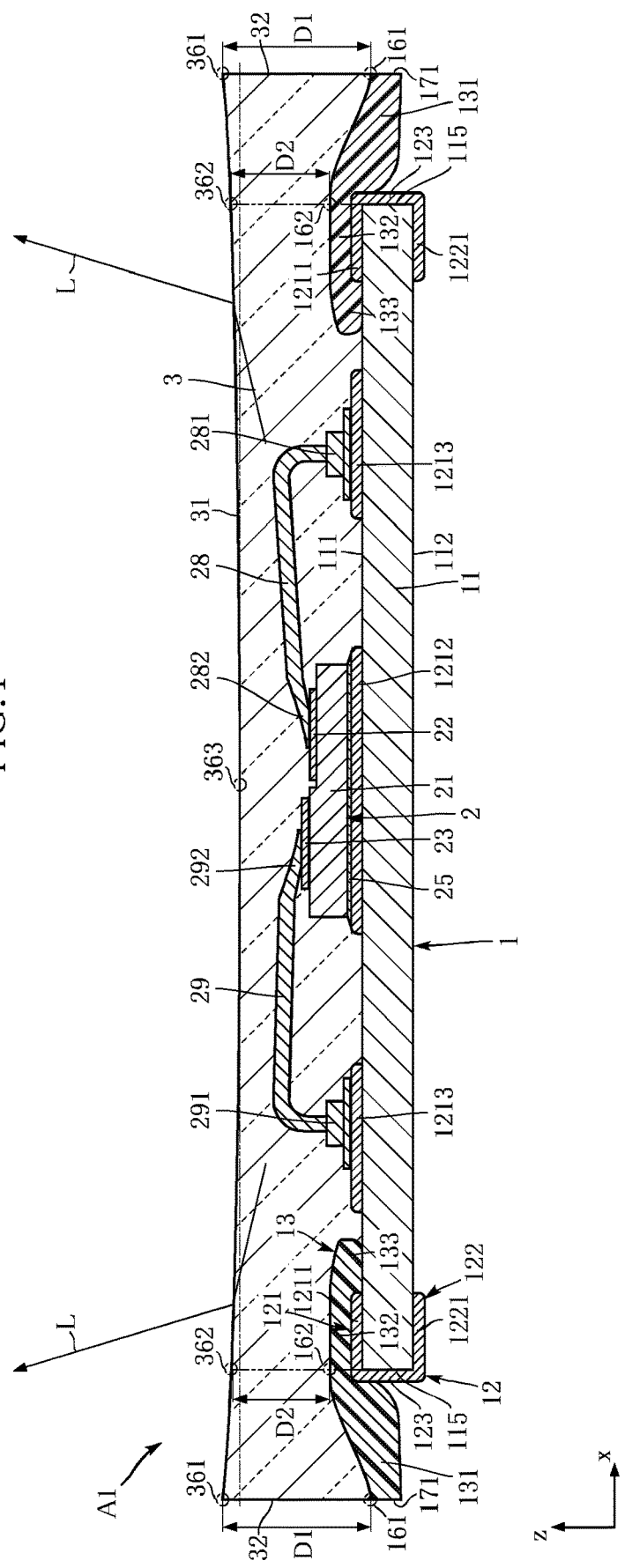
FIG. 4 is a sectional view taken along line IV-IV of FIG. 1.
Figure 5:
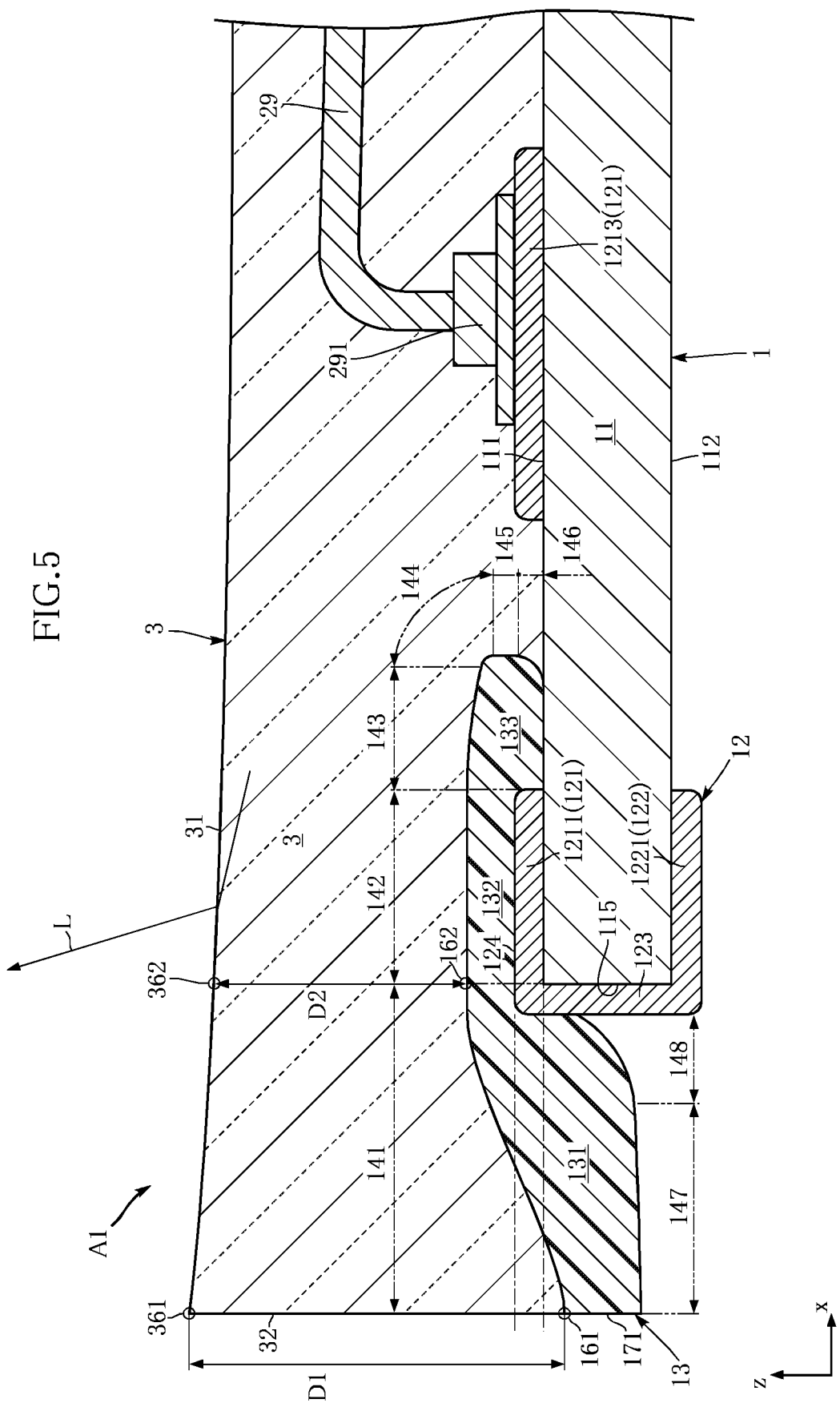
FIG. 5 is an enlarged fragmentary sectional view of the semiconductor light-emitting device according to the first embodiment of the present disclosure.
Figure 6:
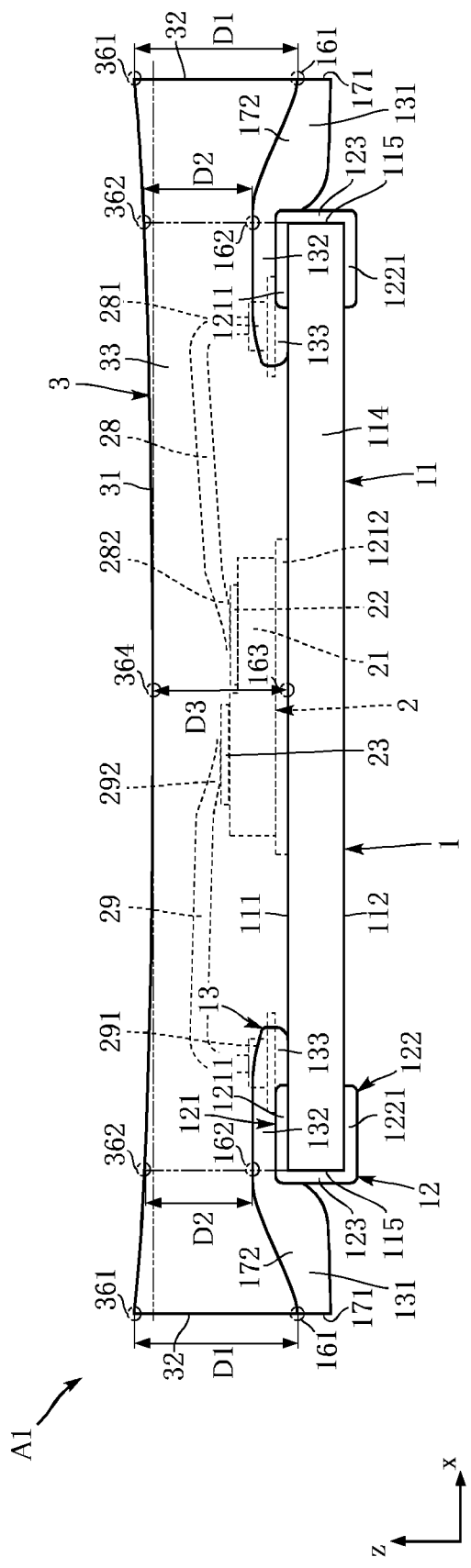
FIG. 6 is a front view of the semiconductor light-emitting device according to the first embodiment of the present disclosure.
Figure 7:
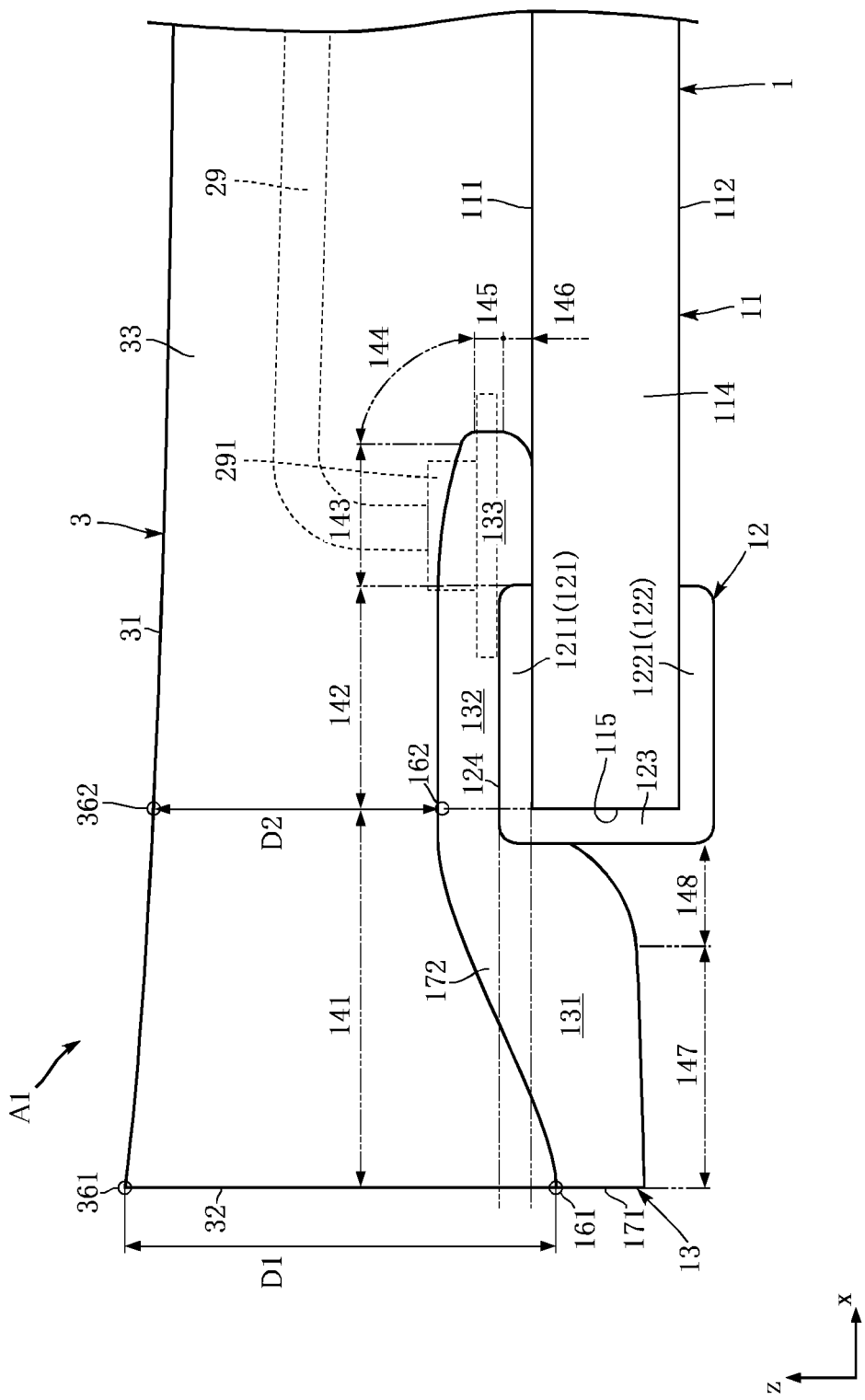
FIG. 7 is an enlarged fragmentary sectional view of the semiconductor light-emitting device according to the first embodiment of the present disclosure.
Figure 8:
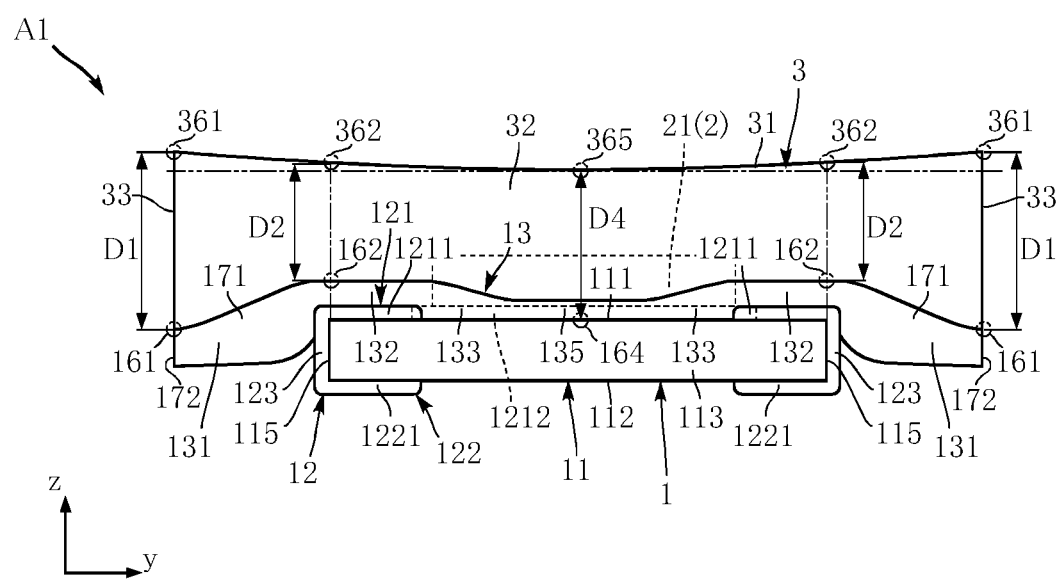
FIG. 8 is aside view of the semiconductor light-emitting device according to the first embodiment of the present disclosure.
Figure 9:
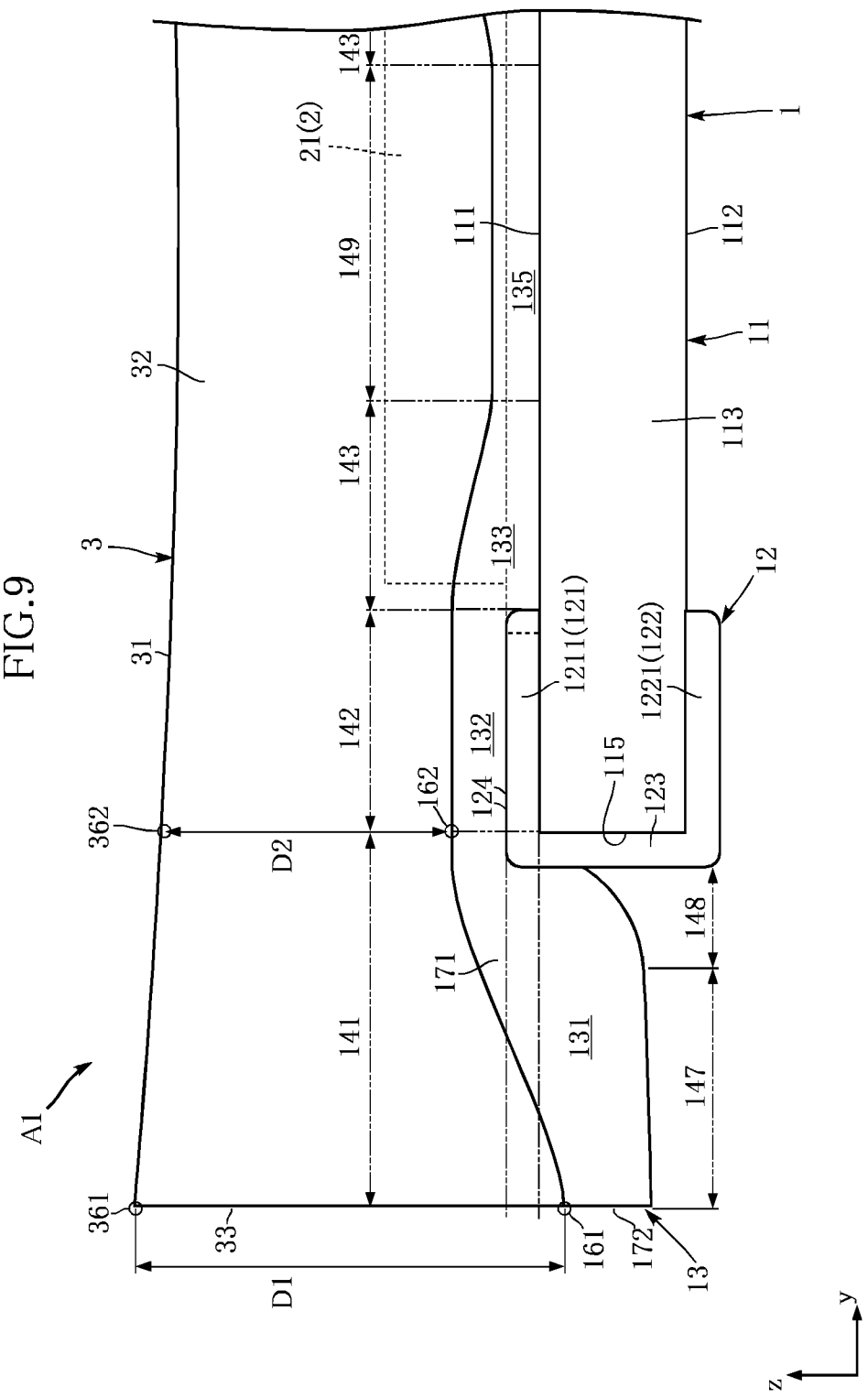
FIG. 9 is an enlarged fragmentary side view of the semiconductor light-emitting device according to the first embodiment of the present disclosure.
Figure 10:
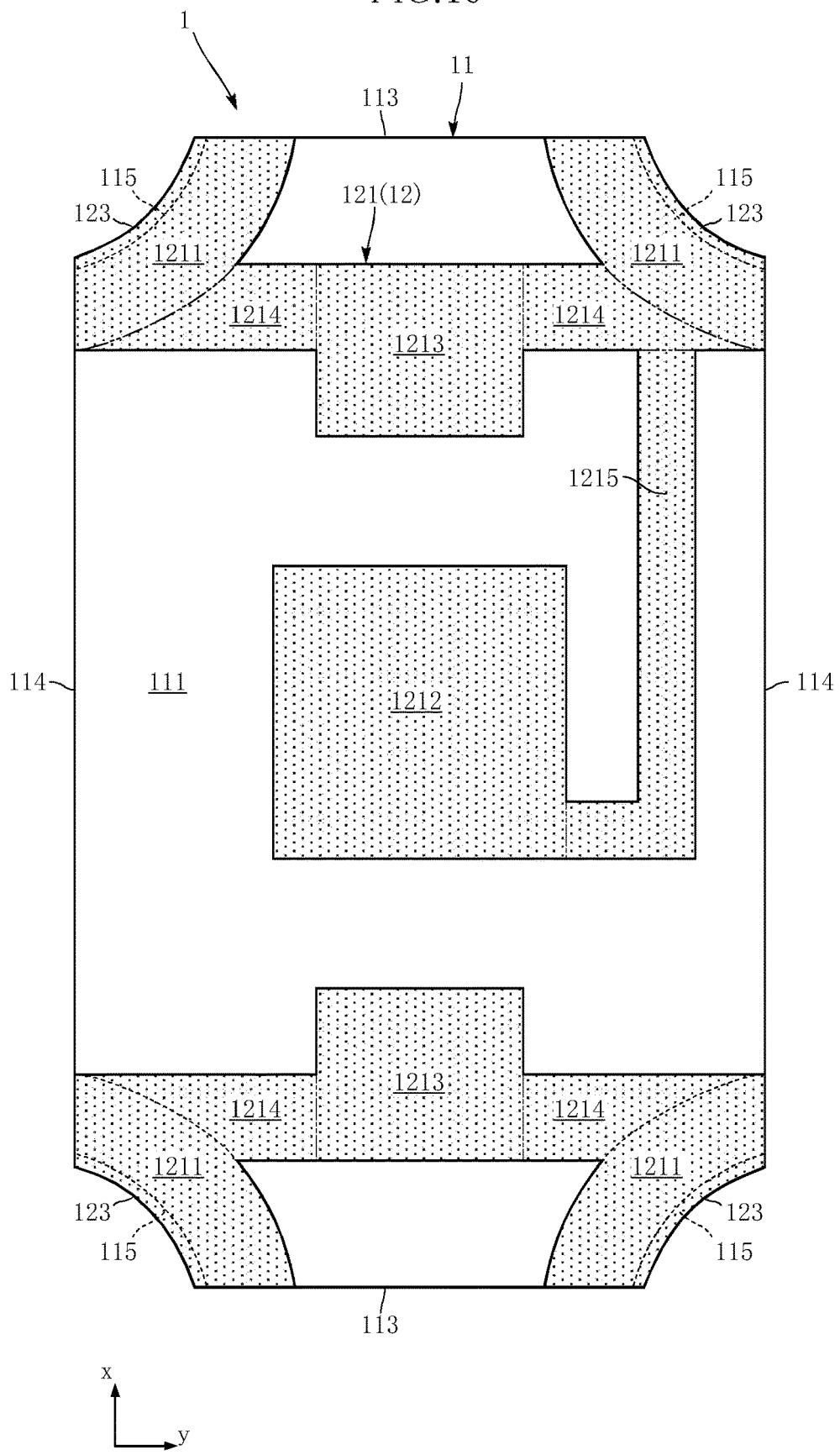
FIG. 10 is an enlarged fragmentary plan view of the semiconductor light-emitting device according to the first embodiment of the present disclosure.

FIG. 1 is a plan view of the semiconductor light-emitting device A1. FIG. 2 is a fragmentary plan view of the semiconductor light-emitting device A1. FIG. 3 is a bottom view of the semiconductor light-emitting device A1. FIG. 4 is a sectional view taken along line IV-IV of FIG. 1. FIG. 5 is an enlarged fragmentary sectional view of the semiconductor light-emitting device A1. FIG. 6 is a front view of the semiconductor light-emitting device A1. FIG. 7 is an enlarged fragmentary front view of the semiconductor light-emitting device A1. FIG. 8 is a side view of the semiconductor light-emitting device A1. FIG. 9 is an enlarged fragmentary side view of the semiconductor light-emitting device A1. FIG. 10 is a fragmentary plan view of the substrate 1 of the semiconductor light-emitting device A1. As will be understood from the line IV-IV of FIG. 1, the lateral direction of FIG. 4 generally corresponds to the x direction, although some parts are not precisely taken in the x direction. The same applies to FIG. 5.

The substrate 1 supports the semiconductor light-emitting element 2 and provides a conduction path to the semiconductor light-emitting element 2. The substrate 1 includes a base 11, a conductive layer 12 and an insulating layer 13.

The base 11 is made of an electrically insulating material, such as a glass epoxy resin, and comprises the body of the substrate 1. The base 11 has a base front surface 111, a base back surface 112, a pair of base first side surfaces 113, a pair of a base second side surfaces 114 and a plurality of base third side surfaces 115.

The base front surface 111 faces in one direction along the z direction, and the base back surface 112 faces opposite, in the other direction along the along the z direction. In the example shown in the figures, the base front surface 111 comprises a flat surface.

The base first side surfaces 113 are spaced apart from each other in the x direction and perpendicular to the x direction. The base first side surfaces 113 connect the base front surface 111 and the base back surface 112. In the example shown in the figures, the base back surface 112 comprises a flat surface.

The base second side surfaces 114 are spaced apart from each other in the y direction and perpendicular to the y direction. The base second side surfaces 114 connect the base front surface 111 and the base back surface 112.

The base third side surfaces 115 connect the base front surface 111 and the base back surface 112. As viewed in the z direction, each base third side surface 115 is recessed from the base first side surface 113. In the present embodiment, the base third side surface 115 is recessed inward in the x direction from the base first side surface 113. In the present embodiment, in addition, the base third side surface 115 is present between the base first side surface 113 and the base second side surface 114 that is adjacent thereto. The base third side surface 115 is also recessed from the base second side surface 114 as viewed in the z direction. In the present embodiment, the base third side surface is recessed inward in the y direction from the base second side surface 114. The present embodiment includes four base third side surfaces 115. The four base third side surfaces 115 include a pair of base third side surfaces 115. As viewed in the z direction, each base third side surface 115 is generally in a quarter-circular shape.

The conductive layer 12 is disposed on the base 11 to provide conduction paths to the semiconductor light-emitting element 2. The conductive layer 12 may be coated with, for example, a Cu layer. In addition, parts of the conductive layer 12 exposed from the insulating layer 13 may be coated with, for example, a Au layer. The conductive layer 12 includes a front-surface segment 121, a back-surface segment 122 and four side-surface segments 123.

The front-surface segment 121 comprises parts formed on the base front surface 111 of the base 11. In the present embodiment, the front-surface segment 121 includes four front-surface first parts 1211, a front-surface second part 1212, a pair of front-surface third parts 1213, a plurality of connection parts 1214 and a connection part 1215. For convenience, FIG. 10 shows in chain double-dashed lines (phantom lines) the boundaries of the four front-surface first parts 1211, the front-surface second part 1212, the pair of front-surface third parts 1213 and the plurality of connection parts 1214 and the connection part 1215.

Each front-surface first part 1211 is contiguous with a base third side surface 115 of the base 11. In the present embodiment, the front-surface first part 1211 is generally in a quarter-annular shape as viewed in the z direction. The front-surface first part 1211 is also contiguous with both a base first side surface 113 and a base second side surface 114.

In the present embodiment, the four front-surface first parts 1211 are provided for the four base third side surfaces 115.

The front-surface second part 1212, on which the semiconductor light-emitting element 2 will be mounted, is located generally centrally of the base front surface 111. The front-surface second part 1212 of the front-surface segment 121 may be omitted for mounting the semiconductor light-emitting element 2 directly on the base 11. In the example shown in the figures, the front-surface second part 1212 is generally rectangular as viewed in the z direction.

The pair of front-surface third parts 1213 are spaced apart from each other in the x direction, with the front-surface second part 1212 located between them. The front-surface third parts 1213 are used to provide electrical communication between the front-surface segment 121 and the semiconductor light-emitting element 2. In the example shown in the figures, each front-surface third part 1213 is generally rectangular and located apart from the base first side surfaces 113 of the base 11.

Each connection part 1214 connects a front-surface first part 1211 and a front-surface third part 1213 adjacent thereto. The example shown in the figures includes four connection parts 1214 each having a strip shape elongated in the y direction. In addition, the connection parts 1214 of the example shown in the figures are located apart from the base first side surfaces 113 of the base 11.

The connection part 1215 connects the front-surface second part 1212 to a connection part 1214. In the example shown in the figures, the connection part 1215 is elongated in the x direction and located apart from the base second side surfaces 114 of the base 11.

The back-surface segment 122 comprises parts formed on the base back surface 112 of the base 11. In the present embodiment, the back-surface segment 122 includes four back-surface first parts 1221 and a pair of back-surface second parts 1222. For convenience, FIG. 3 shows the chain double-dashed lines (phantom lines) representing the boundaries of the four back-surface first parts 1221 and the pair of back-surface second parts 1222.

Each back-surface first part 1221 is contiguous with a base third side surface 115 of the base 11. In the present embodiment, the back-surface first part 1221 is generally in a quarter-annular shape as viewed in the z direction. The back-surface first part 1221 is also contiguous with both a base first side surface 113 and a base second side surface 114. In the present embodiment, the four back-surface first parts 1221 are provided for the four base third side surfaces 115.

The pair of back-surface second parts 1222 are spaced apart from each other in the x direction. Each back-surface second part 1222 is connected to a pair of back-surface first parts 1221 that are adjacent to each other in the y direction. The pair of back-surface second parts 1222 will be used as electrodes when the semiconductor light-emitting device A1 is mounted on a circuit board (not shown).

The four side-surface segments 123 are formed on the four base third side surfaces 115, covering the respective base third side surfaces 115. In the present embodiment, each side-surface segment 123 substantially covers the entirety of the base third side surface 115. The side-surface segment 123 is contiguous with a front-surface first part 1211 of the front-surface segment 121 and a back-surface first part 1221 of the back-surface segment 122.

The insulating layer 13 is made of an electrically insulating material and covers parts of the conductive layer 12, leaving the other parts exposed. The material of the insulating layer 13 is not specifically limited. In this embodiment, solder resist is used as an example. In the example shown in the figures, the insulating layer 13 is formed by applying a sheet (film) of solder resist by compression bonding. The insulating layer 13 includes four insulating-layer first parts 131, four insulating-layer second parts 132, a plurality of insulating-layer third parts 133 and a pair of connection parts 135. For convenience, FIGS. 2, 5, 7 show in chain double-dashed lines (phantom lines) the boundaries of the four insulating-layer first parts 131, the four insulating-layer second parts 132, the plurality of insulating-layer third parts 133 and the pair of connection parts 135.

In the present embodiment, a back-surface insulating layer 137 is provided on the base back surface 112 of the base 11. The back-surface insulating layer 137 is located between the pair of back-surface second parts 1222 for, for example, visually indicating the polarities of the semiconductor light-emitting device A1. The back-surface insulating layer 137 may be formed by using the same or different method as that used for the insulating layer 13.

The four insulating-layer first parts 131 are provided for the four base third side surfaces 115. As viewed in the z direction, each insulating-layer first part 131 is located outside, beyond the base third side surface 115. In the example shown in the figures, the insulating-layer first part 131 is generally in a quarter-circular shape as viewed in the z direction.

The four insulating-layer second parts 132 are provided for the four base third side surfaces 115. The insulating-layer second parts 132 are formed on the front-surface segment 121 of the conductive layer 12 such that each insulating-layer second part overlaps and thus covers a front-surface first part 1211 as viewed in the z direction. In the example shown in the figures, the insulating-layer second part 132 is generally in a quarter-annular shape as viewed in the z direction. The insulating-layer second part 132 in the example shown in the figures has a smaller thickness than the insulating-layer first part 131. In addition, the insulating-layer second part 132 has a greater thickness than the front-surface first part 1211 of the conductive layer 12.

Each insulating-layer third part 133 is adjacent to an insulating-layer second part 132 and in contact with the base front surface 111. In other words, no conductive layer 12 is present between the insulating-layer third part 133 and the base front surface 111 of the base 11.

Each connection part 135 connects a pair of insulating-layer third parts 133 that are adjacent to each other in the y direction. In the example shown in the figures, the connection part 135 has a strip shape elongated in the y direction. In addition, the connection part 135 of the example shown in the figures is contiguous with a base first side surface 113 of the base 11.

The insulating layer 13 has a pair of insulating-layer first side surfaces 171 and two pairs of insulating-layer second side surfaces 172. The insulating-layer first side surfaces 171 are spaced apart from each other in the x direction and perpendicular to the x direction. Each insulating-layer first side surfaces 171 is flush with a base first side surface 113 of the base 11. The insulating-layer second side surfaces 172 in each pair are spaced apart from each other in the y direction and perpendicular to the y direction. Each insulating-layer second side surface 172 is flush with a base second side surface 114 of the base 11.

As shown in FIGS. 5, 7 and 9, the insulating layer 13 has an insulating-layer first surface 141, an insulating-layer second surface 142, an insulating-layer third surface 143, an insulating-layer fourth surface 144, an insulating-layer fifth surface 145, an insulating-layer sixth surface 146, an insulating-layer seventh surface 147, an insulating-layer eighth surface 148 and an insulating-layer ninth surface 149.

The insulating-layer first surface 141 refers to a surface region of each insulating-layer first part 131 and located on the side in the one direction along the z direction (the upper side in the figures). In the example shown in the figures, the insulating-layer first surface 141 is recessed in a curve toward the side in the other direction along the z direction as it is farther away from the base third side surface 115 as viewed in the z direction. The insulating-layer second surface 142 refers to a surface region of each insulating-layer second part 132 and located on the side in the one direction along the z direction (the upper side in the figures). In the example shown in the figures, the insulating-layer second surface 142 defines a substantially flat surface along the xy plane.

The insulating-layer third surface 143 refers to a surface region of each insulating-layer third part 133 and located on the side in the one direction along the z direction. In the example shown in the figures, the insulating-layer third surface 143 is gently curved toward the side in the other direction along the z direction as it is farther away from the insulating-layer second surface 142 as viewed in the z direction. The insulating-layer fifth surface 145 refers to a surface region of each insulating-layer third part 133, extending in the z direction and facing away from the insulating-layer second part 132 in the direction perpendicular to the z direction. The insulating-layer fourth surface 144 defines an outward curve between the insulating-layer third surface 143 and the insulating-layer fifth surface 145. The insulating-layer sixth surface 146 extends from the insulating-layer fifth surface 145 to the base front surface 111 and thus in contact with the base front surface 111. The insulating-layer fifth surface 145 defines an outward curve bulging obliquely downward.

As viewed in the z direction, the boundary between the insulating-layer fifth surface 145 and the base front surface 111 is closer to the base third side surface 115 than the insulating-layer fifth surface 145 is.

The insulating-layer seventh surface 147 and the insulating-layer eighth surface 148 refer to surface regions of each insulating-layer first part 131 and located on the side in the other direction along the z direction (the lower side in the figures). The insulating-layer seventh surface 147 is spaced apart from the base third side surface 115 as viewed in the z direction and extends to the boundary between an insulating-layer first side surface 171 and an insulating-layer second side surface 172. In the example shown in the figures, the insulating-layer first side surface 171 is shifted in position from the base back surface 112 in the one direction along the z direction. The insulating-layer eighth surface 148 extends from the insulating-layer seventh surface 147 to the base third side surface 115. In the example shown in the figures, the insulating-layer seventh surface 147 is shifted in position from the insulating-layer eighth surface 148 in the other direction along the z direction. The insulating-layer eighth surface 148 defines an outward curve having a smaller curvature radius than that defined by the insulating-layer seventh surface 147. The boundary between the insulating-layer eighth surface 148 and the base third side surface 115 is shifted in position in the one direction along the z direction, from the boundary between the insulating-layer seventh surface 147 and the insulating-layer eighth surface 148.

As shown in FIG. 9, the insulating-layer ninth surface 149 refers to a surface region of each connection part 135 and located on the side in the one direction along the z direction (the upper side in the figure). The insulating-layer ninth surface 149 is connected to the insulating-layer third surfaces 143. The insulating-layer ninth surface 149 defines a relatively flat surface along the xy plane, as compared with the insulating-layer third surface 143.

As shown in FIGS. 2 and 4 to 9, the substrate 1 has four insulating-layer first regions 161, four insulating-layer second regions 162, a pair of insulating-layer third regions 163 and a pair of insulating-layer fourth regions 164.

Each insulating-layer first region 161 refers to a region on an insulating-layer first surface 141 of the insulating layer 13. In the present embodiment, the insulating-layer first region is a point where an insulating-layer first side surface 171 and an insulating-layer second side surface 172 meet on the insulating-layer first surface 141. In the example shown in the figures, the insulating-layer first region 161 is located at the radial center of the quarter-circular shape of the insulating-layer first part 131 (the insulating-layer first surface 141) as viewed in the z direction.

Each insulating-layer second region 162 refers to a region on an insulating-layer second surface 142. In the example shown in the figures, the insulating-layer second region 162 is a quarter-circular region overlapping the base third side surface 115 as viewed in the z direction.

Each insulating-layer third region 163 refers to a region on the boundary edge between the base front surface 111 and a base second side surface 114, the region overlapping the semiconductor light-emitting element 2 as viewed in the y direction. In the example shown in the figures, the insulating-layer third region 163 corresponds to the midpoint in the x direction of the boundary edge between the base front surface 111 and the base second side surface 114.

Each insulating-layer fourth region 164 refers to a region on an insulating-layer first side surface 171 along its edge on the side in the one direction along the z direction, the region overlapping the semiconductor light-emitting element 2 as viewed in the x direction. In the example shown in the figures, the insulating-layer fourth region 164 corresponds to the midpoint in the y direction of the edge of the insulating-layer first side surface 171 on the side in the one direction along the z direction.

As shown in FIGS. 5, 7 and 9, the insulating-layer first region 161 is shifted in position from the insulating-layer second region 162 in the other direction along the z direction. In the example shown in the figures, the insulating-layer first region 161 is shifted in position in the other direction along the z direction, from a conductive-layer first surface 124 of the front-surface first part 1211 of the conductive layer 12. In the example shown in the figures, in addition, the insulating-layer first region 161 is shifted in position from the base front surface 111 of the base 11 in the other direction along the z direction.

The semiconductor light-emitting element 2 comprises a light source of the semiconductor light-emitting device A1. In the present embodiment, the semiconductor light-emitting element includes an element body 21, a first electrode 22 and a second electrode 23. The element body 21 includes a semiconductor layer, such as a layer of an InGaN-based semiconductor. The first electrode 22 may comprise a cathode, whereas the second electrode 23 may comprise an anode.

In the present embodiment, the semiconductor light-emitting element 2 is bonded to the front-surface second part 1212 of the front-surface segment 121 of the conductive layer 12 by using a bonding material 25. The bonding material 25 may be Ag paste or solder.

The first electrode 22 is connected to one of the front-surface third parts 1213 by a wire 28. The wire 28 is made of, for example, Au and includes a first bonding part 281 and a second bonding part 282. The first bonding part 281 is the part of the wire 28 bonded to the front-surface third part 1213. The second bonding part 282 is the part of the wire 28 bonded to the first electrode 22.

The second electrode 23 is connected to the other one of the front-surface third parts 1213 by a wire 29. The wire 29 is made of, for example, Au and includes a first bonding part 291 and a second bonding part 292. The first bonding part 291 is the part of the wire 29 bonded to the front-surface third part 1213. The second bonding part 292 is the part of the wire 29 bonded to the second electrode 23.

The resin member 3 covering the semiconductor light-emitting element 2 is made of a material that transmits light emitted from the semiconductor light-emitting element 2. In the present embodiment, the resin member 3 is formed on the base front surface 111 of the substrate 1 (on the side located in the one direction along the z direction), covering the base front surface 111, the front-surface segment 121 of the conductive layer 12, and the insulating layer 13.

The material of the resin member 3 is not specifically limited as long as it transmits light from the semiconductor light-emitting element 2. For example, resins such as a transparent epoxy resin and a silicone resin may be selectable. In the present embodiment, the resin member 3 contains a fluorescent material. When excited by the light emitted from the semiconductor light-emitting element 2, the fluorescent material emits light of different wavelengths. For example, the fluorescent material emits yellow light in response to blue light emitted by the semiconductor light-emitting element 2. This enables the semiconductor light-emitting device A1 to produce white light, for example.

As shown in FIGS. 1 and 4 to 9, the resin member 3 of the present embodiment has a resin front surface 31, a pair of resin first side surfaces 32 and a pair of resin second side surfaces 33.

The resin front surface 31 faces in the one direction along the z direction. The resin first side surfaces 32 are spaced apart from each other in the x direction and, in the present embodiment, perpendicular to the x direction. In the example shown in the figures, each resin first side surface 32 is flush with a base first side surface 113 of the base 11 and also with an insulating-layer first side surface 171 of the insulating layer 13. The resin second side surfaces 33 are spaced apart from each other in they direction and, in the present embodiment, perpendicular to the y direction. In the example shown in the figures, each resin second side surface 33 is flush with a base second side surface 114 of the base 11 and also with an insulating-layer second side surface 172 of the insulating layer 13.

The resin member 3 has four resin first regions 361, four resin second regions 362, a resin third region 363, a pair of resin fourth regions 364 and a pair of resin fifth regions 365.

Each resin first region 361 refers to a region on the resin front surface 31 overlapping the insulating-layer first region 161 as viewed in the z direction. Each resin first region 362 refers to a region on the resin front surface 31 and overlapping the insulating-layer second region 162 as viewed in the z direction. The four resin first regions 361 are provided for the four insulating-layer first regions 161. Similarly, the four resin second regions 362 are provided for the four insulating-layer second regions 162.

The resin third region 363 refers to a region on the resin front surface 31 overlapping the semiconductor light-emitting element 2 as viewed in the z direction. In the example shown in the figures, the resin third region 363 corresponds to a point at the center of the resin front surface 31.

Each resin fourth region 364 refers to a region on the resin front surface 31 overlapping an insulating-layer third region 163 as viewed in the z direction. In the example shown in the figures, the resin fourth region 364 is located on the boundary edge between the resin front surface 31 and a resin second side surface 33 and corresponds to the approximate midpoint in the x direction. Each resin fourth region 365 refers to a region on the resin front surface 31 and overlapping an insulating-layer fourth region 164 as viewed in the z direction. In the example shown in the figures, the resin fifth region 365 is located on the boundary edge between the resin front surface 31 and a resin first side surface 32 and corresponds to the approximate midpoint in the y direction.

As shown in FIGS. 4 to 9, the first distance D1 from an insulating-layer first region 161 to a corresponding resin first region 361 in the z direction is longer than the second distance D2 from an insulating-layer second region 162 to a corresponding resin second region 362 in the z direction. The third distance D3 from an insulating-layer third region 163 to a corresponding resin fourth region 364 is shorter than the first distance D1 and longer than the second distance D2. The fourth distance D4 from an insulating-layer fourth region 164 to a corresponding resin fifth region 365 is shorter than the first distance D1 and longer than the second distance D2.

As shown in FIGS. 4 to 9, in the present embodiment, the resin first regions 361 are shifted in position from the resin second regions 362 in the one direction along the z direction (upward in the z direction). In addition, the resin first regions 361 and the resin second regions 362 are shifted in position from the resin third region 363 in the one direction along the z direction (upward in the z direction). This means that the resin front surface 31 has a profile (outline) defining a concave that is gently curved in the other direction along the z direction (downward in the z direction) as shown in FIG. 4.

In addition, the resin first regions 361 and the resin second regions 362 are shifted in position from the resin fourth regions 364 in the one direction along the z direction (the upper side in the z direction). This means that each resin second side surface 33 has an upper edge defining a concave that is gently curved in the other direction along the z direction (downward in the z direction) as shown in FIG. 6.

In addition, the resin first regions 361 and the resin second regions 362 are shifted in position from the resin fifth regions 365 in the one direction along the z direction (upward in the z direction). This means that each resin first side surface 32 has an upper edge defining a concave that is gently curved in the other direction along the z direction (downward in the z direction) as shown in Fig. in FIG. 8.

As described above, the resin front surface 31 in the present embodiment is a curved surface, such that the four resin first regions 361 are located farthest in the one direction along the z direction, and the resin third region 363, the pair of resin fourth regions 364 and the pair of resin fifth regions 365 are shifted in position from the four resin first regions 361 in the other direction along the z direction. In addition, the four resin second regions 362 are located in the z direction between any of the four resin first regions 361 and any of the resin third region 363, the pair of resin fourth regions 364 and the pair of the resin fifth regions 365.

The following now describes an example of a method of manufacturing a semiconductor light-emitting device A1 with reference to FIGS. 11 to 19.

Figure 11:
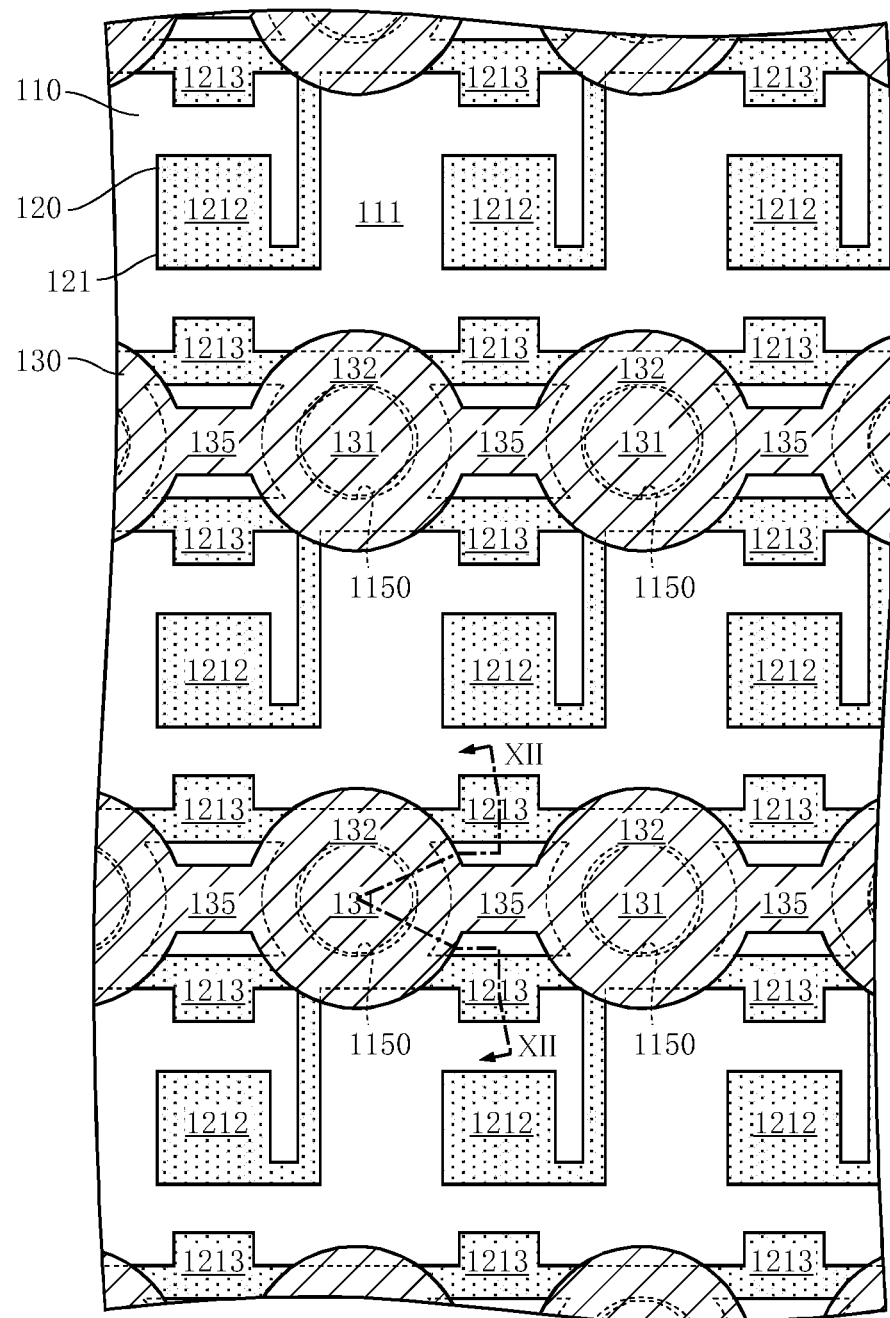
FIG. 11 is a fragmentary plan view illustrating a method of manufacturing a semiconductor light-emitting device according to the first embodiment of the present disclosure.
Figure 12:
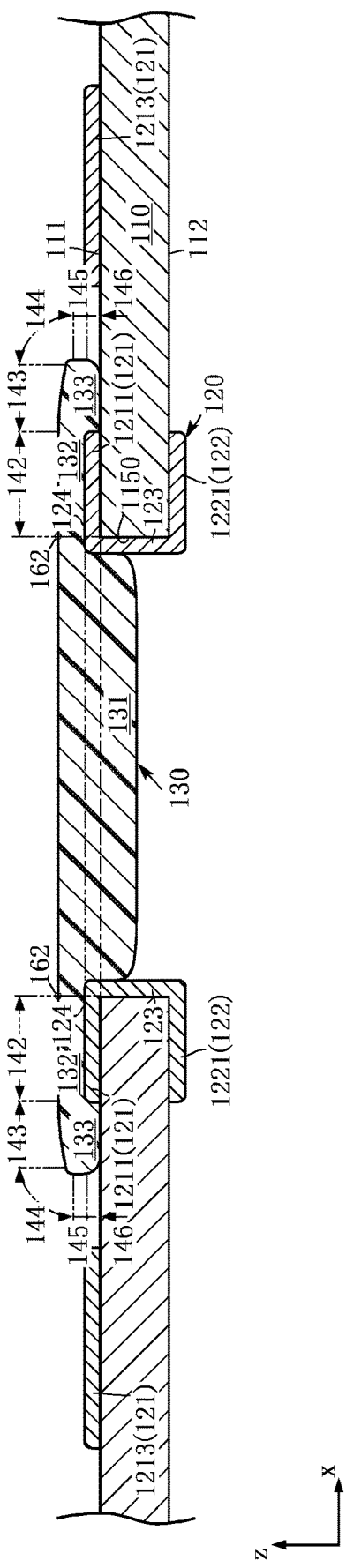
FIG. 12 is a fragmentary sectional view taken along line XII-XII of FIG. 11.

First, a substrate member 110 as shown in FIGS. 11 and 12 is prepared. Roughly speaking, the substrate member 110 is a component from which a plurality of bases 11 will be obtained and has a plurality of bases 11 arranged in an x-y matrix. The substrate member 110 has a plurality of through holes 1150. The through holes 1150 will form the base third side surfaces 115 once the substrate member 110 is cut.

The substrate member 110 has a conductive layer 120 and an insulating layer 130. The conductive layer 120 has parts to be formed into the above-described parts of the conductive layer 12. The insulating layer 130 has parts to be formed into the above-described parts of the insulating layer 13. The conductive layer 120 may be formed by plating, for example. The insulating layer 130 may be formed by compression bonding of a solder resist sheet (or film) to the substrate member 110.

As shown in FIG. 12, the insulating layer 130 has insulating-layer first parts 131 closing the through holes 1150. As a result of the compression bonding mentioned above, the insulating-layer second parts 132 are thinner than the insulating-layer first parts 131. Each insulating-layer first part 131 is substantially flat along the xy plane and has a substantially uniform thickness.

Figure 13:
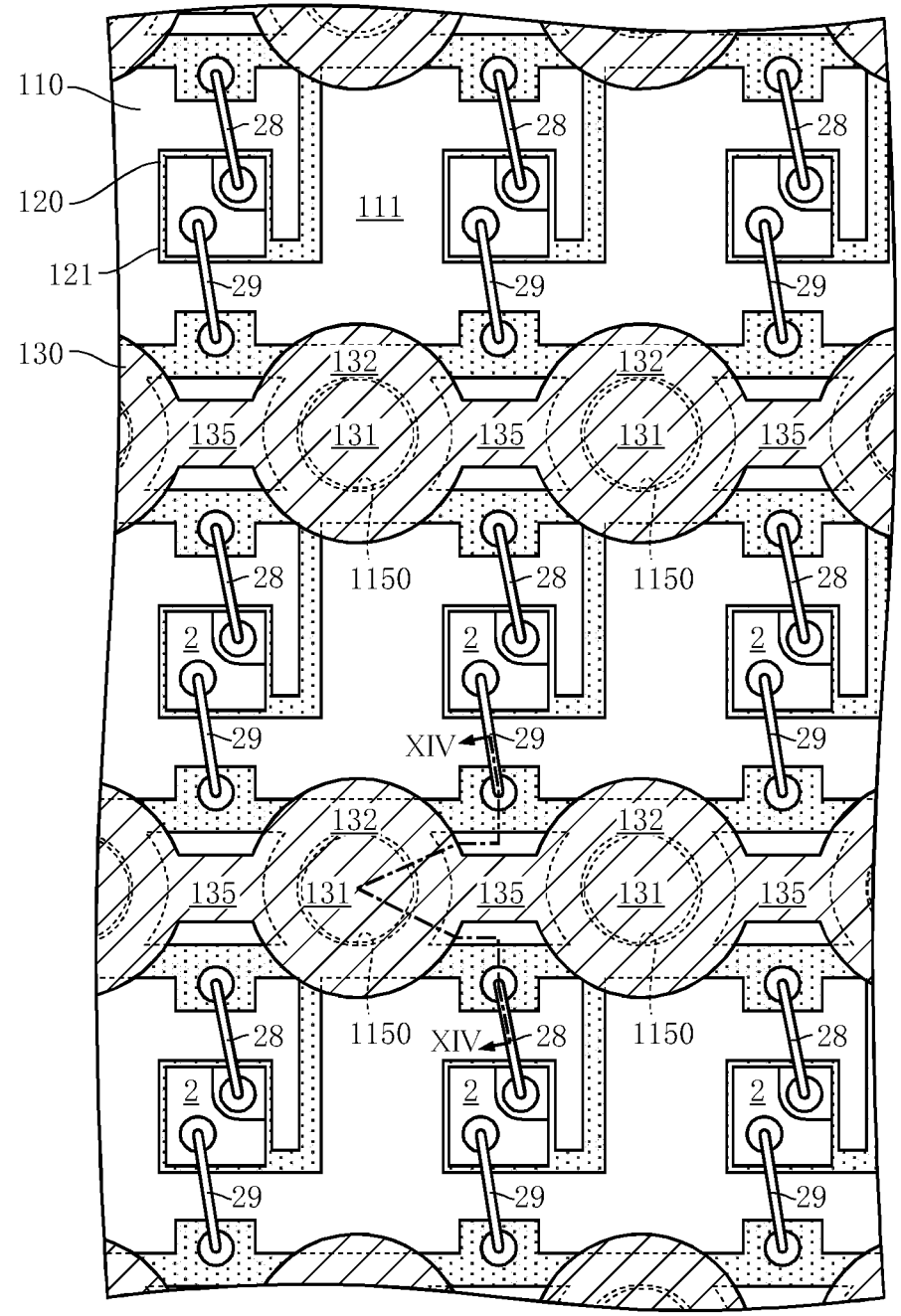
FIG. 13 is a fragmentary plan view illustrating the method of manufacturing a semiconductor light-emitting device according to the first embodiment of the present disclosure.
Figure 14:
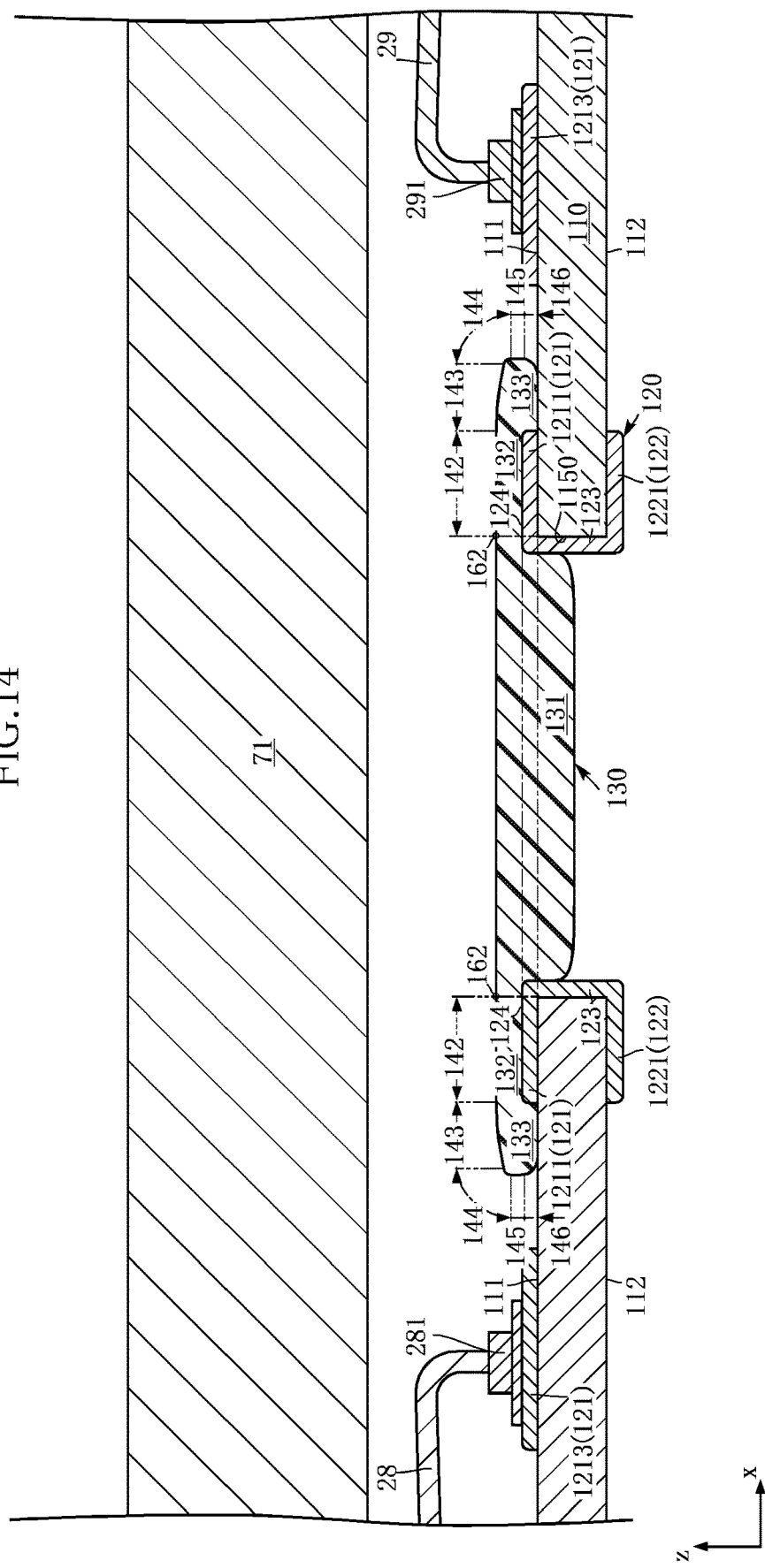
FIG. 14 is a fragmentary sectional view taken along line XIV-XIV of FIG. 13.

Next, as shown in FIGS. 13 and 14, a plurality of semiconductor light-emitting elements 2 are mounted by bonding. In this bonding process, the element body 21 of each semiconductor light-emitting element 2 is bonded to a front-surface second part 1212 of the conductive layer 120 by using a bonding material 25. In addition, the first electrode 22 and the second electrode 23 of the element body 21 are connected to a pair of front-surface third parts 1213 via a wire 28 and wire 29.

Next, a mold 71 is set in position as shown in FIG. 14. Together with the base front surface 111 of the substrate member 110, the mold 71 defines a cavity for resin forming.

Figure 15:
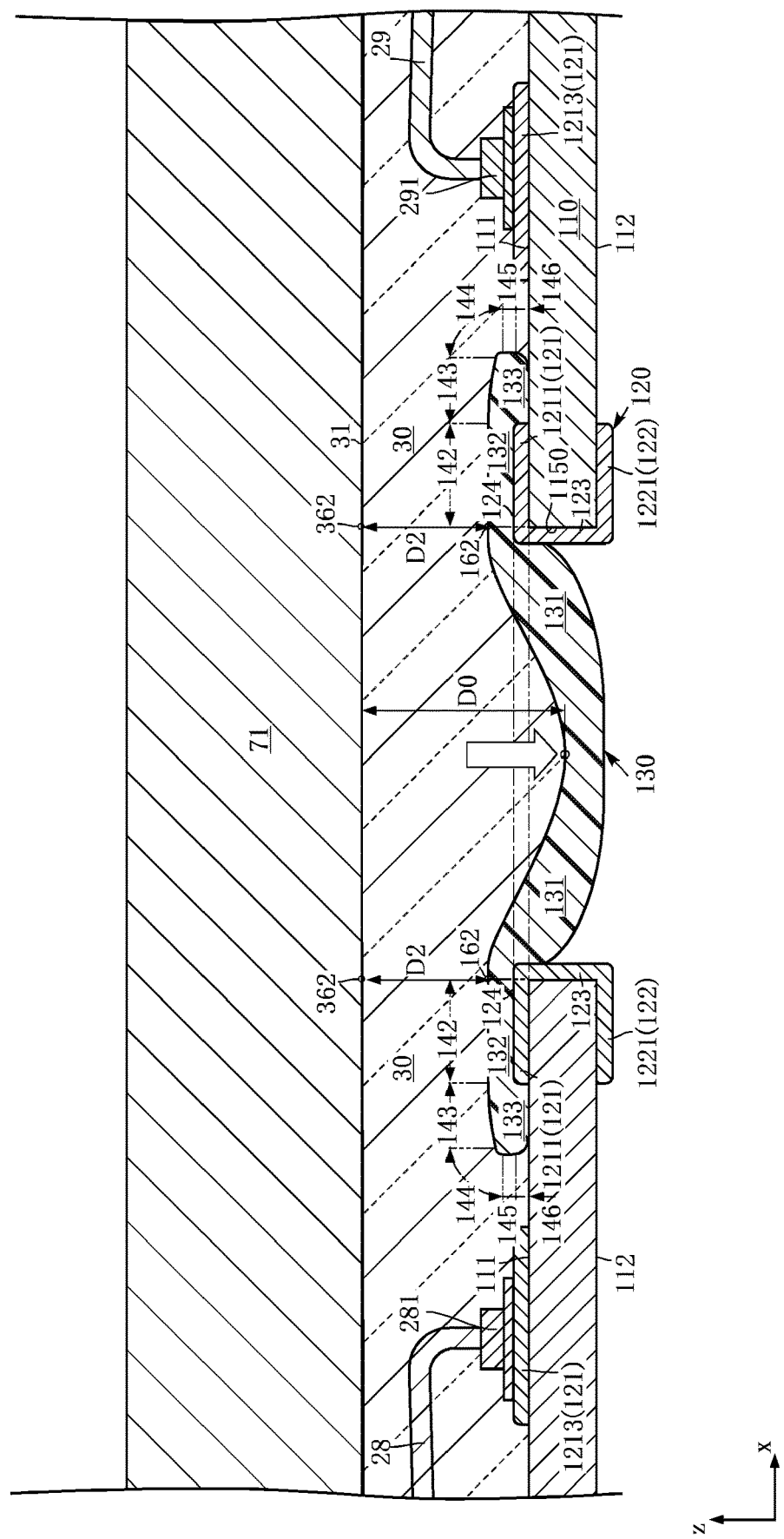
FIG. 15 is a fragmentary plan view illustrating the method of manufacturing a semiconductor light-emitting device according to the first embodiment of the present disclosure.

Next, as shown in FIG. 15, the cavity of the mold 71 is filled with a resin material. At this stage, the resin material has a relatively high temperature and thus heats and softens the insulating layer 130. The pressure of the resin material is applied to the softened insulating layer 130, thereby deforming the insulating layer 130 such that the insulating-layer first part 131 bulges in the other direction along the z direction (downward in the z direction). That is, the insulating-layer first part 131 is pushed away from the mold 71. In the figure, the distance D0 from the mold 71 to the farthest point on the insulating-layer first part 464 is longer than the second distance D2 described above. In addition, in the example shown in the figures, the insulating-layer first part 131 is deformed to an extent that apart of its upper surface is deviated beyond the base front surface 111 in the other direction along the z direction. The resin material then hardens to form a resin member 30.

Figure 16:
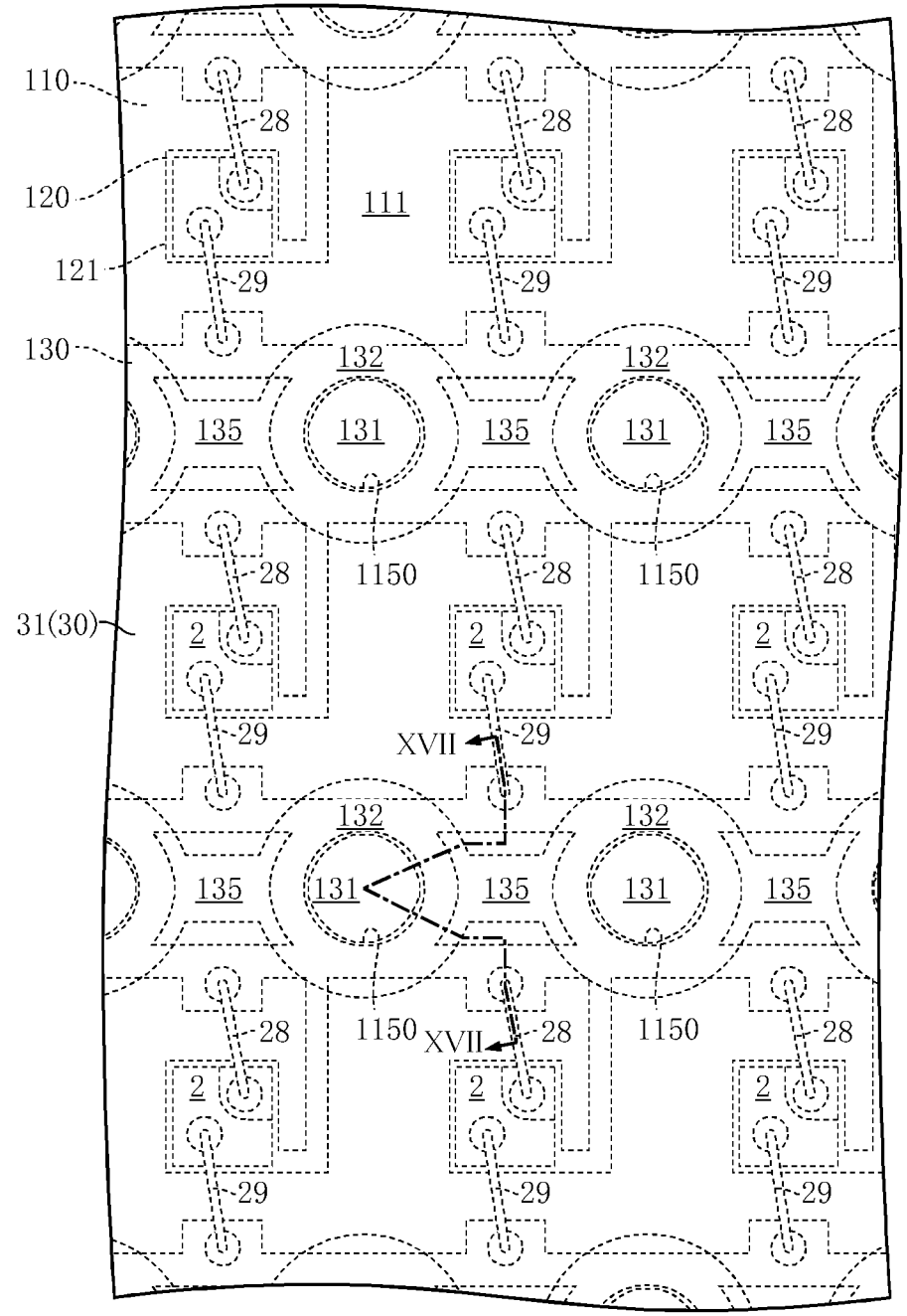
FIG. 16 is a fragmentary plan view illustrating the method of manufacturing a semiconductor light-emitting device according to the first embodiment of the present disclosure.
Figure 17:
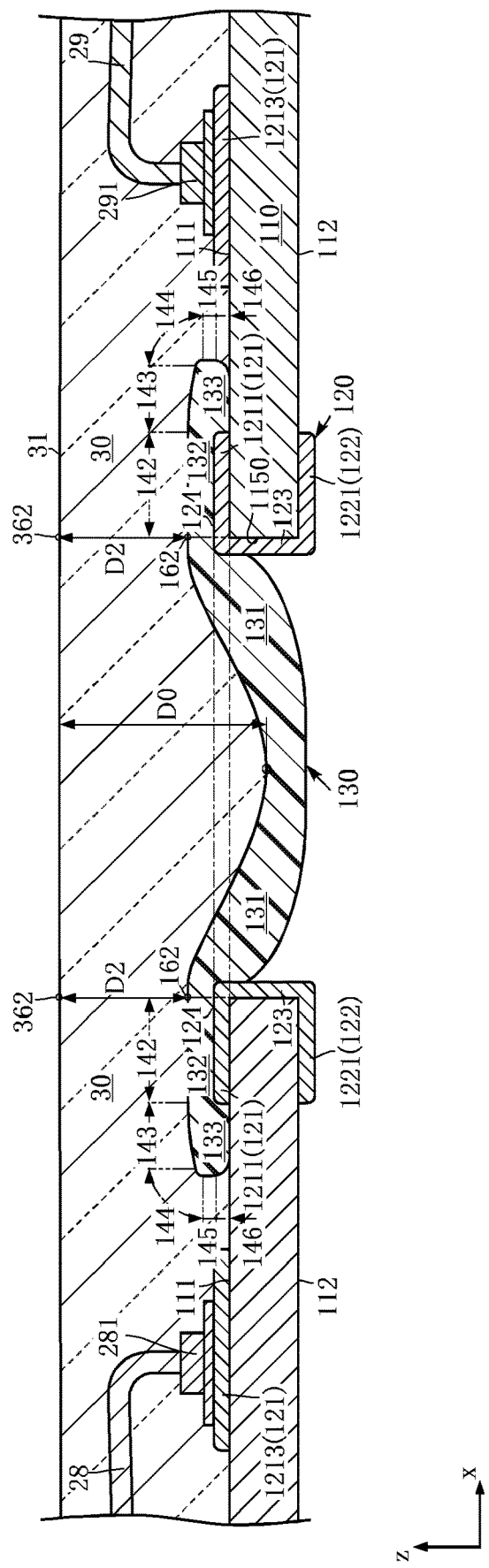
FIG. 17 is a fragmentary sectional view taken along line XVII-XVII of FIG. 16.
Figure 18:
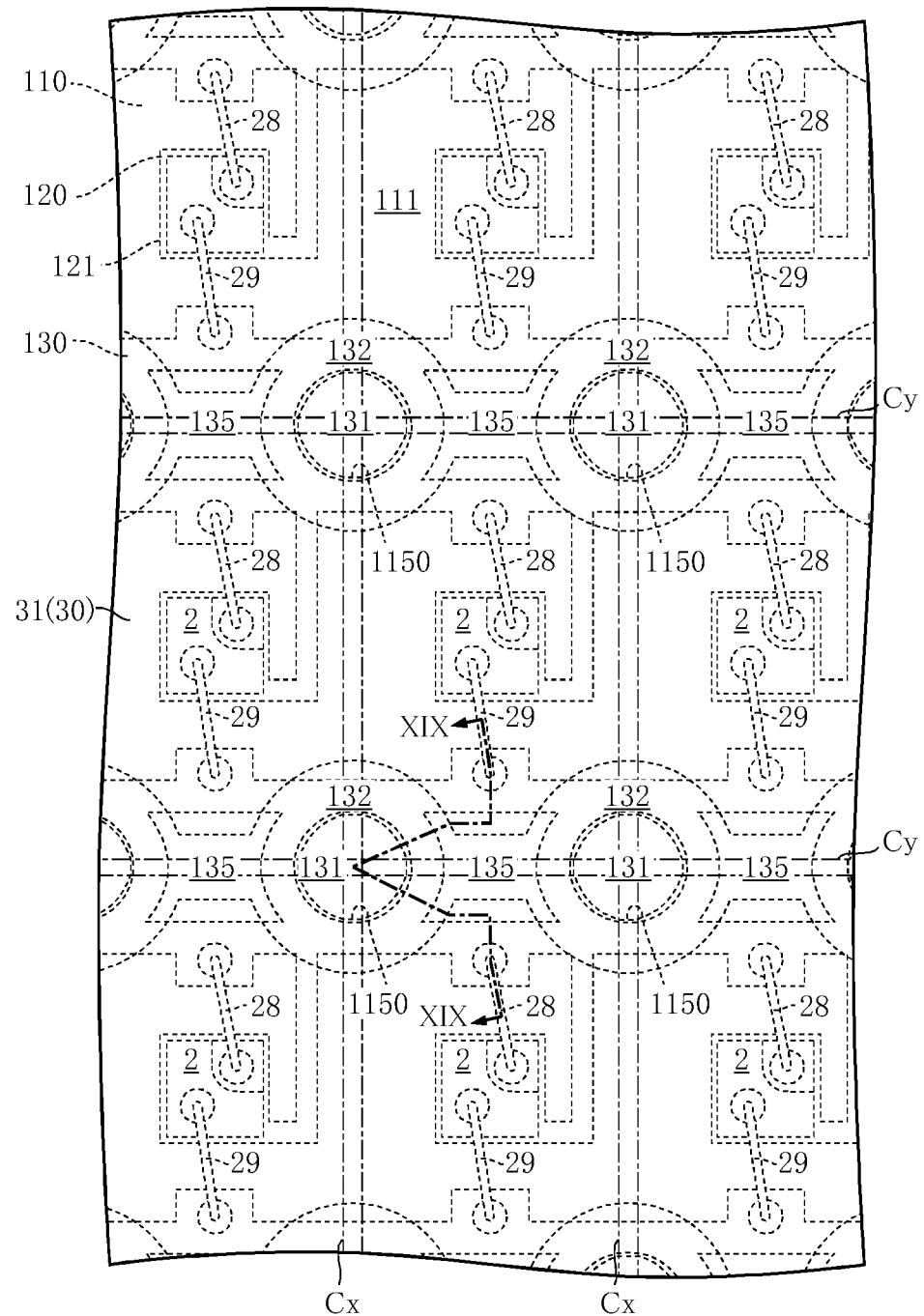
FIG. 18 is a fragmentary plan view illustrating the method of manufacturing a semiconductor light-emitting device according to the first embodiment of the present disclosure.
Figure 19:
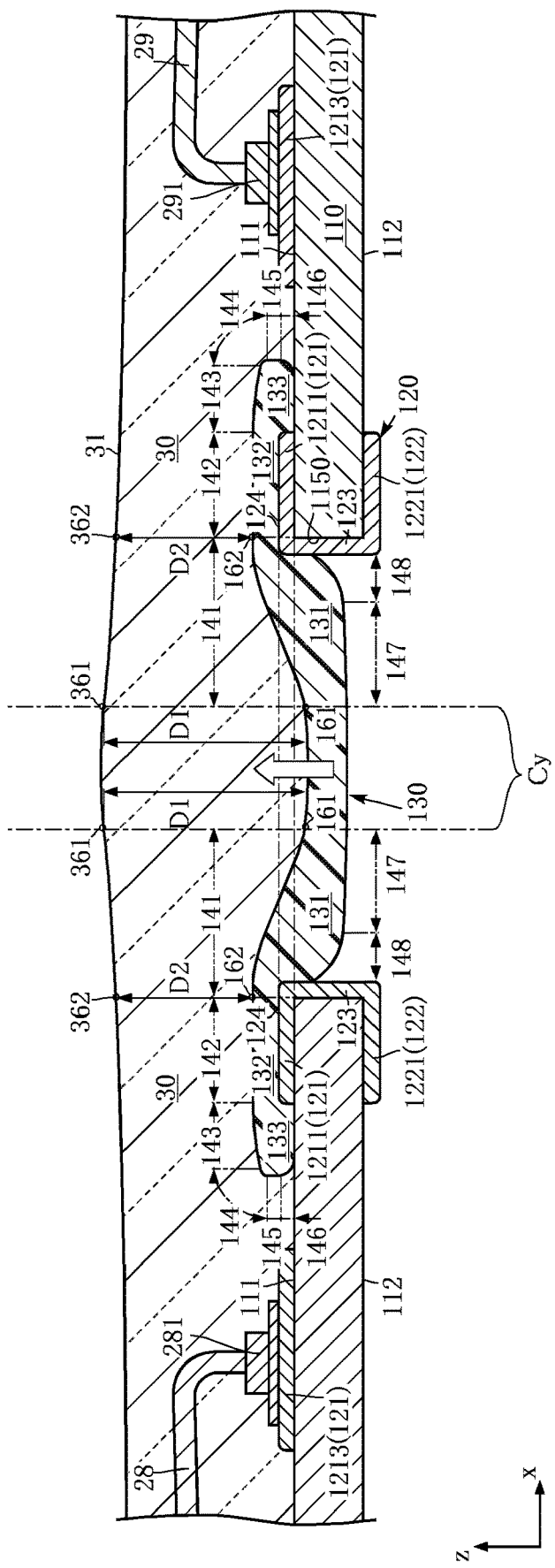
FIG. 19 is a fragmentary sectional view taken along line XIX-XIX of FIG. 18.

After filling with the resin material, the mold 71 is removed as shown in FIGS. 16 and 17. FIG. 17 shows the state immediately after the removal of the mold 71. At this stage, the temperatures of the resin member 30 and the insulating layer 130 are substantially higher than ambient temperature such as room temperature. The resin front surface 31 of the resin member 30 still remains flat along the xy plane as formed by the mold 71.

Then, the insulating layer 130 starts to harden as the resin member 30 and the insulating layer 130 are left to cool. During the hardening, the insulating-layer first part 131, which has been deformed to bulge in the other direction along the z direction, tends to restore its original flat shape along the xy plane. The insulating-layer first part 131 thus pushes the resin member 30 in the one direction along the z direction (upward), at a part of overlapping and surrounding the insulating-layer first part 131 as viewed in the z direction. As a result, the resin front surface 31 of the resin member 30 will have a curved profile that bulges in the one direction along the z direction at the part overlapping and surrounding the insulating-layer first part 131 (the base third side surfaces 1151) as viewed in the z direction.

Then, the substrate member 110, the conductive layer 120, the insulating layer 130 and the resin member 30 are cut along the lines Cx and Cy, thereby isolating a plurality of semiconductor light-emitting devices A1.

The following now describes advantages of the semiconductor light-emitting device A1.

According to the present embodiment, the first distance D1 is longer than the second distance D2 as shown in FIGS. 4 to 9. Experiments on semiconductor light-emitting devices of this type have revealed that the emission color of light L is more uniform between the peripheral and central portions as viewed in the z direction, provided that the semiconductor light-emitting device A1 has the first distance D1 located at a part farther from the semiconductor light-emitting element 2 than the part having the second distance D2. Thus, the semiconductor light-emitting device A1 can reduce color inconsistencies.

The resin member 3 contains a fluorescent material that diffuses light from the semiconductor light-emitting element 2. The resin member 3 has the first distance D1 along its edges away from the semiconductor light-emitting element 2 as viewed in the z direction. The light reaching the edges has traveled from the semiconductor light-emitting element 2 at a large angle or a nearly right angel to the z direction. The resin member 3 having the first distance D1 along the edges is expected to diffuse such light, allowing more light to exit in the one direction along the z direction. This contributes to increase the intensity of light of the semiconductor light-emitting device A1.

In the present embodiment, the resin first regions 361 are shifted in position from the resin third region 363 in the one direction along the z direction. That is, the resin front surface 31 is recessed from the parts corresponding to the base third side surfaces 115 toward the center corresponding to where the semiconductor light-emitting element 2 is mounted. As shown in FIGS. 4 and 5, this allows the resin member 3 to refract outgoing light L at the resin front surface 31, improving the directivity of light in the one direction along the z direction.

Figure 20:
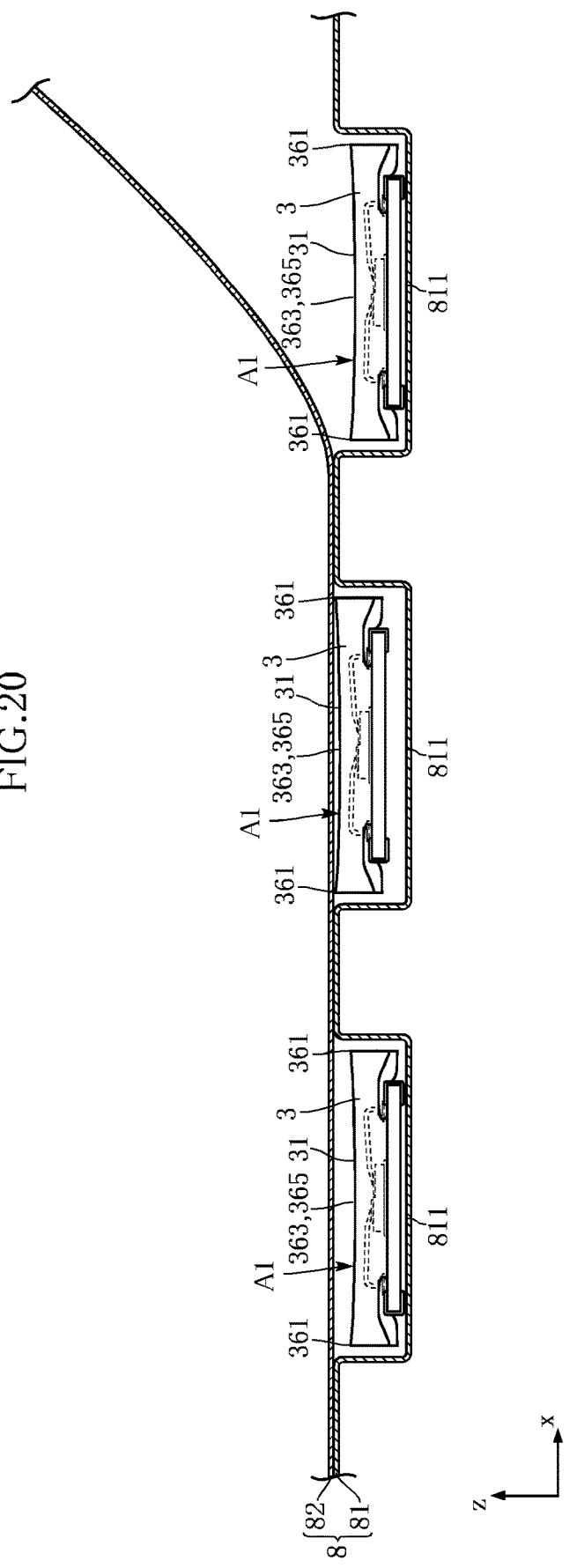
FIG. 20 is a fragmentary sectional view illustrating an example of use of semiconductor light-emitting devices according to the first embodiment of the present disclosure.

FIG. 20 shows an example use of the semiconductor light-emitting device A1. In this example, a plurality of semiconductor light-emitting devices A1 are kept in a container 8 for transportation or storage before, for example, the semiconductor light-emitting devices A1 are mounted on circuit boards. The container 8 includes a case 81 and a sheet 82. The case 81 has a plurality of recesses 811. Each recess 811 has a shape and dimensions suitable for accommodating a semiconductor light-emitting device A1. The sheet 82 is attached to the case 81 to close the recesses 811 and can be peeled away.

During the transportation or storage of the semiconductor light-emitting devices A1 kept in the container 8, the semiconductor light-emitting devices A1 may take a position in contact with the bottom of the recess 811, as shown by the left most semiconductor light-emitting device A1 in the figure, or a position closer to the sheet 82, as shown by the middle semiconductor light-emitting device A1. Suppose that a resin member 3 has a flat resin front surface 31. In this case, the resin front surface 31 may stick to the sheet 82 upon contact with the sheet 82. To pick up the semiconductor light-emitting devices A1, the sheet is removed to open the recess 811, as shown by the rightmost semiconductor light-emitting device A1 in the figure. In this process, the semiconductor light-emitting device A1 sticking to the sheet 82 makes it difficult to properly pick up the semiconductor light-emitting device A1. Especially in the automatic picking operation by for example a robot, such a semiconductor light-emitting device A1 may cause an operation error.

According to the present embodiment, the resin front surface 31 of the resin member 3 has a profile such that the resin first regions 361 are above the resin third region 363. As shown in FIGS. 6 and 8, in addition, the resin fourth and fifth regions 364 and 365 are below the resin first regions 361. This profile ensures that an air space is left between the sheet 82 and the resin third, fourth and fifth regions 364, 365 and 365. This air space is not hermetically closed and prevents the resin front surface 31 from sticking to the sheet 82. This facilitates the proper picking operation of the semiconductor light-emitting device A1.

According to the present embodiment, the base third side surfaces 115 are provided at the four corners as viewed in the z direction. The resin first regions 361 are provided at the corresponding four corners as viewed in the z direction. This configuration is preferable for reducing the color inconsistencies and facilitating the proper picking operation.

The resin member 3 has the resin first side surfaces 32 and the resin second side surfaces 33 that are respectively flush with the base first side surfaces 113 and the base second side surfaces 114 of the base 11. That is, the entire resin member 3 overlaps the base 11 and vice versa, as viewed in the z direction. This maximizes the volume of the resin member 3, allowing a larger semiconductor light-emitting element 2 to be mounted relative to the size of the base 11. According to the present embodiment, the semiconductor light-emitting element 2 is connected to the wires 28 and 29, which extend opposite in the x direction. Such wires 28 and 29 can be appropriately covered with the resin member 3, without compromising the compactness of the semiconductor light-emitting device A1.

As shown in FIG. 5, the insulating-layer first regions 161 are shifted in position from the base front surface 111 in the other direction along the z direction. This profile serves to increase the first distance D1 without significantly increasing the z-direction dimension of the semiconductor light-emitting device A1.

The insulating-layer first parts 131 are not supported by the base 11. The thickness of the insulating-layer first parts 131 is greater than the thickness of the insulating-layer second parts 132. Hence, although not supported by the base 11, the insulating-layer first parts 131 are not easily breakable during the manufacturing steps of the semiconductor light-emitting device A1. The insulating-layer second parts 132 have a smaller thickness, which is favorable to reduce the z-direction dimension of the semiconductor light-emitting device A1. In addition, such a thickness allows more light L emitted from the semiconductor light-emitting element 2 to reach the insulating-layer first regions 161 and the resin first regions 361 beyond the insulating-layer second regions 162 and the resin second regions 362.

The insulating layer 13 has the insulating-layer third parts 133 that are directly bonded to the base front surface 111 of the base 11. The insulating layer 13 is made of for example resin, while the conductive layer 12 is made of metal. In general, such an insulating layer 13 achieves a greater bonding strength to the base 11, which is made of an insulating material such as resin. Thus, the insulating-layer third parts 133 can prevent detachment of the insulating layer 13 from the base 11.

Each insulating-layer sixth surface 146 has a profile that is curved inward toward the base front surface 111 of the base 11. Thus, a part of the resin member 3 is located between the insulating-layer sixth surface 146 and the base front surface 111. This helps to prevent detachment of the resin member 3 from the base front surface 111. Owing to its high bonding strength to the base 11, the insulating-layer third parts 133 are particularly suitable for preventing detachment of the resin member 3.

Each insulating-layer eighth surface 148 has a profile that is curved in the one direction along the z direction at a position closer to the base third side surface 115. Thus, the insulating layer 13 leaves a larger region of the base third side surface 115 uncovered. This allows solder to be applied to the larger uncovered region of the base third side surface 115, in addition to the back-surface first parts 1221. Consequently, the semiconductor light-emitting device A1 is more firmly mounted on, for example, a circuit board.

The thickness of the front-surface first parts 1211 is smaller than the thickness of the insulating-layer second parts 132. This makes it possible to reduce the z-direct ion dimension of the semiconductor light-emitting device A1. Note that the insulating-layer second parts 132 should not be too thin in order to prevent the front-surface first parts 1211 from being unintentionally exposed. The present embodiment is configured to prevent such undesirable occurrences.

According to the manufacturing method shown in FIGS. 11 to 19, the mold 71 that flat in shape is used to form a curved surface of the resin front surface 31, which includes the resin first to fifth regions 361 to 365. That is, a mold 71 having a curved surface conforming to the resin front surface 31 is not necessary. In addition, no machining or other processing is necessary for shaping the resin front surface 31 into a curved surface. These advantages improve the manufacturing efficiency of the semiconductor light-emitting device A1. Yet, in a different embodiment, the resin front surface 31 may be shaped into a curved surface by machining or other processing. In a different embodiment, in addition, the resin front surface may be cured flat in the state shown in FIG. 17. Even in such an embodiment, the first distance D1 is still longer than the second distance D2 and thus the color inconsistencies can be reduced.

FIGS. 21 to 28 show variations and other embodiments of the present disclosure. In these figures, the same or similar elements as those described in the above-described embodiment are denoted by the same reference signs.

First Variation of First Embodiment

Figure 21:
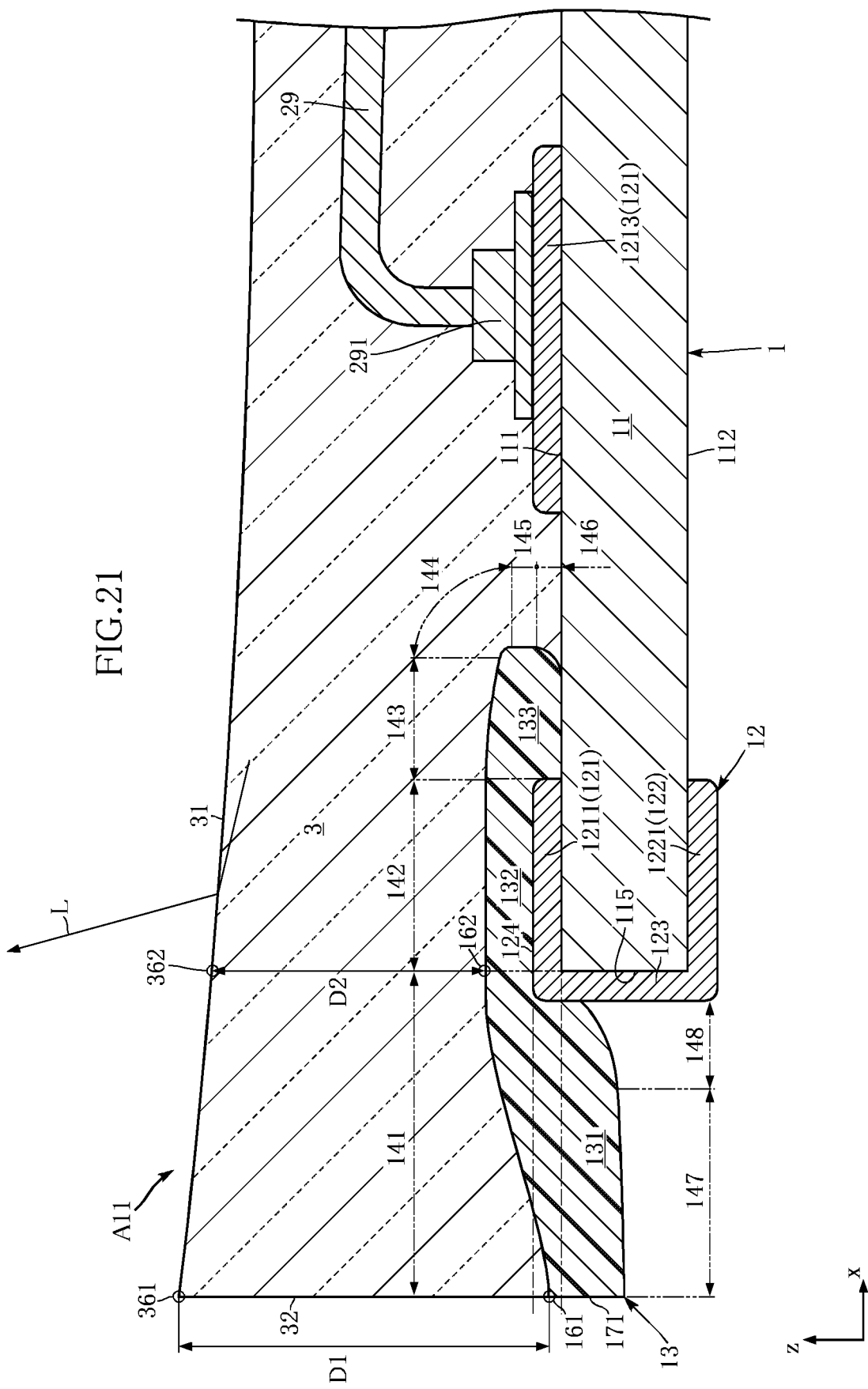
FIG. 21 is an enlarged fragmentary sectional view of a semiconductor light-emitting device according to a first variation of the first embodiment of the present disclosure.

FIG. 21 shows a first variation of the semiconductor light-emitting device A1. A semiconductor light-emitting device A11 of this variation differs from the example described above in the relative position of the insulating-layer first regions 161 in the z direction.

In this variation, the insulating-layer first regions 161 are shifted in position from the base front surface 111 of the base 11 in the one direction along the z direction. More specifically, the insulating-layer first regions are located between the base front surface 111 and the conductive-layer first surface 124 of the front-surface first part 1211 in the z direction. Accordingly, the resin first regions 361 of this variation are shifted in position to a greater amount than in the above-described example, from the base front surface 111 in the one direction along the z direction.

In addition to the advantages of the above-described example, this variation ensures that the resin first regions 361 are shifted to a greater amount from the resin third regions 363 in the one direction along the z direction, without increasing the z-direction dimension of the semiconductor light-emitting device A1.

Second Variation of First Embodiment

Figure 22:
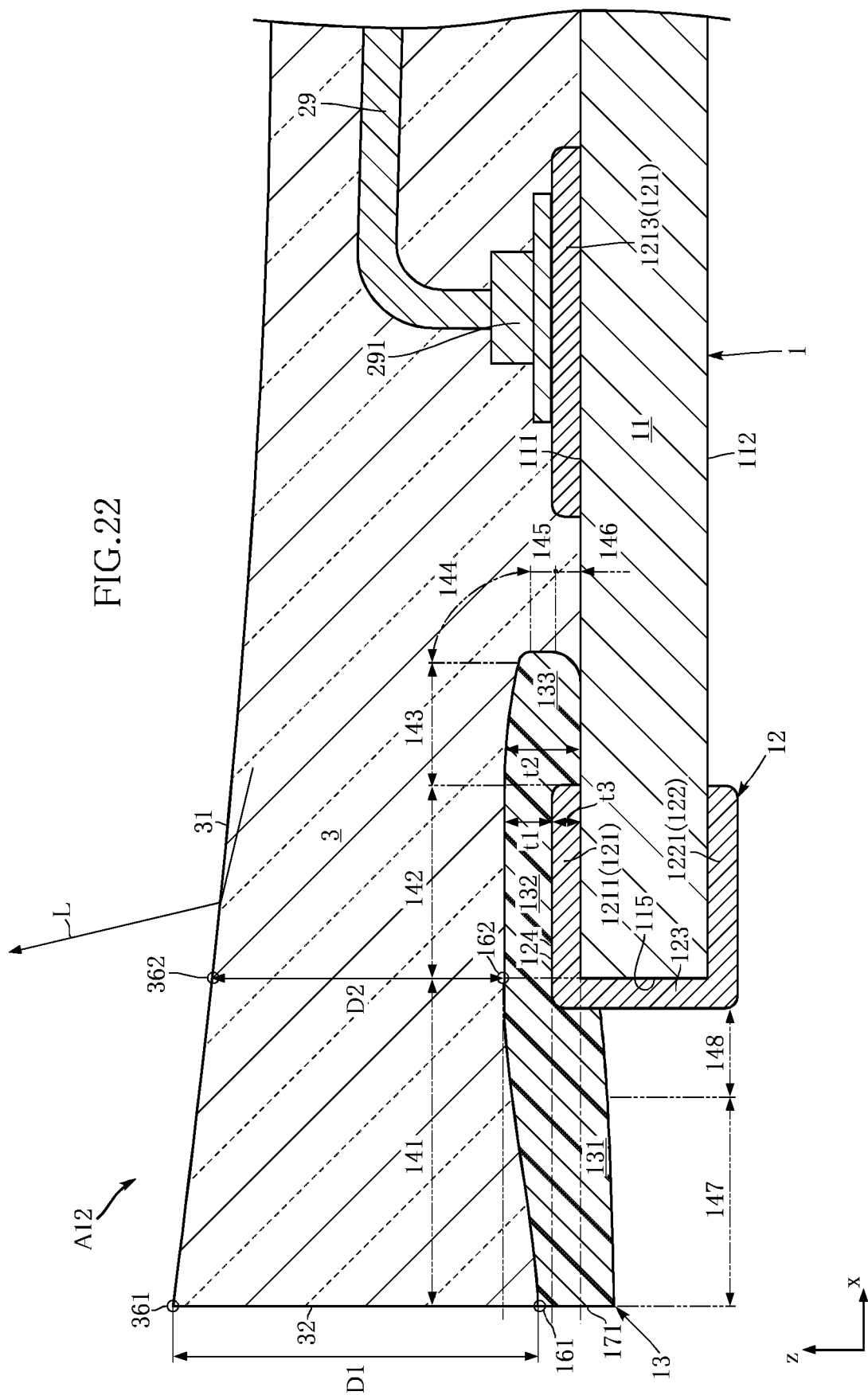
FIG. 22 is an enlarged fragmentary sectional view of a semiconductor light-emitting device according to a second variation of the first embodiment of the present disclosure.

FIG. 22 shows a second variation of the semiconductor light-emitting device A1. A semiconductor light-emitting device A12 of this variation differs from the example described above in the relative position of the insulating-layer first regions 161 in the z direction.

In this variation, the insulating-layer first regions 161 are shifted in position from the conductive-layer first surfaces 124 of the front-surface first parts 1211 in the one direction along the z direction. More specifically, each insulating-layer first region 161 is located between a conductive-layer first surface 124 and an insulating-layer second region 162. Accordingly, each resin first region 361 of this variation is shifted in position to a greater amount than in the above-described example, from the base front surface 111 in the one direction along the z direction.

In addition to the advantages of the above-described example, this variation ensures that the resin first regions 361 are shifted to a greater amount from the resin third regions 363 in the one direction along the z direction. This configuration is favorable for improving the directivity of light L.

Third Variation of First Embodiment

Figure 23:
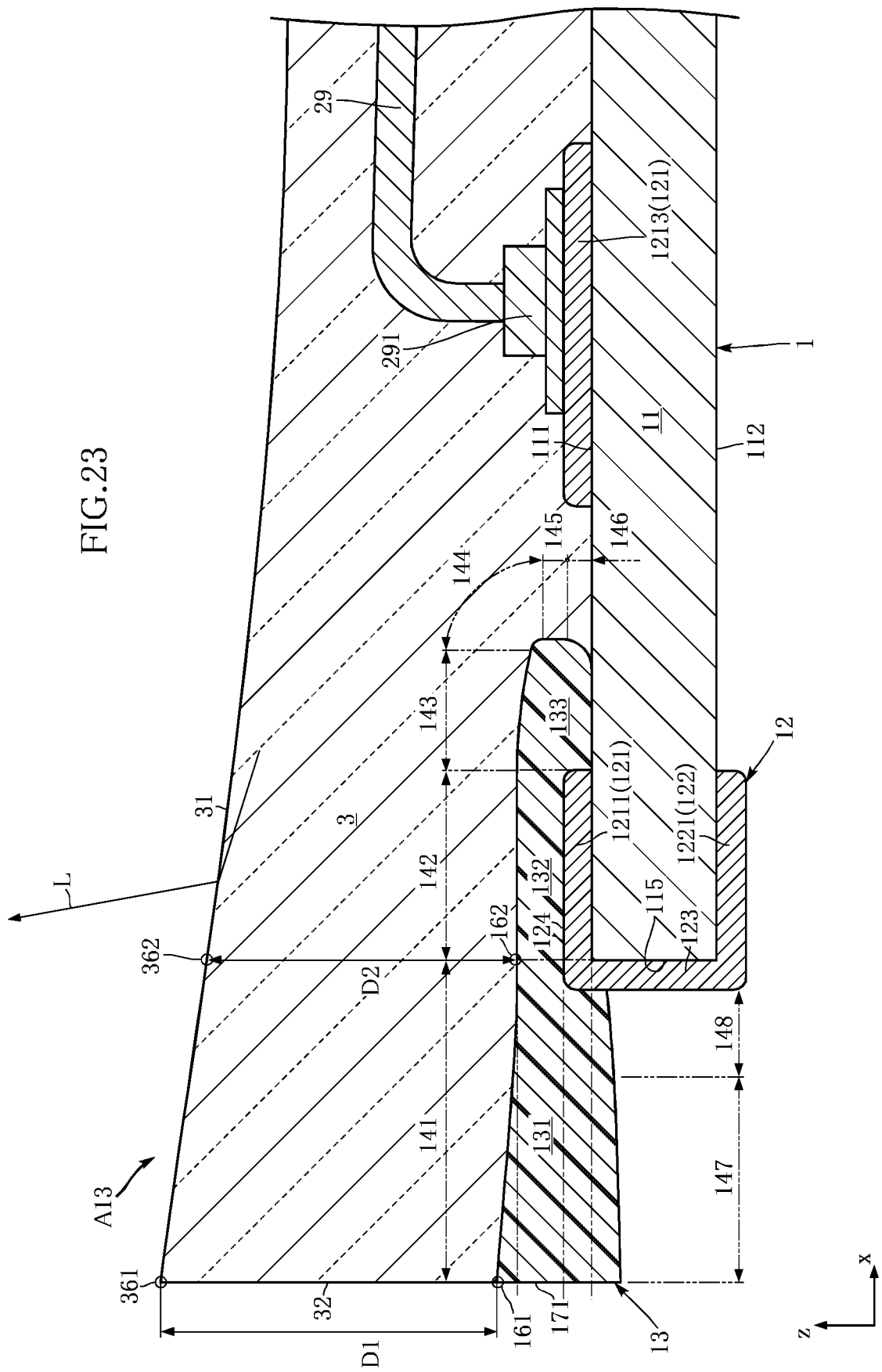
FIG. 23 is an enlarged fragmentary sectional view of a semiconductor light-emitting device according to a third variation of the first embodiment of the present disclosure.

FIG. 23 shows a third variation of the semiconductor light-emitting device A1. A semiconductor light-emitting device A13 of this variation differs from the example described above in the relative position of the insulating-layer first regions 161 in the z direction.

In this variation, the insulating-layer first regions 161 are shifted in position from the insulating-layer second regions 162 in the one direction along the z direction. Accordingly, each resin first region 361 of this variation is shifted in position to a greater amount than in the above-described example, from the base front surface 111 in the one direction along the z direction.

In addition to the advantages of the above-described example, this variation ensures that the resin first regions 361 are shifted to a greater amount from the resin third regions 363 in the one direction along the z direction. This configuration is favorable for improving the directivity of light L.

Fourth Variation of First Embodiment

Figure 24:
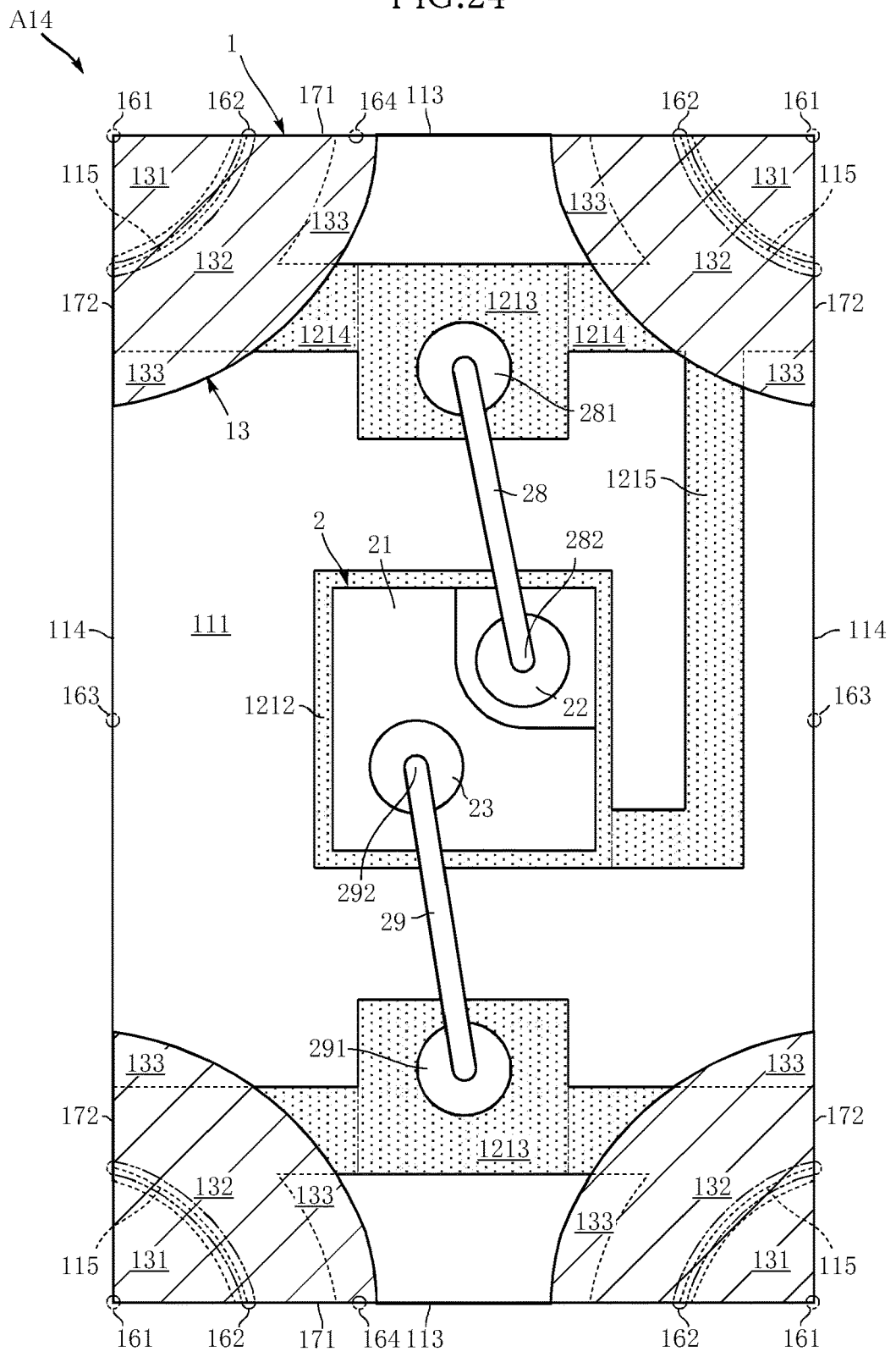
FIG. 24 is an enlarged fragmentary plan view of a semiconductor light-emitting device according to a fourth variation of the first embodiment of the present disclosure.

FIG. 24 shows a fourth variation of the semiconductor light-emitting device A1. A semiconductor light-emitting device A14 of this variation differs from the example described above in the configuration of the insulating layer 13.

In this variation, the insulating layer 13 does not have the connection parts 135, which are provided in the above-described example. The two insulating layer third parts 133, which are located at the opposite ends in the y direction, are not connected and thus separated from each other.

This variation still achieves the same advantages as those of the above-described examples.

Second Embodiment

Figure 25:
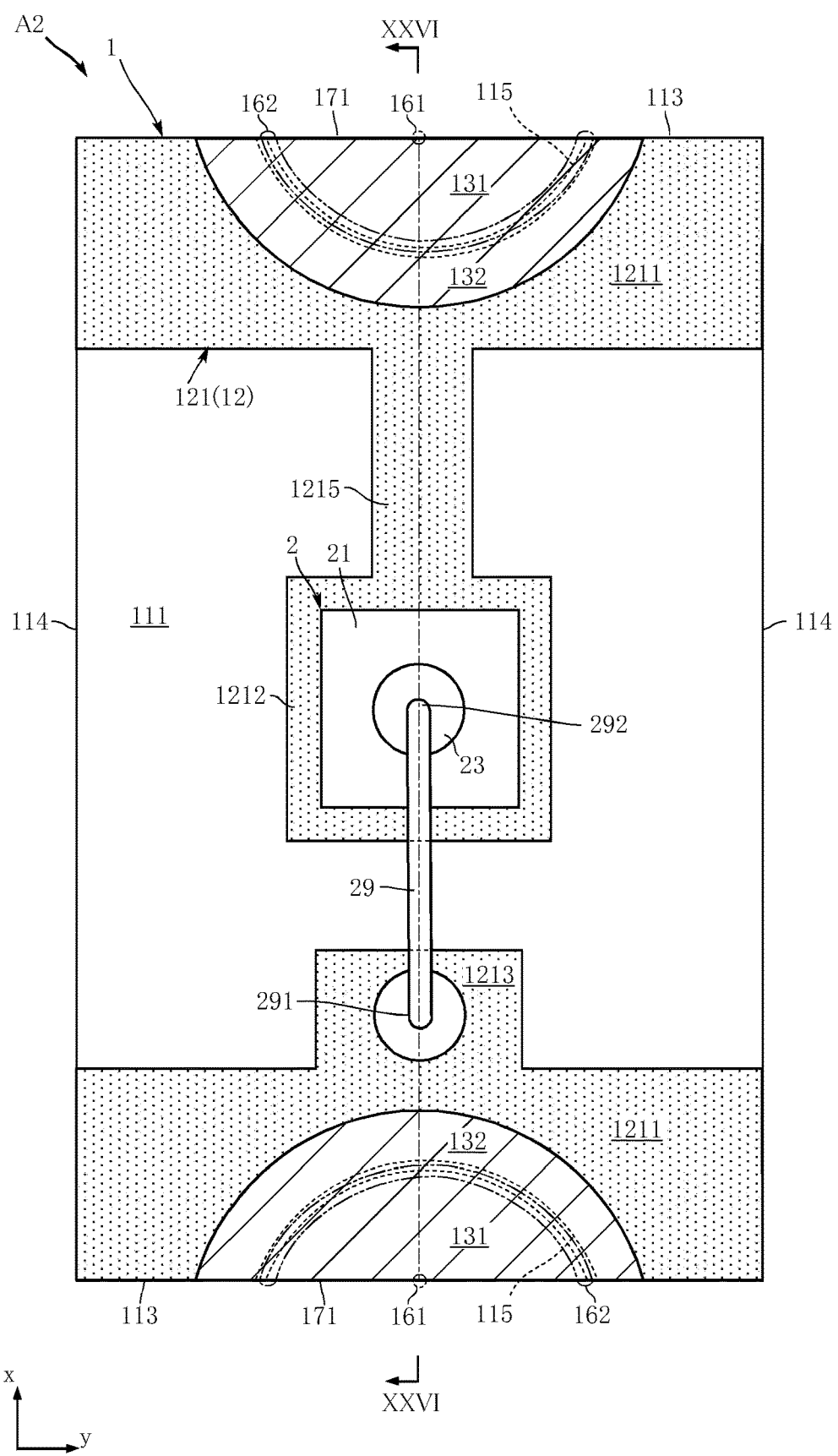
FIG. 25 is a fragmentary plan view of a semiconductor light-emitting device according to a second embodiment of the present disclosure.
Figure 26:
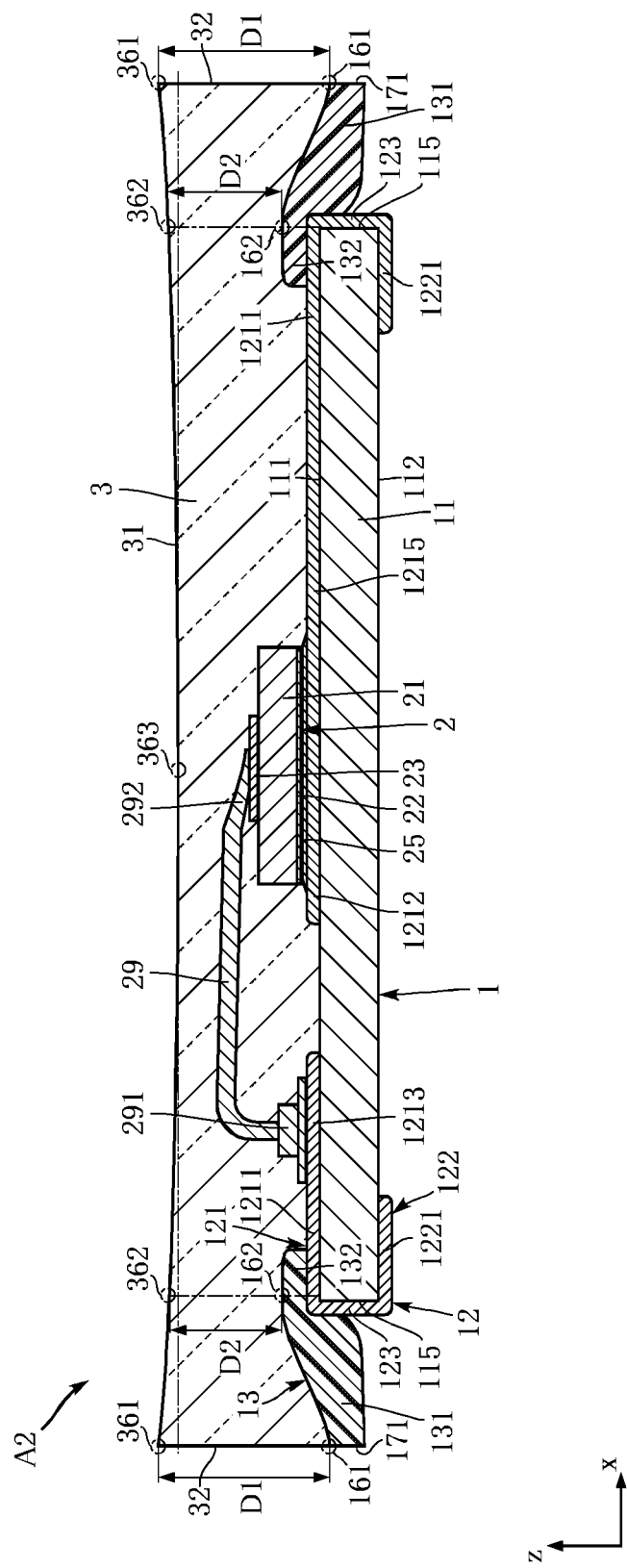
FIG. 26 is a fragmentary sectional view taken along line XXVI-XXVI of FIG. 25.

FIGS. 25 to 26 are views showing a semiconductor light-emitting device according to a second embodiment of the present disclosure. The semiconductor light-emitting device A2 of the present embodiment differs from the embodiment described above, mainly in the number, position and shape of the base third side surfaces 115. For convenience, FIG. 25 omits the resin member 3.

The present embodiment includes two base third side surfaces 115. The pair of base third side surfaces 115 are spaced apart from each other in the x direction. Each base third side surface 115 is located generally centrally of the base 11 in the y direction. Each base third side surface 115 is generally in a quarter-circular shape as viewed in the z direction.

In accordance with the position and shape of the base third side surfaces 115, the insulating layer 13 has insulating-layer first parts 131 and insulating-layer second parts 132 generally at the center of the base 11 in the y direction. Each insulating-layer first part 131 is generally in a quarter-circular shape as viewed in the z direction, and each insulating-layer second part 132 is generally in a quarter-annular shape as viewed in the z direction.

The substrate 1 has a pair of insulating-layer first regions 161 on the edges spaced apart in the x direction. Each insulating-layer second region 162 is generally at the center in the y direction and generally has a quarter-circular shape as viewed in the z direction.

The semiconductor light-emitting element 2 has a first electrode 22 and a second electrode 23, one on the upper surface and the other on the lower surface of the element body 21 in the z direction. The first electrode 22 is bonded to the front-surface segment 121 with an electrically conductive bonding material 25. The second electrode 23 is connected to a wire 29.

The present embodiment is similar to the semiconductor light-emitting device A1, as to the relative lengths of the first distance D1, the second distance D2, the third distance D3 and the fourth distance D4. In addition, the present embodiment is similar to the semiconductor light-emitting device A1, as to the relative positions in the z direction of the pair of resin first regions 361, the pair of resin second regions 362 and the resin third region 363.

The present embodiment is also capable of suppressing color inconsistencies. As can be understood from the present embodiment, the location and the number of the base third side surfaces 115 in the base 11 are not specifically limited.

Third Embodiment

Figure 27:
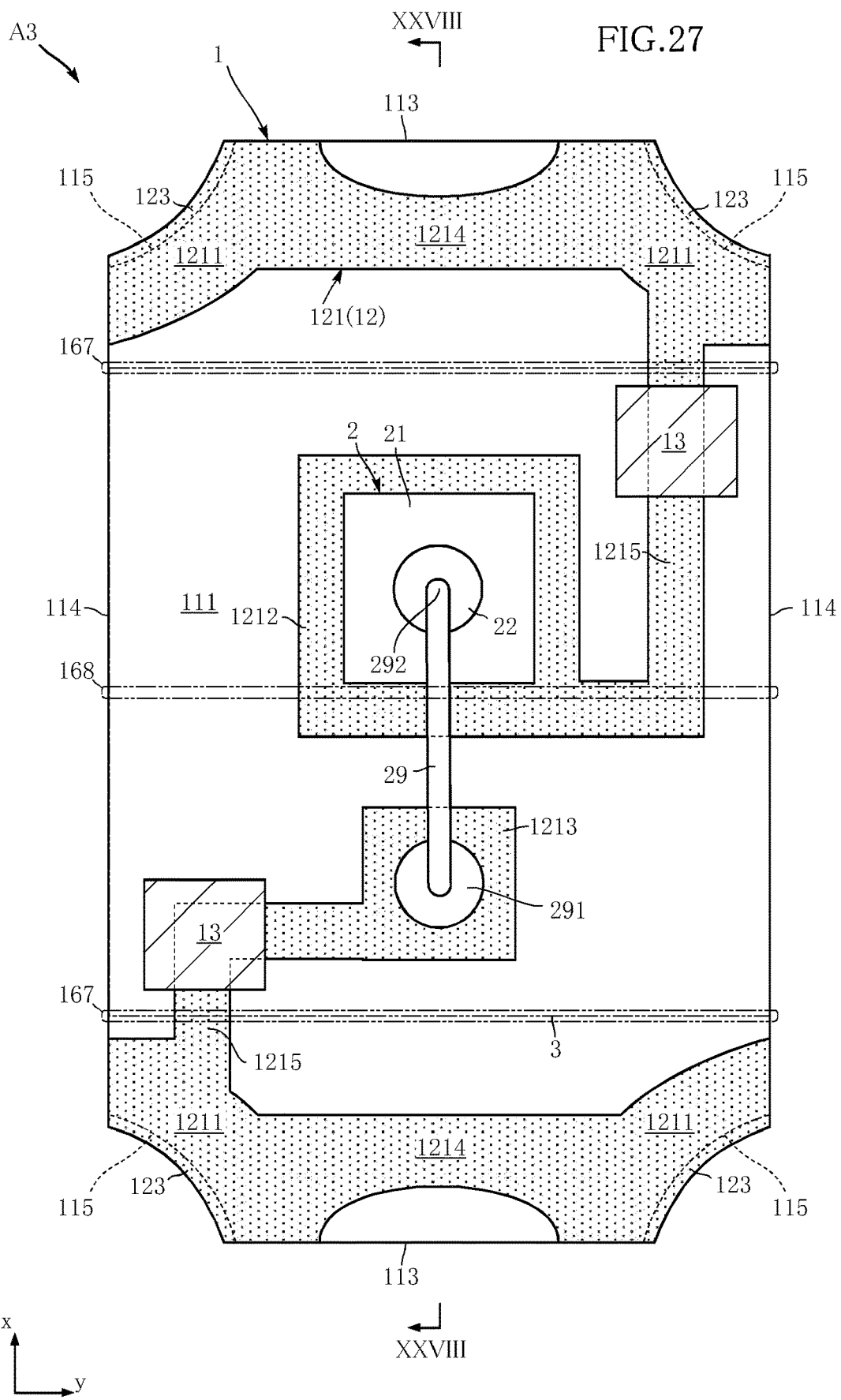
FIG. 27 is a fragmentary plan view of a semiconductor light-emitting device according to a third embodiment of the present disclosure.
Figure 28:
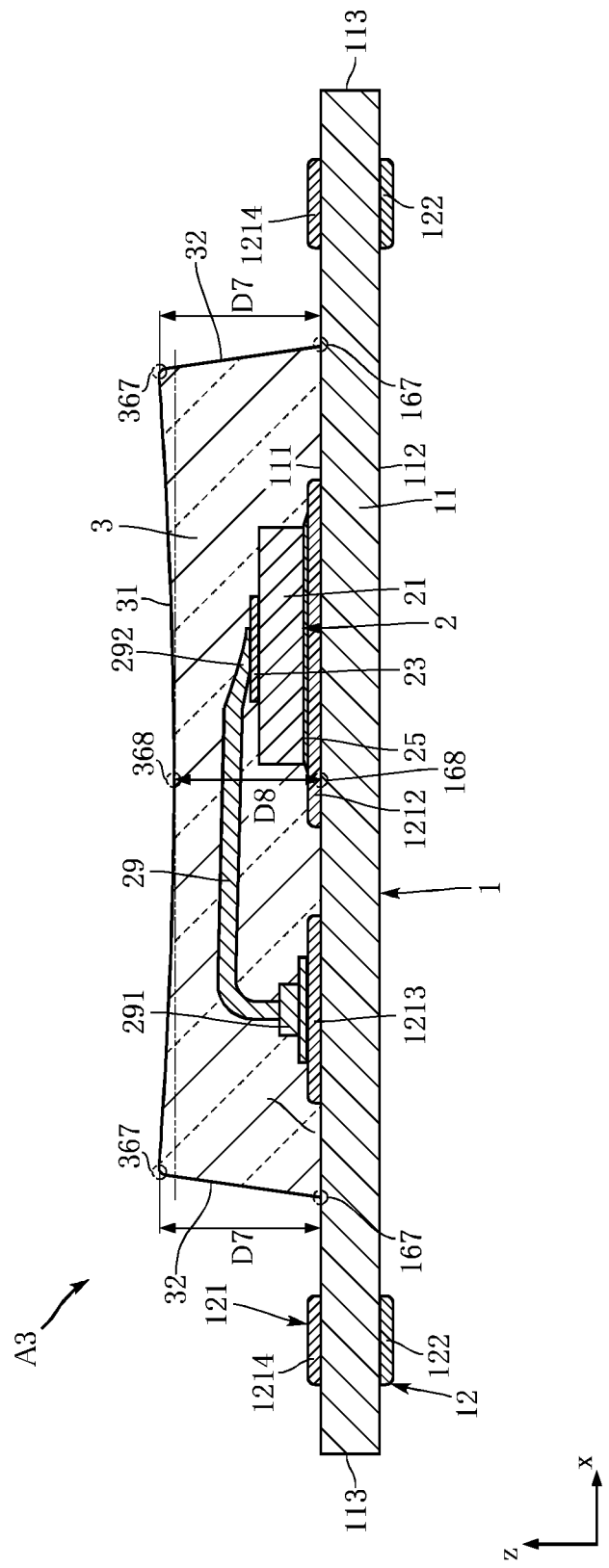
FIG. 28 is a sectional view taken along line XXVIII-XXVIII of FIG. 27.

FIGS. 27 to 28 are views showing a semiconductor light-emitting device according to a third embodiment of the present disclosure. The semiconductor light-emitting device A3 of the present embodiment has a resin member 3 that does not overlap the base third side surfaces 115 as viewed in the z direction. For convenience, FIG. 27 shows the resin member 3 in phantom lines.

The base 11 of the present embodiment is substantially identical in configuration to the semiconductor light-emitting device A1. The resin member 3 has a pair of resin first side surfaces 32 located inward in the x direction from the base first side surface 113 and the base third side surfaces 115. The resin first side surfaces 32 are inclined relative to the x direction, so that they are closer to each other at a position farther in the one direction along the z direction. The resin second side surfaces 33 are flush with the pair of base second side surfaces 114.

The semiconductor light-emitting element 2 is similar in configuration to that of the semiconductor light-emitting device A2, for example. The front-surface second part 1212 is connected to one of the front-surface first parts 1211 by a connection part 1215. Each connection part 1214 connects a pair of front-surface first parts 1211 adjacent to each other. There is one front-surface third part 1213 and it is connected to one of the front-surface first parts 1211 by a connection part 1215.

In the present embodiment, the substrate 1 has a pair of insulating-layer seventh regions 167 and an insulating-layer eighth region 168. Each insulating-layer seventh region 167 is a linear region on the base front surface 111, the region extending in the y direction and in contact with the resin first side surface 32. The insulating-layer eighth region 168 is a linear region extending in the y direction between the pair of insulating-layer seventh regions 167 in the x direction. In the example shown in the figures, the insulating-layer eighth region 168 is substantially at the center of A3 in the x direction.

The resin member 3 has a pair of resin seventh regions 367 and a resin eight region 368. Each resin seventh region 367 is a linear region extending in the y direction and containing a boundary edge between the resin front surface 31 and a resin first side surface 32. The resin eight region 368 is a linear region extending in the y direction and overlapping the insulating-layer eighth region 168 as viewed in the z direction. In the present embodiment, the seventh distance D7 from an insulating-layer seventh region 167 to a corresponding resin seventh region 367 in the z direction is longer than the eighth distance D8 from the insulating-layer eighth region 168 to the resin eighth region 368 in the z direction. In addition, the pair of resin seventh regions 367 are shifted in position from the resin eight region 368 in the one direction along the z direction. The resin member 3 has a uniform shape in any cross section perpendicular to the y direction. That is, the resin front surface 31 is a curved surface defining a relatively shallow groove extending in the y direction.

According to the present embodiment, the resin front surface 31 has a curved profile defining a groove. Thus, in the example use described above with reference to FIG. 20, the semiconductor light-emitting device A3 can ensure that the semiconductor light-emitting device A3 does not stick to the sheet 82, ensuring the proper picking operation of the semiconductor light-emitting device A3.

The semiconductor light-emitting devices according to the present disclosure are not limited to those of the embodiments described above. The specific configuration of each component of the semiconductor light-emitting devices according to the present disclosure may be subjected to various design changes.

[Clause A1]

A semiconductor light-emitting device, comprising:
 a substrate including
  an insulating base having a base front surface facing in one direction along a thickness direction and a base back surface facing in another direction along the thickness direction,
  a conductive layer formed on the base, and
  an insulating layer covering a part of the conductive layer;
 a semiconductor light-emitting element mounted on the base front surface of the substrate; and a resin member covering the semiconductor light-emitting element, the resin member being configured to transmit light from the semiconductor light-emitting element, wherein the base of the substrate has
a pair of base first side surfaces connecting the base front surface and the base back surface and spaced apart from each other in a first direction, and
a pair of base third side surfaces connecting the base front surface and the base back surface and each being recessed from one of the base first side surfaces toward the semiconductor light-emitting element as viewed in the thickness direction, the conductive layer has a front-surface segment formed on the base front surface and a side surface segment formed on one of the base third side surfaces, the front-surface segment has a front-surface first part that is integral with the side surface segment and adjacent to the base third side surface at a position closer to the semiconductor light-emitting element, the insulating layer has
an insulating-layer first part located opposite from the semiconductor light-emitting element across the base third side surface as viewed in the thickness direction, and
an insulating-layer second part overlapping the front-surface first part of the conductive layer as viewed in the thickness direction, the resin member covers the insulating-layer first part and the insulating-layer second part of the insulating layer, the insulating-layer first part has an insulating-layer first surface that is in contact with the resin member, the insulating-layer second part has an insulating-layer second surface that is in contact with the resin member, and a first distance from an insulating-layer first region on the insulating-layer first surface to a resin first region on a resin front surface of the resin member is longer than a second distance from an insulating-layer second region on the insulating-layer second surface to a resin second surface on the resin front surface of the resin member, the resin first region overlapping the insulating-layer first region as viewed in the thickness direction, the resin second region overlapping the insulating-layer second region as viewed in the thickness direction.

[Clause A2]
The semiconductor light-emitting device according to Clause A1, wherein
the resin front surface of the resin member has a resin third region overlapping the semiconductor light-emitting element as viewed in the thickness direction, and
the resin first region is shifted in position from the resin third region in the one direction along the thickness direction.

[Clause A3]
The semiconductor light-emitting device according to Clause A2, wherein the resin first region is shifted in position from the resin second region in the one direction along the thickness direction.

[Clause A4]
The semiconductor light-emitting device according to any one of Clauses A1 to A3 wherein
the base of the substrate has
a pair of base second side surfaces connecting the base front surface and the base back surface and spaced apart from each other in a second direction that is perpendicular to the first direction and the thickness direction, and
the base third side surfaces comprising four base third side surfaces, and
each of the base third side surfaces is present between one of the base first side surfaces and one of the base second side surfaces.

[Clause A5]
The semiconductor light-emitting device according to Clause A4, wherein the resin member has
a pair of resin first side surfaces that are flush with the pair of base first side surfaces and
a pair of resin second side surfaces that are flush with the pair of base second side surfaces.

[Clause A6]
The semiconductor light-emitting device according to Clause A5, wherein the insulating layer has
an insulating-layer first side surface that is flush with one of the base first side surfaces and
an insulating-layer second side surface that is flush with one of the base second side surfaces.

[Clause A7]
The semiconductor light-emitting device according to Clause A6, wherein
the insulating-layer first region is where the insulating-layer first side surface, the insulating-layer second side surface and the insulating-layer first surface meet, and
the insulating-layer second region overlaps one of the base third side surfaces as viewed in the thickness direction.

[Clause A8]
The semiconductor light-emitting device according to Clause A7, wherein
the resin front surface of the resin member has a resin fourth region on a boundary with one of the resin second side surfaces, the resin fourth region overlapping the semiconductor light-emitting element as viewed in the first direction, and
the resin first region is shifted in position from the resin fourth region in the one direction along the thickness direction.

[Clause A9]
The semiconductor light-emitting device according to Clause A7 or A8, wherein
the resin front surface of the resin member has a resin fifth region on a boundary with one of the resin first side surfaces, the resin fifth region overlapping the semiconductor light-emitting element as viewed in the second direction, and
the resin first region is shifted in position from the resin fifth region in the one direction along the thickness direction.

[Clause A10]
The semiconductor light-emitting device according to any one of Clauses A7 to A9, wherein the insulating-layer first region is shifted in position from the insulating-layer second region in the other direction along the thickness direction.

[Clause A11]
The semiconductor light-emitting device according to Clause A10, wherein the insulating-layer first region is shifted in position from the base front surface in the other direction along the thickness direction.

[Clause A12]
The semiconductor light-emitting device according to Clause A10, wherein the insulating-layer first region is located between the base front surface and a conductive-layer first surface of the front-surface first part in the thickness direction.

[Clause A13]
The semiconductor light-emitting device according to Clause A10, wherein the insulating-layer first region is shifted in position from the base front surface and a conductive-layer first surface of the front-surface first part in the one direction along the thickness direction.

[Clause A14]

The semiconductor light-emitting device according to any one of Clauses A7 to A9, wherein the insulating-layer first region is shifted in position from the insulating-layer second region in the one direction along the thickness direction.

[Clause A15]

The semiconductor light-emitting device according to any one of Clauses A1 to A14, wherein the insulating layer has an insulating-layer third part that is adjacent to the insulating-layer second part and in contact with the base front surface.

[Clause A16]

The semiconductor light-emitting device according to Clause A15, wherein the insulating-layer third part has a greater thickness than the insulating-layer second part.

[Clause A17]

The semiconductor light-emitting device according to Clause A16, wherein the insulating-layer second part has a greater thickness than the front-surface first part of the front-surface segment of the conductive layer.

Fourth Embodiment

FIGS. 29 to 38 are views showing a semiconductor light-emitting device according to a fourth embodiment of the present disclosure. The semiconductor light-emitting device A4 of the present embodiment includes a substrate 1, a semiconductor light-emitting element 2 and a resin member 3. In these figures, the x direction corresponds to a first direction, the y direction to a second direction, and the z direction to a thickness direction. The x, y and z directions are perpendicular to each other. The semiconductor light-emitting device A4 is not limited to any specific shape and dimensions. In the present embodiment, the semiconductor light-emitting device has a rectangular shape as viewed in the z direction, measuring about 0.7 to 2.5 mm in the x direction, about 0.4 to 1.0 mm in the y direction and about 0.15 to 0.3 mm in the z direction.

Figure 29:
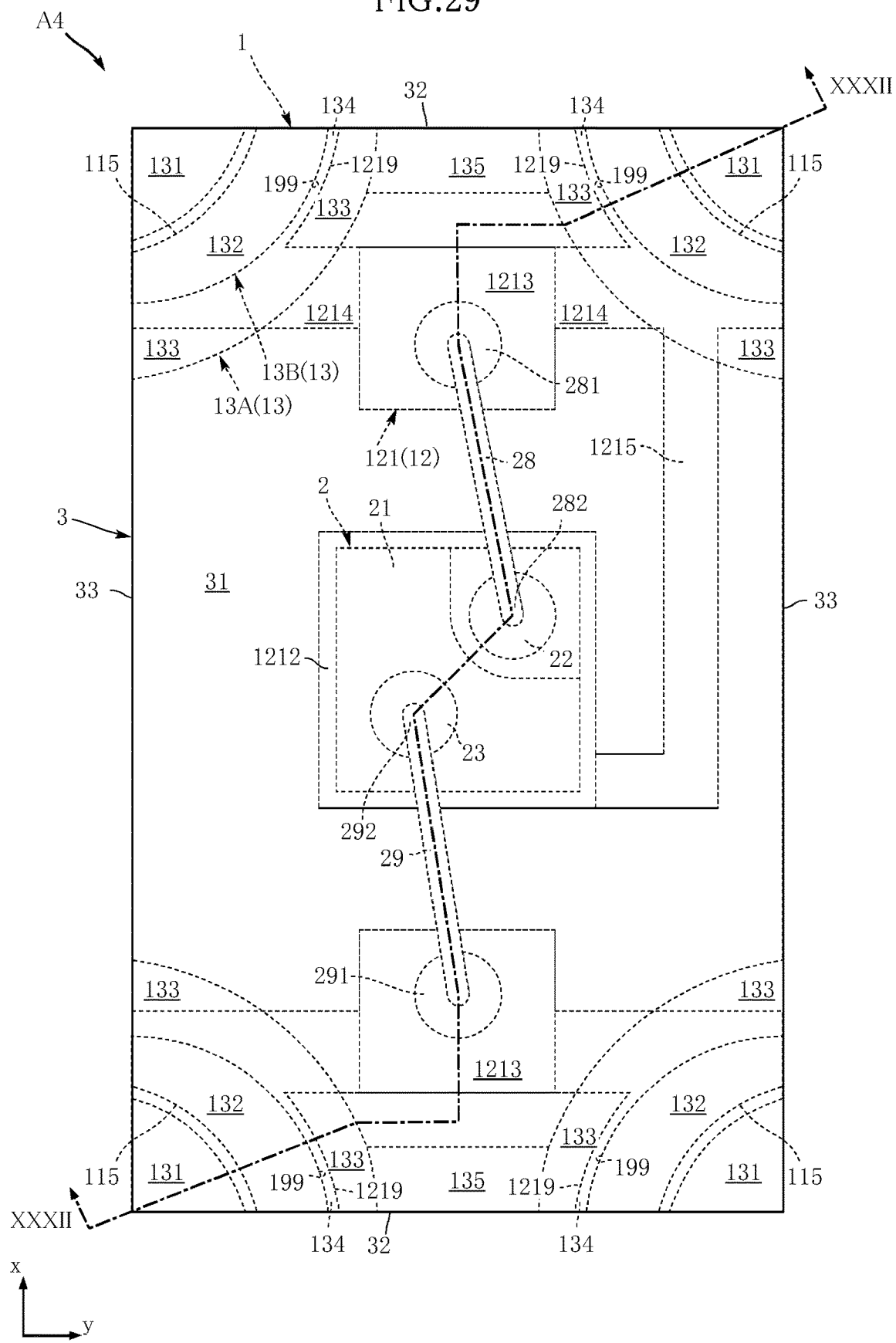
FIG. 29 is a plan view of a semiconductor light-emitting device according to a fourth embodiment of the present disclosure.
Figure 30:
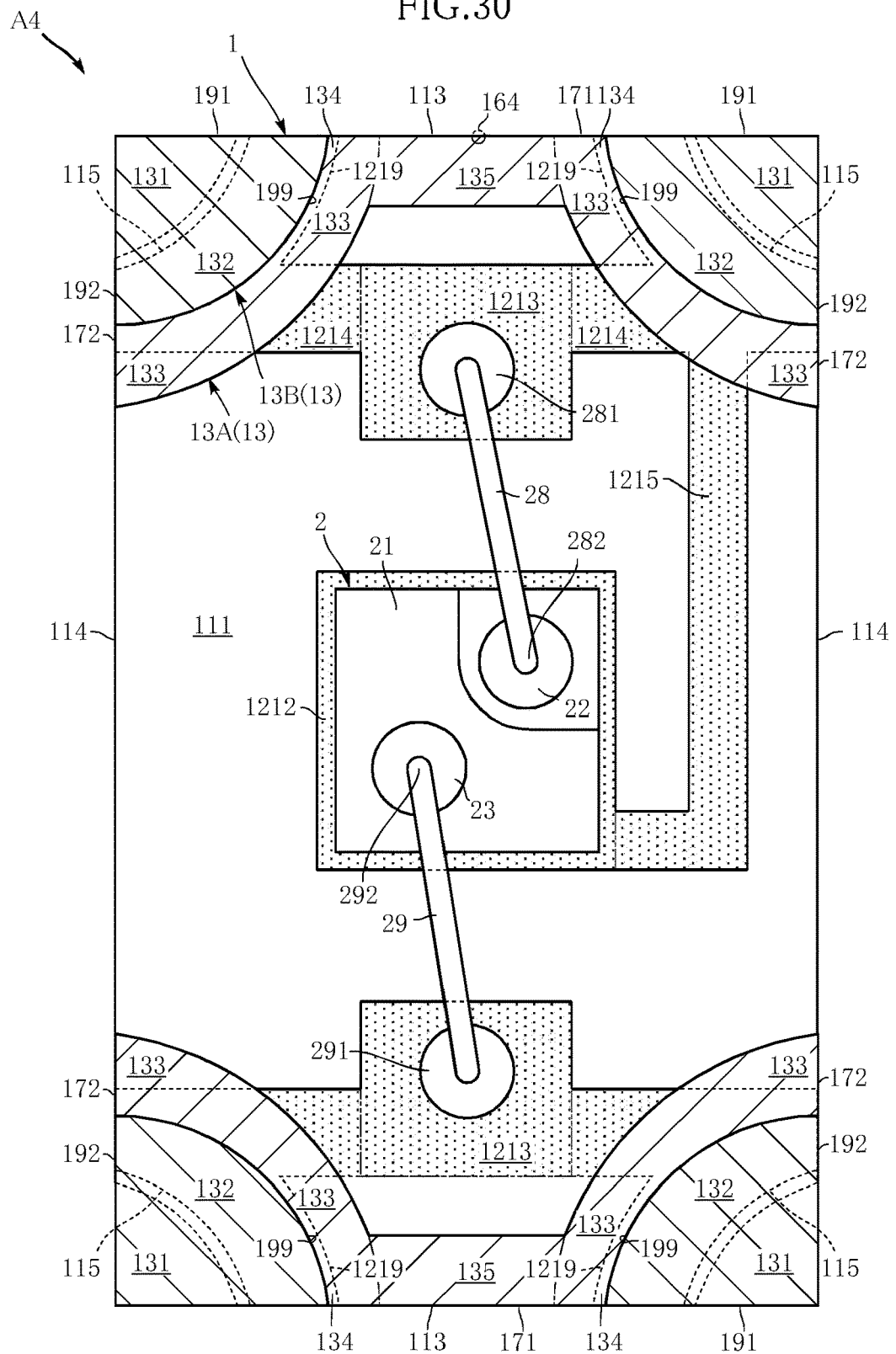
FIG. 30 is a fragmentary plan view of the semiconductor light-emitting device according to the fourth embodiment of the present disclosure.
Figure 31:
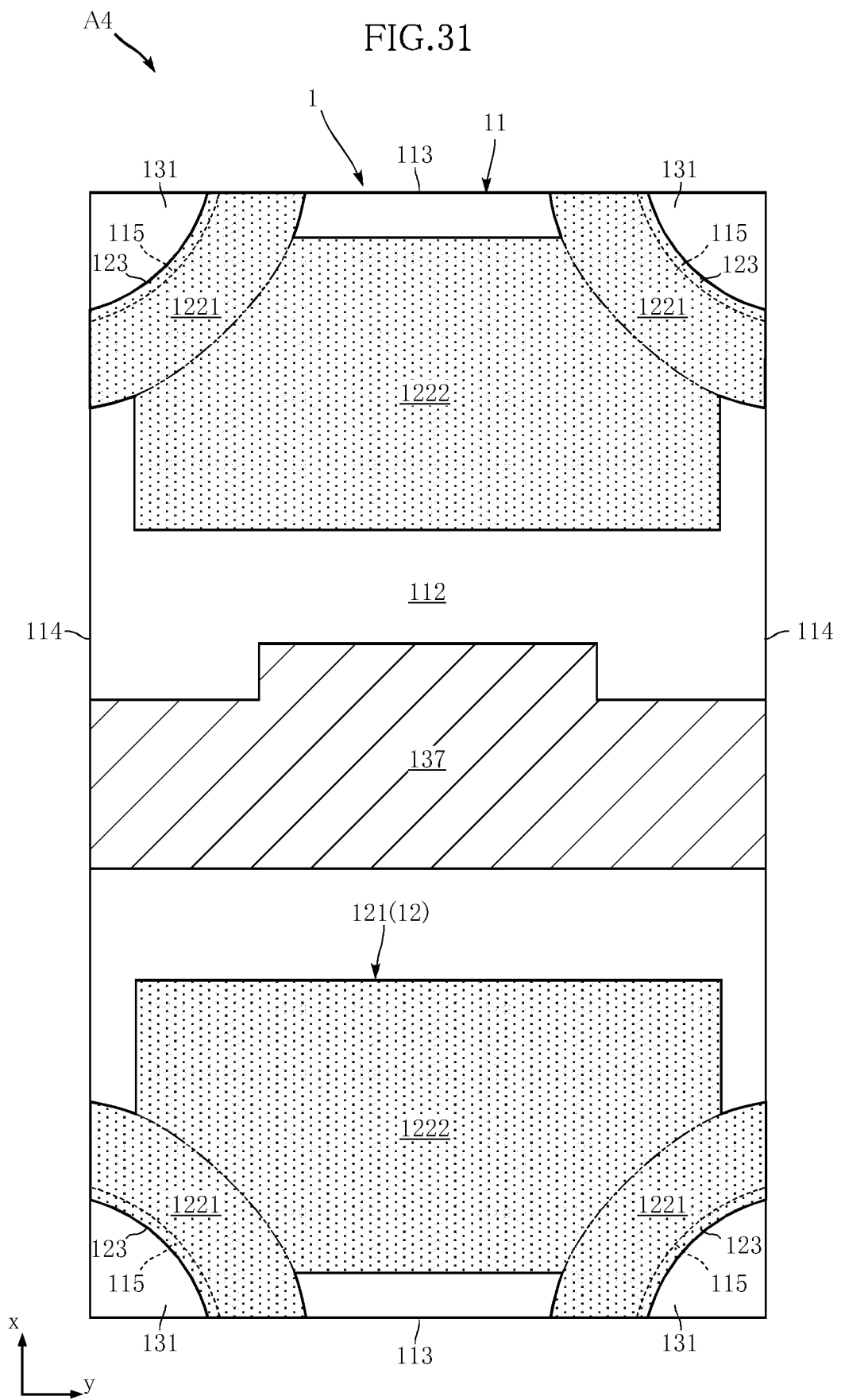
FIG. 31 is a bottom view of the semiconductor light-emitting device according to the fourth embodiment of the present disclosure.
Figure 32:
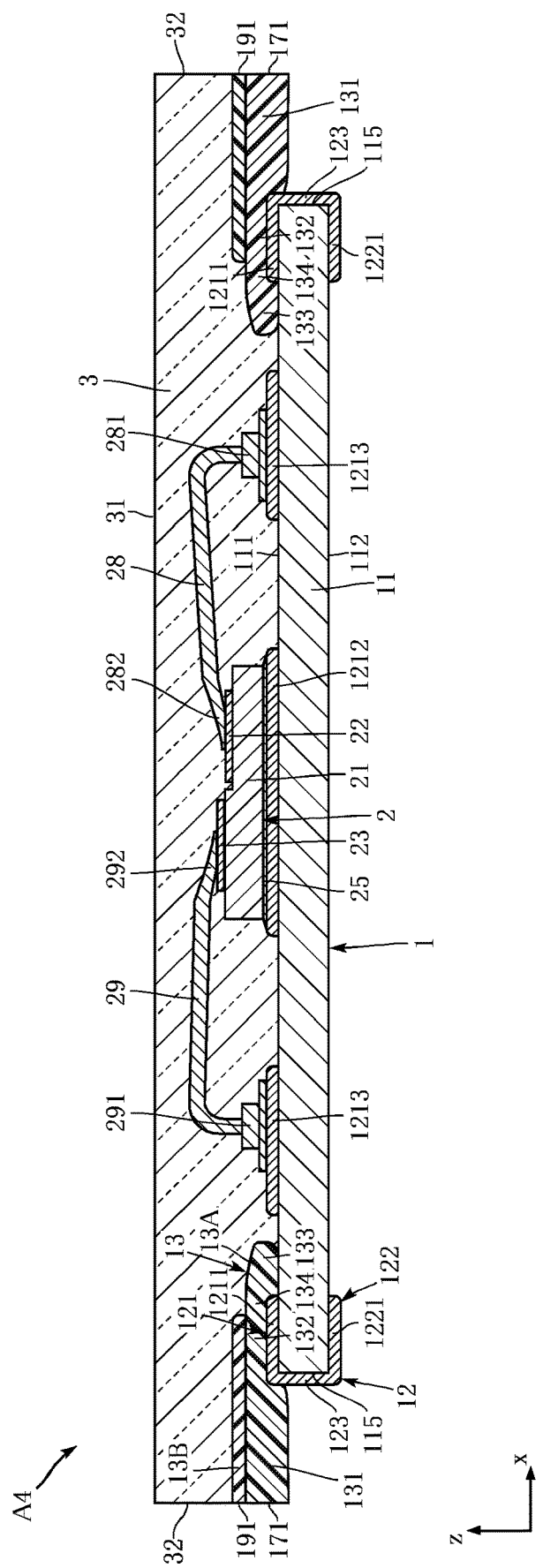
FIG. 32 is a sectional view taken along line XXXII-XXXII of FIG. 29.
Figure 33:
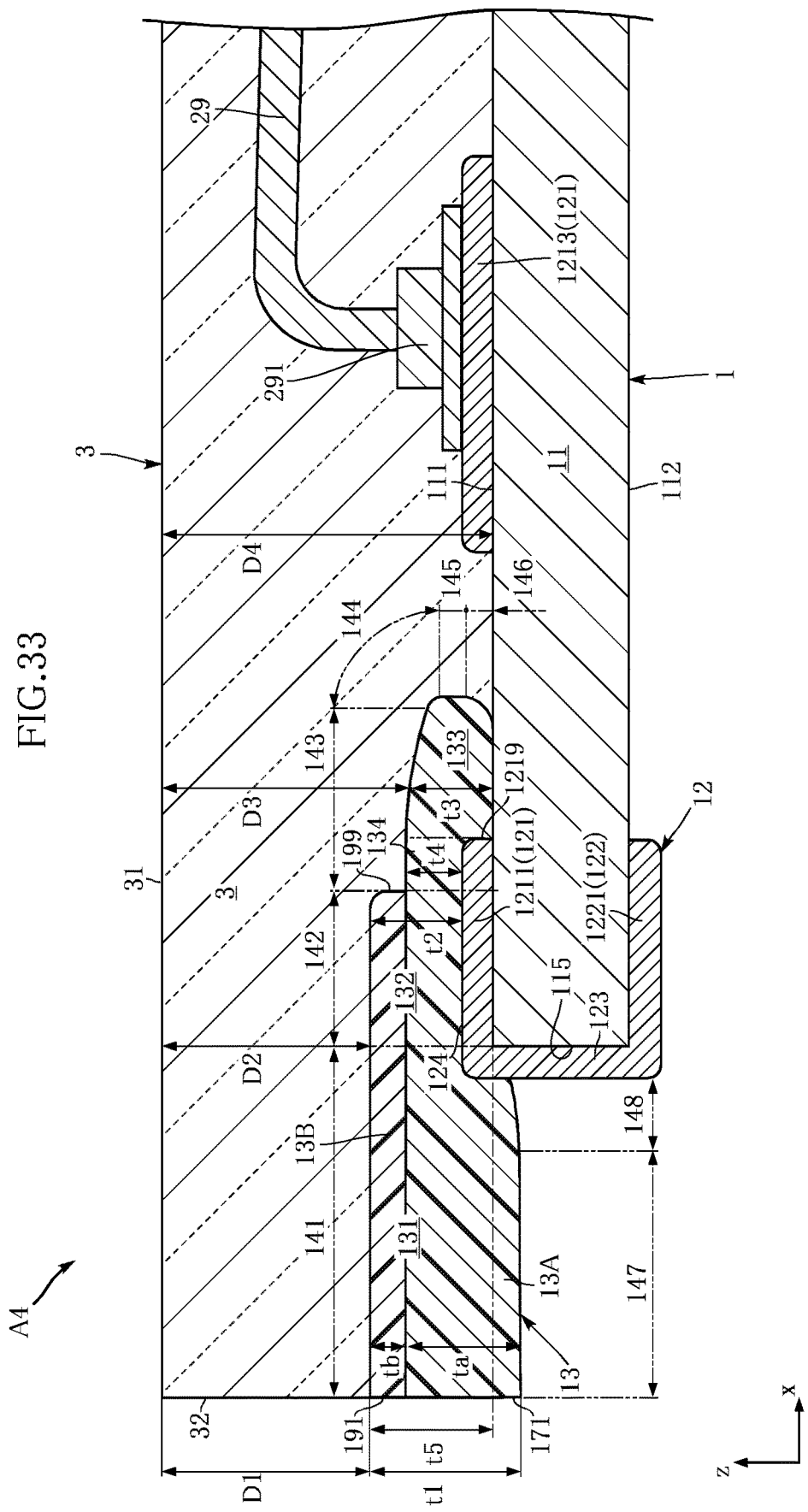
FIG. 33 is an enlarged fragmentary sectional view of the semiconductor light-emitting device according to the fourth embodiment of the present disclosure.
Figure 34:
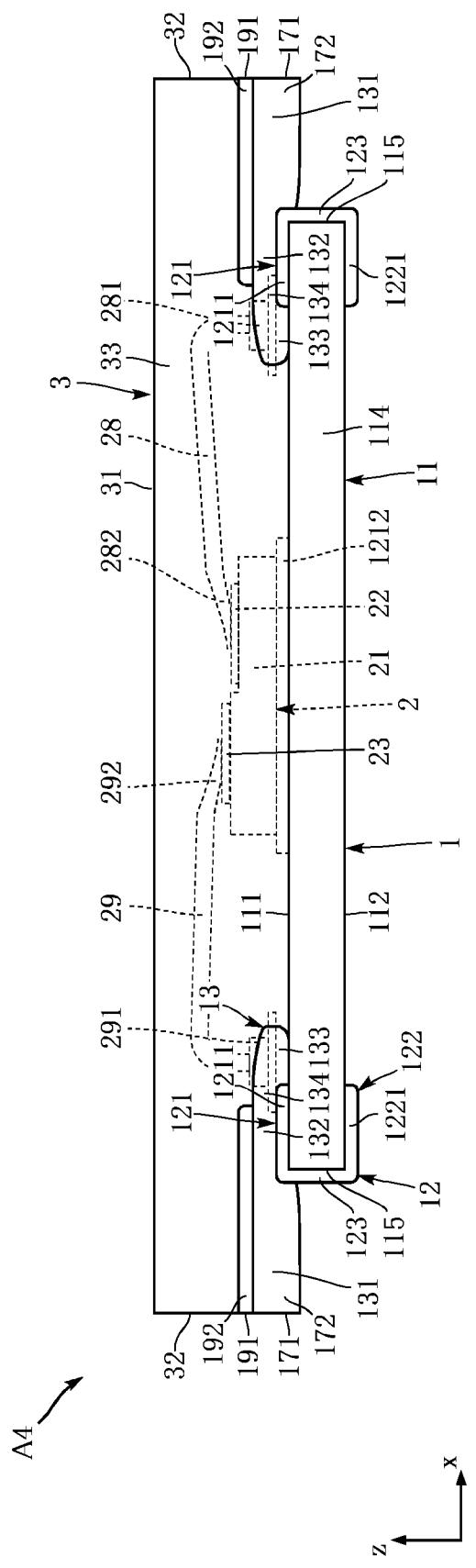
FIG. 34 is a front view of the semiconductor light-emitting device according to the fourth embodiment of the present disclosure.
Figure 35:
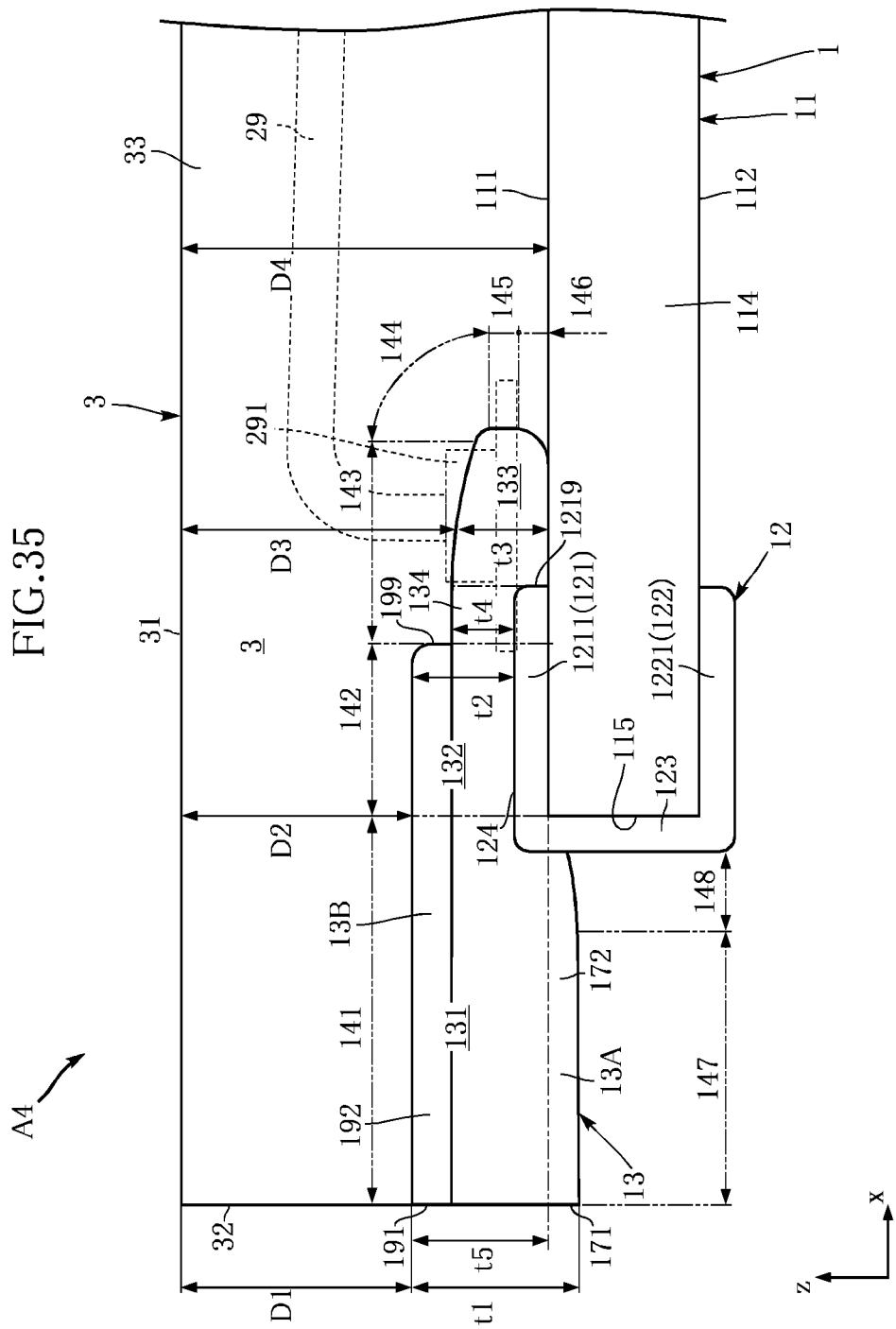
FIG. 35 is an enlarged fragmentary front view of the semiconductor light-emitting device according to the fourth embodiment of the present disclosure.
Figure 36:
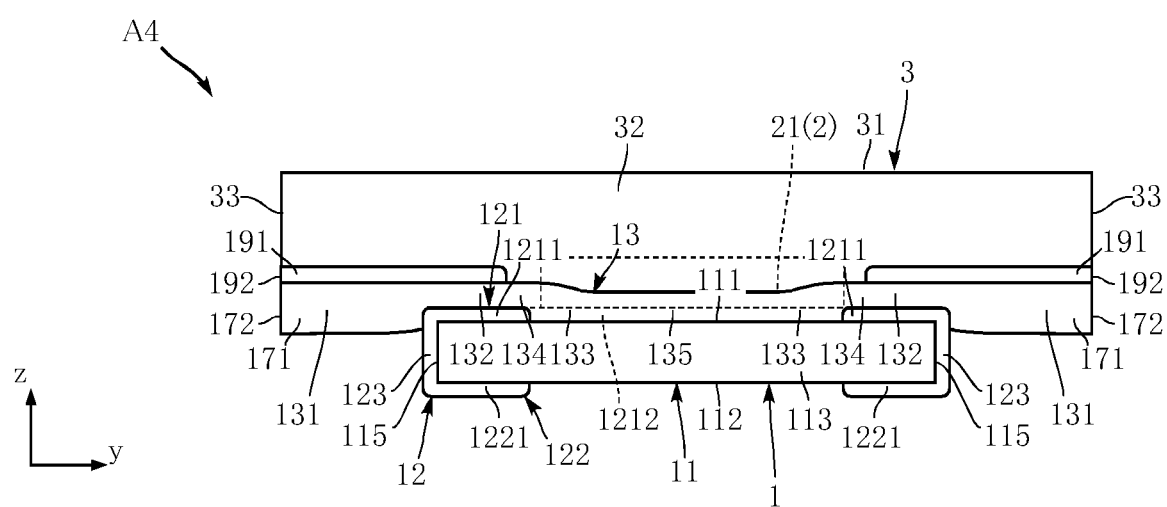
FIG. 36 is a side view of the semiconductor light-emitting device according to the fourth embodiment of the present disclosure.
Figure 37:
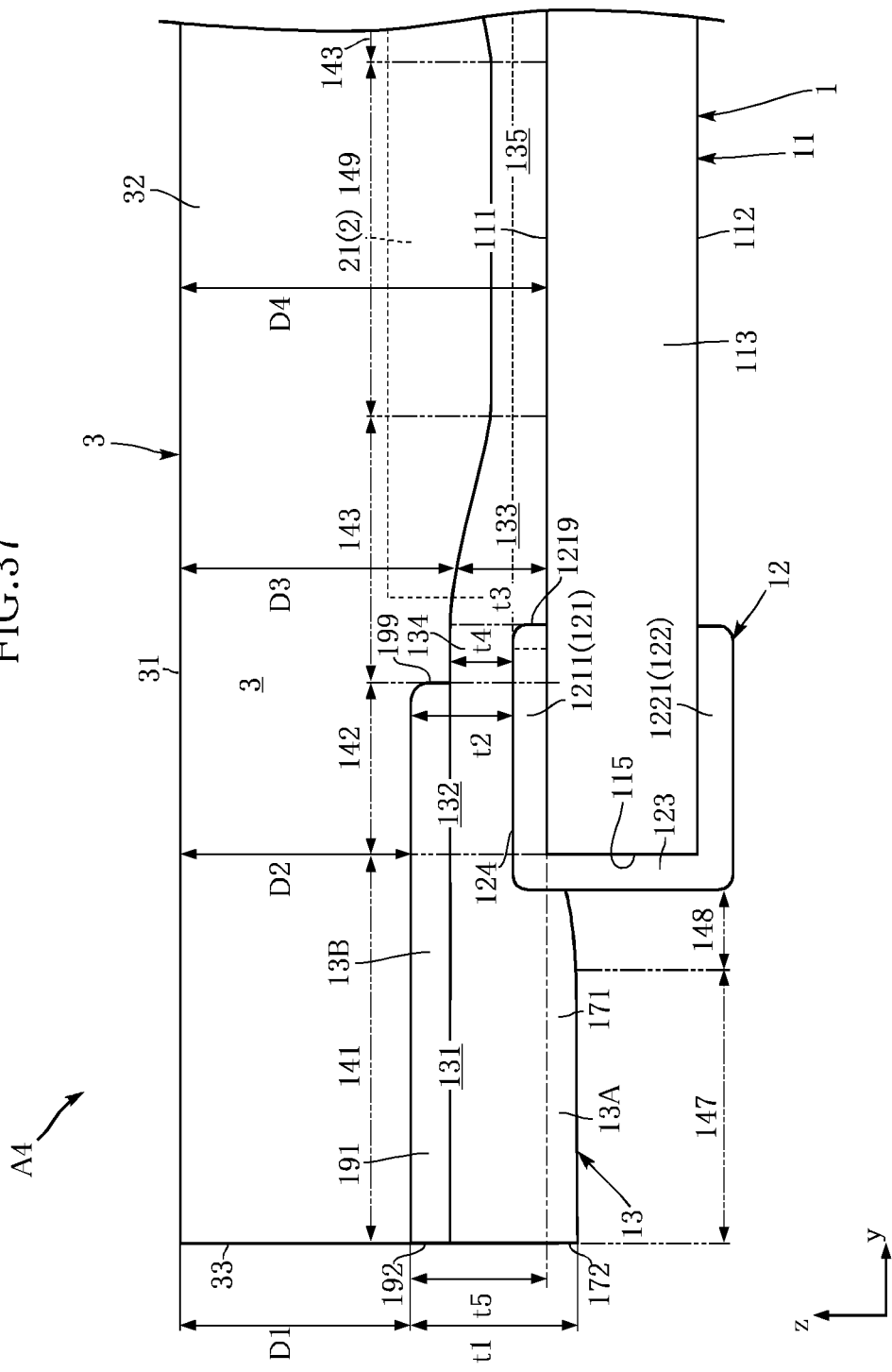
FIG. 37 is an enlarged fragmentary side view of the semiconductor light-emitting device according to the fourth embodiment of the present disclosure.
Figure 38:
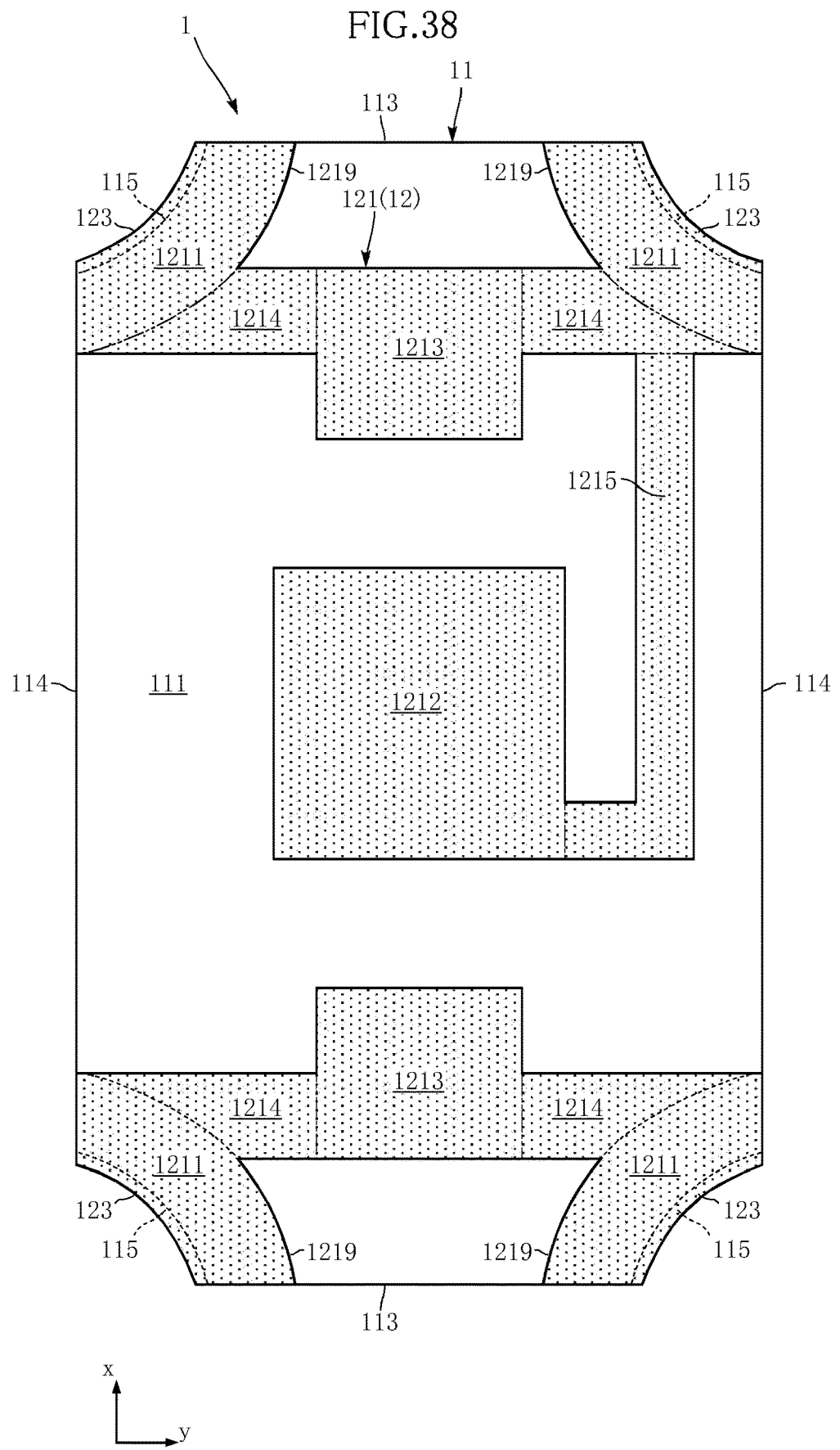
FIG. 38 is a fragmentary plan view showing a substrate of the semiconductor light-emitting device according to the fourth embodiment of the present disclosure.

FIG. 29 is a plan view of the semiconductor light-emitting device A1. FIG. 30 is a fragmentary plan view of the semiconductor light-emitting device A4. FIG. 31 is a bottom view of the semiconductor light-emitting device A1. FIG. 32 is a sectional view taken along line IV-IV of FIG. 29. FIG. 33 is an enlarged fragmentary sectional view of the semiconductor light-emitting device A4. FIG. 34 is a front view of the semiconductor light-emitting device A4. FIG. 35 is an enlarged fragmentary front view of the semiconductor light-emitting device A4. FIG. 36 is a side view of the semiconductor light-emitting device A4. FIG. 37 is an enlarged fragmentary side view of the semiconductor light-emitting device A4. FIG. 38 is a fragmentary plan view of the substrate 1 of the semiconductor light-emitting device A4. As will be understood from the line IV-IV of FIG. 29, the lateral direction of FIG. 32 generally corresponds to the x direction, although some parts are not precisely taken in the x direction. The same applies to FIG. 33.

The substrate 1 supports the semiconductor light-emitting element 2 and provides a conduction path to the semiconductor light-emitting element 2. The substrate 1 includes a base 11, a conductive layer 12 and an insulating layer 13.

The base 11 is made of an electrically insulating material, such as a glass epoxy resin, and comprises the body of the substrate 1. The base 11 has a base front surface 111, a base back surface 112, a pair of base first side surfaces 113, a pair of a base second side surfaces 114 and a plurality of base third side surfaces 115.

The base front surface 111 faces in one direction along the z direction, and the base back surface 112 faces opposite, in the other direction along the along the z direction. In the example shown in the figures, the base front surface 111 comprises a flat surface.

The base first side surfaces 113 are spaced apart from each other in the x direction and perpendicular to the x direction. The base first side surfaces 113 connect the base front surface 111 and the base back surface 112. In the example shown in the figures, the base back surface 112 comprises a flat surface.

The base second side surfaces 114 are spaced apart from each other in they direction and perpendicular to the y direction. The base second side surfaces 114 connect the base front surface 111 and the base back surface 112.

The base third side surfaces 115 connect the base front surface 111 and the base back surface 112. As viewed in the z direction, each base third side surface 115 is recessed from the base first side surface 113. In the present embodiment, the base third side surface 115 is recessed inward in the x direction from the base first side surface 113. In the present embodiment, in addition, the base third side surface 115 is present between the base first side surface 113 and the base second side surface 114 that is adjacent thereto. The base third side surface 115 is also recessed from the base second side surface 114 as viewed in the z direction. In the present embodiment, the base third side surface is recessed inward in the y direction from the base second side surface 114. The present embodiment includes four base third side surfaces 115. The four base third side surfaces 115 include a pair of base third side surfaces 115. As viewed in the z direction, each base third side surface 115 is generally in a quarter-circular shape.

The conductive layer 12 is disposed on the base 11 to provide conduction paths to the semiconductor light-emitting element 2. The conductive layer 12 may be coated with, for example, a Cu layer. In addition, parts of the conductive layer 12 exposed from the insulating layer 13 may be coated with, for example, a Au layer. The conductive layer 12 includes a front-surface segment 121, a back-surface segment 122 and four side-surface segments 123.

The front-surface segment 121 comprises parts formed on the base front surface 111 of the base 11. In the present embodiment, the front-surface segment 121 includes four front-surface first parts 1211, a front-surface second part 1212, a pair of front-surface third parts 1213, a plurality of connection parts 1214 and a connection part 1215. For convenience, FIG. 38 shows in the chain double-dashed lines (phantom lines) the boundaries of the four front-surface first parts 1211, the front-surface second part 1212, the pair of front-surface third parts 1213 and the plurality of connection parts 1214 and the connection part 1215.

Each front-surface first part 1211 is contiguous with a base third side surface 115 of the base 11. In the present embodiment, the front-surface first part 1211 is generally in a quarter-annular shape as viewed in the z direction. The front-surface first part 1211 is also contiguous with both a base first side surface 113 and abase second side surface 114. In the present embodiment, the four front-surface first parts 1211 are provided for the four base third side surfaces 115.

The front-surface second part 1212, on which the semiconductor light-emitting element 2 will be mounted, is located generally centrally of the base front surface 111. The front-surface second part 1212 of the front-surface segment 121 may be omitted for mounting the semiconductor light-emitting element 2 directly on the base 11. In the example shown in the figures, the front-surface second part 1212 is generally rectangular as viewed in the z direction.

The pair of front-surface third parts 1213 are spaced apart from each other in the x direction, with the front-surface second part 1212 located between them. The front-surface third parts 1213 are used to provide electrical communication between the front-surface segment 121 and the semiconductor light-emitting element 2. In the example shown in the figures, each front-surface third part 1213 is generally rectangular and located apart from the base first side surfaces 113 of the base 11.

Each connection part 1214 connects a front-surface first part 1211 and a front-surface third part 1213 adjacent thereto. The example shown in the figures includes four connection parts 1214 each having a strip shape elongated in the y direction. In addition, the connection parts 1214 of the example shown in the figures are located apart from the base first side surfaces 113 of the base 11.

The connection part 1215 connects the front-surface second part 1212 to a connection part 1214. In the example shown in the figures, the connection part 1215 is elongated in the x direction and located apart from the base second side surfaces 114 of the base 11.

The back-surface segment 122 comprises parts formed on the base back surface 112 of the base 11. In the present embodiment, the back-surface segment 122 includes four back-surface first parts 1221 and a pair of back-surface second parts 1222. For convenience, FIG. 31 shows the chain double-dashed lines (phantom lines) representing the boundaries of the four back-surface first parts 1221 and the pair of back-surface second parts 1222.

Each back-surface first part 1221 is contiguous with a base third side surface 115 of the base 11. In the present embodiment, the back-surface first part 1221 is generally in a quarter-annular shape as viewed in the z direction. The back-surface first part 1221 is also contiguous with both a base first side surface 113 and a base second side surface 114. In the present embodiment, the four back-surface first parts 1221 are provided for the four base third side surfaces 115.

The pair of back-surface second parts 1222 are spaced apart from each other in the x direction. Each back-surface second part 1222 is connected to a pair of back-surface first parts 1221 that are adjacent to each other in the y direction. The pair of back-surface second parts 1222 will be used as electrodes when the semiconductor light-emitting device A4 is mounted on a circuit board (not shown).

The four side-surface segments 123 are formed on the four base third side surfaces 115, covering the respective base third side surfaces 115. In the present embodiment, each side-surface segment 123 substantially covers the entirety of the base third side surface 115. The side-surface segment 123 is contiguous with a front-surface first part 1211 of the front-surface segment 121 and a back-surface first part 1221 of the back-surface segment 122.

The insulating layer 13 is made of an electrically insulating material and covers parts of the conductive layer 12, leaving the other parts exposed. The insulating layer 13 is not specifically limited as to its material and so on. In the present embodiment, the insulating layer 13 includes a first insulating layer 13A and a second insulating layer 13B. The insulating layer 13 may be a laminate of three or more layers, including the first insulating layer 13A, the second insulating layer 13B and one or more additional layers.

The first insulating layer 13A is in contact with the base front surface 111 of the base 11. In one example, the first insulating layer 13A may be formed by applying a sheet (film) of solder resist by compression bonding.

The second insulating layer 13B is laminated on the first insulating layer 13A such that the second insulating layer 13B is located on the side in the one direction along the z direction. In the example shown in the figures, the second insulating layer 13B is in contact with the first insulating layer 13A. Alternatively, an additionally layer may be present between the first insulating layer 13A and the second insulating layer 13B. The second insulating layer 13B may be formed by applying a resin material such as solder resist to the first insulating layer 13A, followed by hardening.

In the example shown in the figures, particularly as shown in FIG. 33, the thickness to of the first insulating layer 13A is greater than the thickness tb of the second insulating layer 13B.

The first insulating layer 13A has a pair of insulating-layer first side surfaces 171 and two pairs of insulating-layer second side surfaces 172. The insulating-layer first side surfaces 171 are spaced apart from each other in the x direction and perpendicular to the x direction. Each insulating-layer first side surfaces 171 is flush with a base first side surface 113 of the base 11. The insulating-layer second side surfaces 172 in each pair are spaced apart from each other in the y direction and perpendicular to the y direction. Each insulating-layer second side surface 172 is flush with a base second side surface 114 of the base 11.

The second insulating layer 13B has two pairs of insulating-layer third side surfaces 191 and two pairs of insulating-layer fourth side surfaces 192. The insulating-layer third side surfaces 191 in each pair are spaced apart from each other in the x direction and perpendicular to the x direction. Each insulating-layer third side surface 191 is flush with an insulating-layer first side surface 171 of the first insulating layer 13A and also with a base first side surface 113 of the base 11. The insulating-layer fourth side surfaces 192 in each pair are spaced apart from each other in the y direction and perpendicular to the y direction. Each insulating-layer fourth side surface 192 is flush with an insulating-layer second side surface 172 of the first insulating layer 13A and also with a base second side surface 114 of the base 11.

As shown in FIGS. 30 and 33, in the present embodiment, the second insulating layer 13B has an edge 199 located between the base third side surface 115 of the base 11 and the edge 1219 of the front-surface first part 1211 of the front-surface segment 121 of the conductive layer 12 as viewed in the z direction. That is, the edge 199 overlaps the front-surface segment 121 as viewed in the z direction and does not overlap the part of the base front surface 111 exposed from the front-surface segment 121.

In the present embodiment, the insulating layer 13 includes four insulating-layer first parts 131, four insulating-layer second parts 132, a plurality of insulating-layer third parts 133 and a pair of connection parts 135. For convenience, FIGS. 30, 33, 35 and 37 show in chain double-dashed lines (phantom lines) the boundaries of the four insulating-layer first parts 131, the four insulating-layer second parts 132, the plurality of insulating-layer third parts 133 and the pair of connection parts 135.

In the present embodiment, aback-surface insulating layer 137 is provided on the base back surface 112 of the base 11. The back-surface insulating layer 137 is located between the pair of back-surface second parts 1222 for, for example, visually indicating the polarities of the semiconductor light-emitting device A4. The back-surface insulating layer 137 may be formed by using the same or different method as that used for the insulating layer 13.

The four insulating-layer first parts 131 are provided for the four base third side surfaces 115. As viewed in the z direction, each insulating-layer first part 131 is located outside, beyond the base third side surface 115. In the example shown in the figures, the insulating-layer first part 131 is generally in a quarter-circular shape as viewed in the z direction. In the present embodiment, each insulating-layer first part 131 is composed of a part of the first insulating layer 13A and a part of the second insulating layer 13B.

The four insulating-layer second parts 132 are provided for the four base third side surfaces 115. The insulating-layer second parts 132 are formed on the front-surface segment 121 of the conductive layer 12 such that each insulating-layer second part overlaps a front-surface first part 1211 as viewed in the z direction. In the present embodiment, each insulating-layer second part 132 is composed of a part of the first insulating layer 13A and a part of the second insulating layer 13B. In the example shown in the figures, the insulating-layer second part 132 is generally in a quarter-annular shape as viewed in the z direction. The insulating-layer first parts 131 have a first thickness t1 that is greater than the second thickness t2 of the insulating-layer second parts 132. In addition, the second thickness t2 of the insulating-layer second parts 132 is a greater than the thickness of the front-surface first parts 1211 of the conductive layer 12.

Each insulating-layer third part 133 is adjacent to an insulating-layer second part 132 and in contact with the base front surface 111. In other words, no conductive layer 12 is present between the insulating-layer third part 133 and the base front surface 111 of the base 11. In the present embodiment, each insulating-layer first part 131 is composed solely of a part of the first insulating layer 13A.

Each insulating-layer fourth part 134 is a part present between an insulating-layer second part 132 and an insulating-layer third part 133 and on the front-surface segment 121 (the front-surface first part 1211). In the present embodiment, each insulating-layer fourth part 134 is composed solely of a part of the first insulating layer 13A. The insulating-layer fourth parts 134 have a fourth thickness t4 that is greater than the second thickness t2 of the insulating-layer second parts 132. The fourth thickness t4 of the insulating-layer fourth parts 134 is greater than the third thickness t3 of the insulating-layer third parts 133.

Each connection part 135 connects a pair of insulating-layer third parts 133 that are adjacent to each other in the y direction. In the example shown in the figures, the connection part 135 has a strip shape elongated in the y direction. In addition, the connection part 135 of the example shown in the figures is contiguous with a base first side surface 113 of the base 11. In the example shown in the figures, each connection part 135 is composed solely of a part of the first insulating layer 13A.

As shown in FIGS. 33, 35 and 37, the insulating layer 13 has an insulating-layer first surface 141, an insulating-layer second surface 142, an insulating-layer third surface 143, an insulating-layer fourth surface 144, an insulating-layer fifth surface 145, an insulating-layer sixth surface 146, an insulating-layer seventh surface 147, an insulating-layer eighth surface 148 and an insulating-layer ninth surface 149.

The insulating-layer first surface 141 refers to a surface region of each insulating-layer first part 131 and located on the side in the one direction along the z direction (the upper side in the figures). In the example shown in the figures, the insulating-layer first surface 141 defines a substantially flat surface along the xy plane. The insulating-layer second surface 142 refers to a surface region of each insulating-layer second part 132 and located on the side in the one direction along the z direction (the upper side in the figures). In the example shown in the figures, the insulating-layer second surface 142 defines a substantially flat surface along the xy plane.

The insulating-layer third surface 143 refers to a surface region of each insulating-layer third part 133 and each insulating-layer fourth part 134, located on the side in the one direction along the z direction. In the example shown in the figures, the insulating-layer third surface 143 is gently curved toward the side in the other direction along the z direction as it is farther away from the insulating-layer second surface 142 as viewed in the z direction. The insulating-layer fifth surface 145 refers to a surface region of each insulating-layer third part 133, extending in the z direction and facing away from the insulating-layer second part 132 in the direction perpendicular to the z direction. The insulating-layer fourth surface 144 defines an outward curve between the insulating-layer third surface 143 and the insulating-layer fifth surface 145. The insulating-layer sixth surface 146 extends from the insulating-layer fifth surface 145 to the base front surface 111 and thus in contact with the base front surface 111. The insulating-layer fifth surface 145 defines an outward curve bulging obliquely downward. As viewed in the z direction, the boundary between the insulating-layer fifth surface 145 and the base front surface 111 is closer to the base third side surface 115 than the insulating-layer fifth surface 145 is.

The insulating-layer seventh surface 147 and the insulating-layer eighth surface 148 refer to surface regions of each insulating-layer first part 131 and located on the side in the other direction along the z direction (the lower side in the figures). The insulating-layer seventh surface 147 is spaced apart from the base third side surface 115 as viewed in the z direction and extends to the boundary between an insulating-layer first side surface 171 and an insulating-layer second side surface 172. In the example shown in the figures, the insulating-layer first side surface 171 is shifted in position from the base front surface 111 in the other direction along the z direction and from the base back surface 112 in the one direction along the z direction. In the example shown in the figures, the insulating-layer seventh surface 147 defines a substantially flat surface along the xy plane. The insulating-layer eighth surface 148 extends from the insulating-layer seventh surface 147 to the base third side surface 115. In the example shown in the figures, the insulating-layer seventh surface 147 is shifted in position from the insulating-layer eighth surface 148 in the other direction along the z direction. The insulating-layer eighth surface 148 defines a profile that is gently curved outward. The boundary between the insulating-layer eighth surface 148 and the base third side surface 115 is shifted in position in the one direction along the z direction, from the boundary between the insulating-layer seventh surface 147 and the insulating-layer eighth surface 148.

As shown in FIG. 37, the insulating-layer ninth surface 149 refers to a surface region of each connection part 135 and located on the side in the one direction along the z direction (the upper side in the figure). The insulating-layer ninth surface 149 is connected to the insulating-layer third surfaces 143. The insulating-layer ninth surface 149 defines a relatively flat surface along the xy plane, as compared with the insulating-layer third surface 143.

As shown in FIGS. 33 and 35, the fifth thickness t5 corresponding to the distance from the base front surface 111 to the insulating-layer first surface 141 is greater than each of the second thickness t2 of the insulating-layer second part 132, the third thickness t3 of the insulating-layer third part 133 and the fourth thickness t4 of the insulating-layer fourth part 134.

The semiconductor light-emitting element 2 comprises a light source of the semiconductor light-emitting device A4. In the present embodiment, the semiconductor light-emitting element includes an element body 21, a first electrode 22 and a second electrode 23. The element body 21 includes a semiconductor layer, such as a layer of an InGaN-based semiconductor. The first electrode 22 may comprise a cathode, whereas the second electrode 23 may comprise an anode.

In the present embodiment, the semiconductor light-emitting element 2 is bonded to the front-surface second part 1212 of the front-surface segment 121 of the conductive layer 12 by using a bonding material 25. The bonding material 25 may be Ag paste or solder.

The first electrode 22 is connected to one of the front-surface third parts 1213 by a wire 28. The wire 28 is made of, for example, Au and includes a first bonding part 281 and a second bonding part 282. The first bonding part 281 is the part of the wire 28 bonded to the front-surface third part 1213. The second bonding part 282 is the part of the wire 28 bonded to the first electrode 22.

The second electrode 23 is connected to the other one of the front-surface third parts 1213 by a wire 29. The wire 29 is made of, for example, Au and includes a first bonding part 291 and a second bonding part 292. The first bonding part 291 is the part of the wire 29 bonded to the front-surface third part 1213. The second bonding part 292 is the part of the wire 29 bonded to the second electrode 23.

The resin member 3 covering the semiconductor light-emitting element 2 is made of a material that transmits light emitted from the semiconductor light-emitting element 2. In the present embodiment, the resin member 3 is formed on the base front surface 111 of the substrate 1 (on the side located in the one direction along the z direction), covering the base front surface 111, the front-surface segment 121 of the conductive layer 12, and the insulating layer 13.

The material of the resin member 3 is not specifically limited as long as it transmits light from the semiconductor light-emitting element 2. For example, resins such as a transparent epoxy resin and a silicone resin may be selectable. In the present embodiment, the resin member 3 contains a fluorescent material. When excited by the light emitted from the semiconductor light-emitting element 2, the fluorescent material emits light of different wavelengths. For example, the fluorescent material emits yellow light in response to blue light emitted by the semiconductor light-emitting element 2. This enables the semiconductor light-emitting device A4 to produce white light, for example.

As shown in FIGS. 29 and 32 to 37, the resin member 3 of this embodiment has a resin front surface 31, a pair of resin first side surfaces 32 and a pair of resin second side surfaces 33.

The resin front surface 31 faces in the one direction along the z direction. In the present embodiment, the resin front surface 31 comprises a flat surface generally along the xy plane. The resin first side surfaces 32 are spaced apart from each other in the x direction and, in the present embodiment, perpendicular to the x direction. In the example shown in the figures, each resin first side surface 32 is flush with a base first side surface 113 of the base 11, an insulating-layer first side surface 171 of the first insulating layer 13A and an insulating-layer third side surface 191 of the second insulating layer 13B. The resin second side surfaces 33 are spaced apart from each other in the y direction and, in the present embodiment, perpendicular to the y direction. In the example shown in the figures, each resin second side surface 33 is flush with a base second side surface 114 of the base 11, an insulating-layer second side surface 172 of the first insulating layer 13A and an insulating-layer fourth side surface 192 of the second insulating layer 13B.

As shown in FIGS. 32 to 37, the first distance D1 refers to a distance from the insulating-layer first surface 141 to the resin front surface 31 in the z direction (the thickness of the resin member 3) measured at the boundary between the resin front surface 31 and the resin first side surface 32. This first distance D1 is substantially equal to the second distance D2 from the insulating-layer second surface 142 to the resin front surface 31 in the z direction. In addition, the third distance D3 from the insulating-layer third surface 143 to the resin front surface 31 in the z direction (the thickness of the resin member 3) is longer than each of the first distance D1 and the second distance D2. The fourth distance D4 from the base front surface 111 to the resin front surface 31 in the z direction (the thickness of the resin member 3) is longer than each of the first distance D1, the second distance D2 and the third distance D3.

The following now describes an example of a method of manufacturing a semiconductor light-emitting device A4 with reference to FIGS. 39 to 44.

Figure 39:
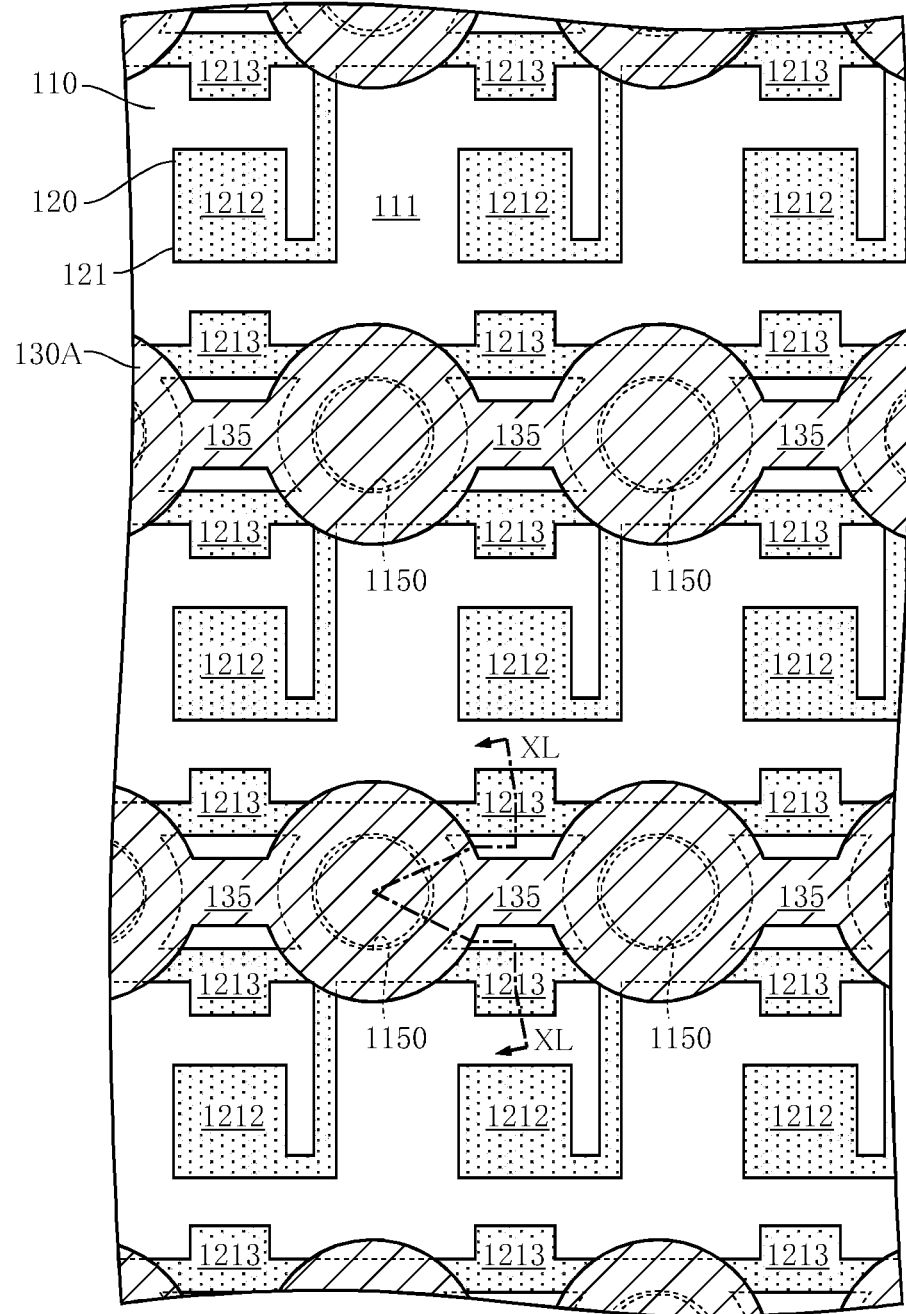
FIG. 39 is a fragmentary plan view illustrating one example of a method of manufacturing a semiconductor light-emitting device according to the fourth embodiment of the present disclosure.
Figure 40:
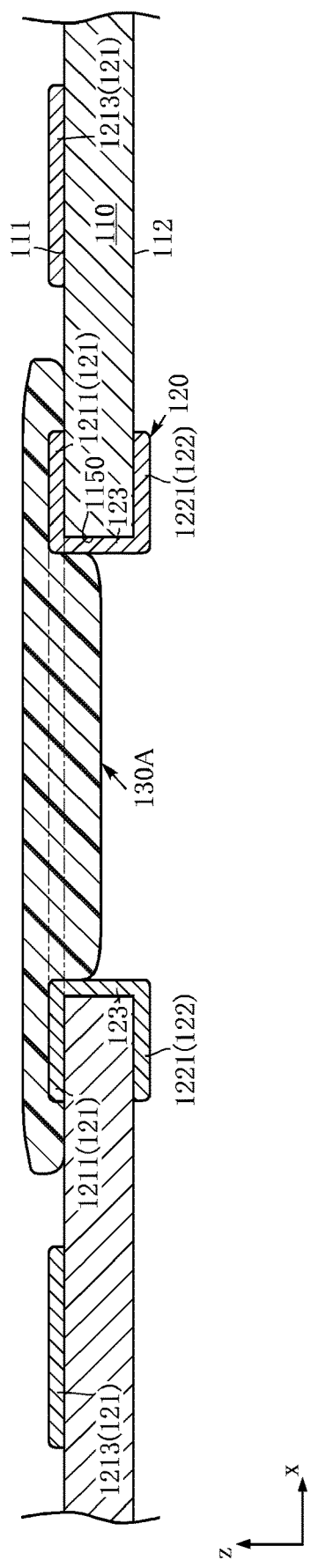
FIG. 40 is a sectional view taken along line XL-XL of FIG. 39.

First, a substrate member 110 as shown in FIGS. 39 and 40 is prepared. Roughly speaking, the substrate member 110 is a component from which a plurality of bases 11 will be obtained and has a plurality of bases 11 arranged in an x-y matrix. The substrate member 110 has a plurality of through holes 1150. The through holes 1150 will form the base third side surfaces 115 once the substrate member 110 is cut.

The substrate member 110 has a conductive layer 120 and a first insulating layer 130A. The conductive layer 120 has parts to be formed into the above-described parts of the conductive layer 12. The first insulating layer 130A has parts to be formed into the above-described parts of the first insulating layer 13A. The conductive layer 120 may be formed by plating, for example. The insulating layer 130A may be formed by compression bonding of a solder resist sheet (or film) to the substrate member 110.

As shown in FIG. 40, the insulating layer 130A has parts closing the through holes 1150. As a result of the compression bonding mentioned above, the first insulating layer 130A is thinner at the parts residing on the front-surface first parts 1211 than the parts closing the through holes 1150. Each part of the first insulating layer 130A closing a through hole 1150 is substantially flat along the xy plane and has a substantially uniform thickness.

Figure 41:
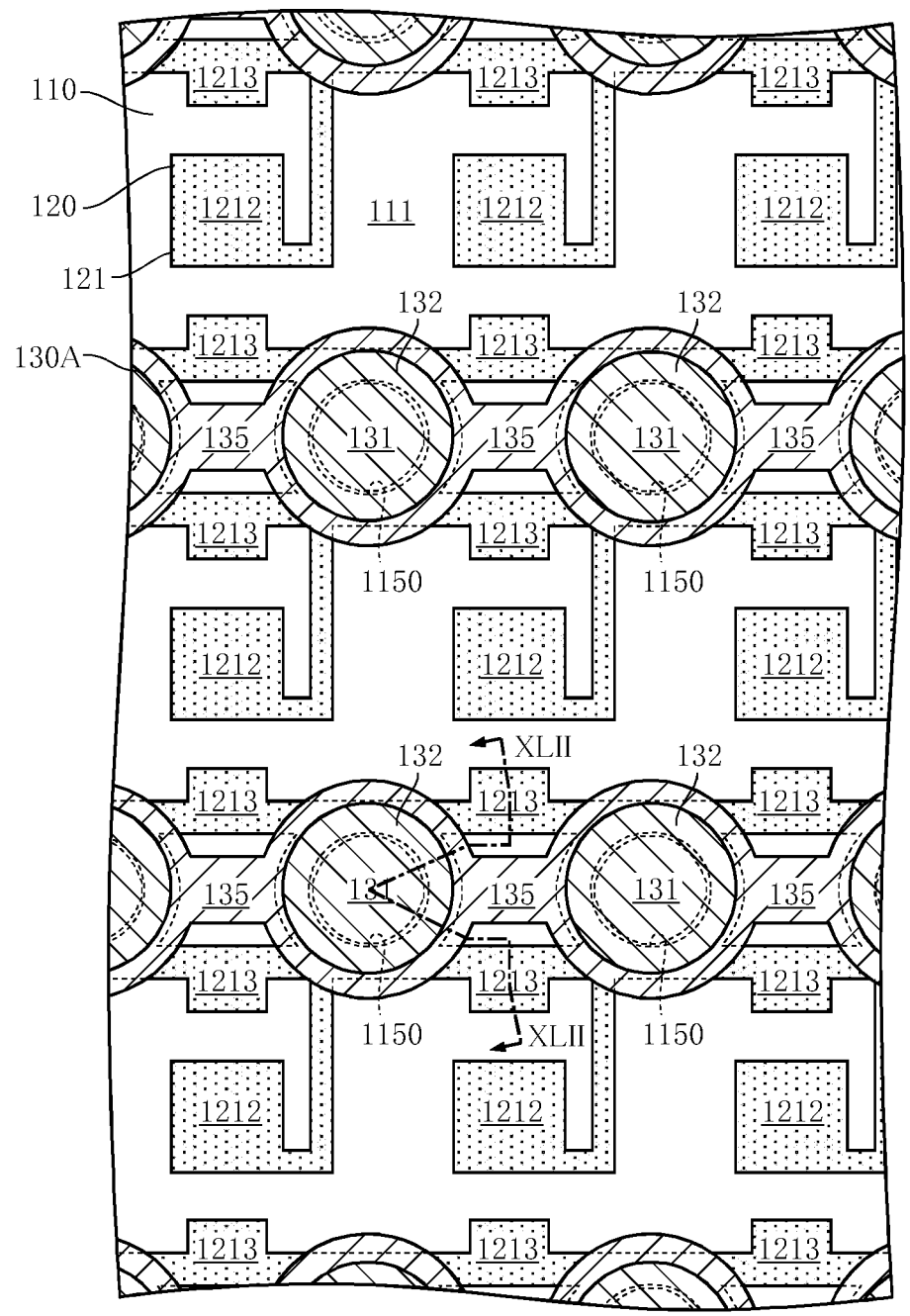
FIG. 41 is a fragmentary plan view illustrating an example of the method of manufacturing a semiconductor light-emitting device according to the fourth embodiment of the present disclosure.
Figure 42:
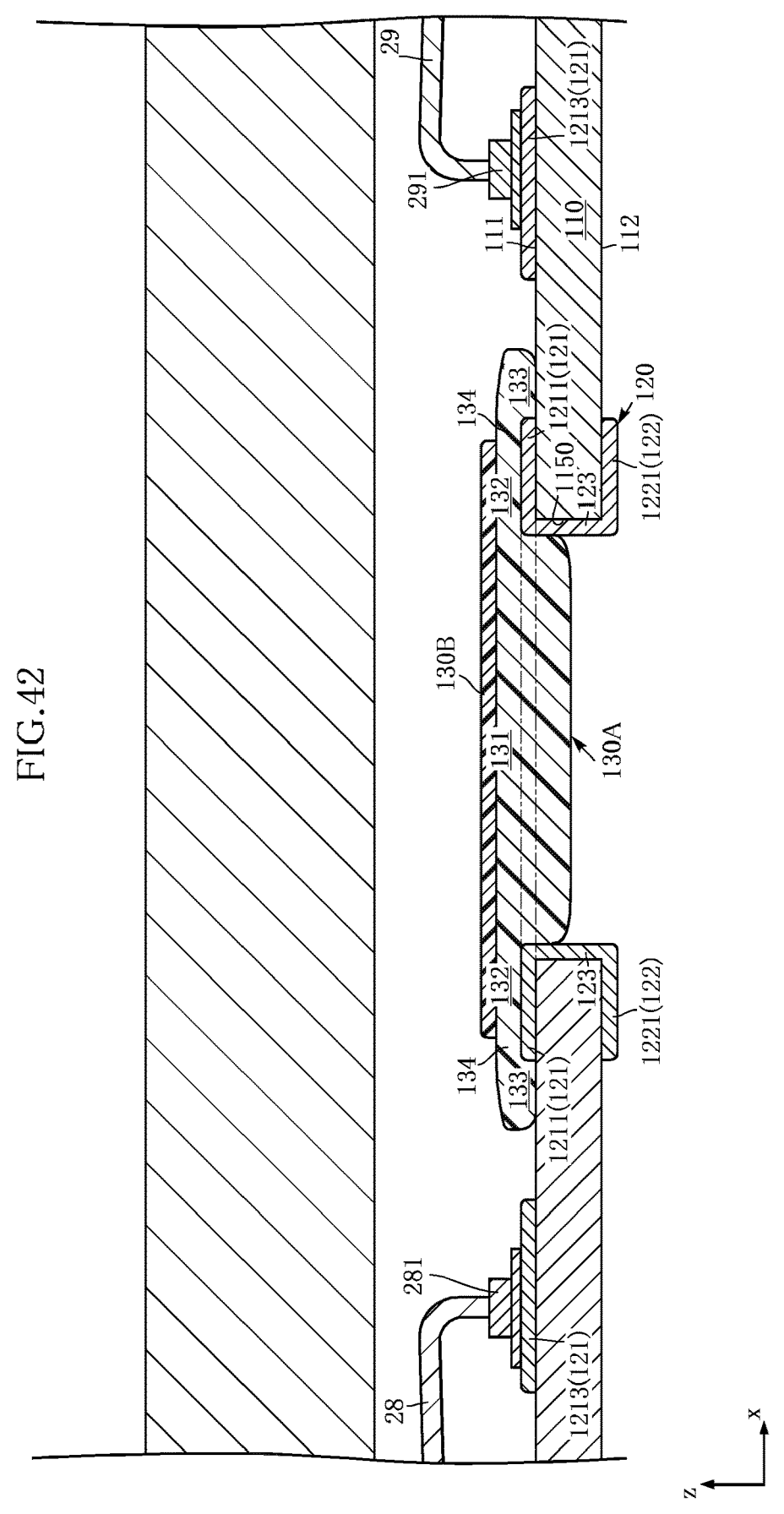

As shown in FIGS. 41 and 42, a second insulating layer 130B is formed. The second insulating layer 130B may be formed by applying a resin material such as solder resist to the first insulating layer 130A, followed by hardening. In the present embodiment, the second insulating layer 130B is formed so as to cover circular shapes defined by the through holes 1150 as viewed in the z direction. This provides parts to be formed into the insulating-layer first parts 131, insulating-layer second parts 132, insulating-layer third parts 133 and insulating-layer fourth parts 134 described above.

Next, a plurality of semiconductor light-emitting elements 2 are mounted by bonding. In this bonding process, the element body 21 of each semiconductor light-emitting element 2 is bonded to a front-surface second part 1212 of the conductive layer 120 by using a bonding material 25. In addition, the first electrode 22 and the second electrode 23 of the element body 21 are connected to a pair of front-surface third parts 1213 via a wire 28 and wire 29.

Next, a mold 71 is set in position. Together with the base front surface 111 of the substrate member 110, the mold 71 defines a cavity for resin forming.

Figure 43:
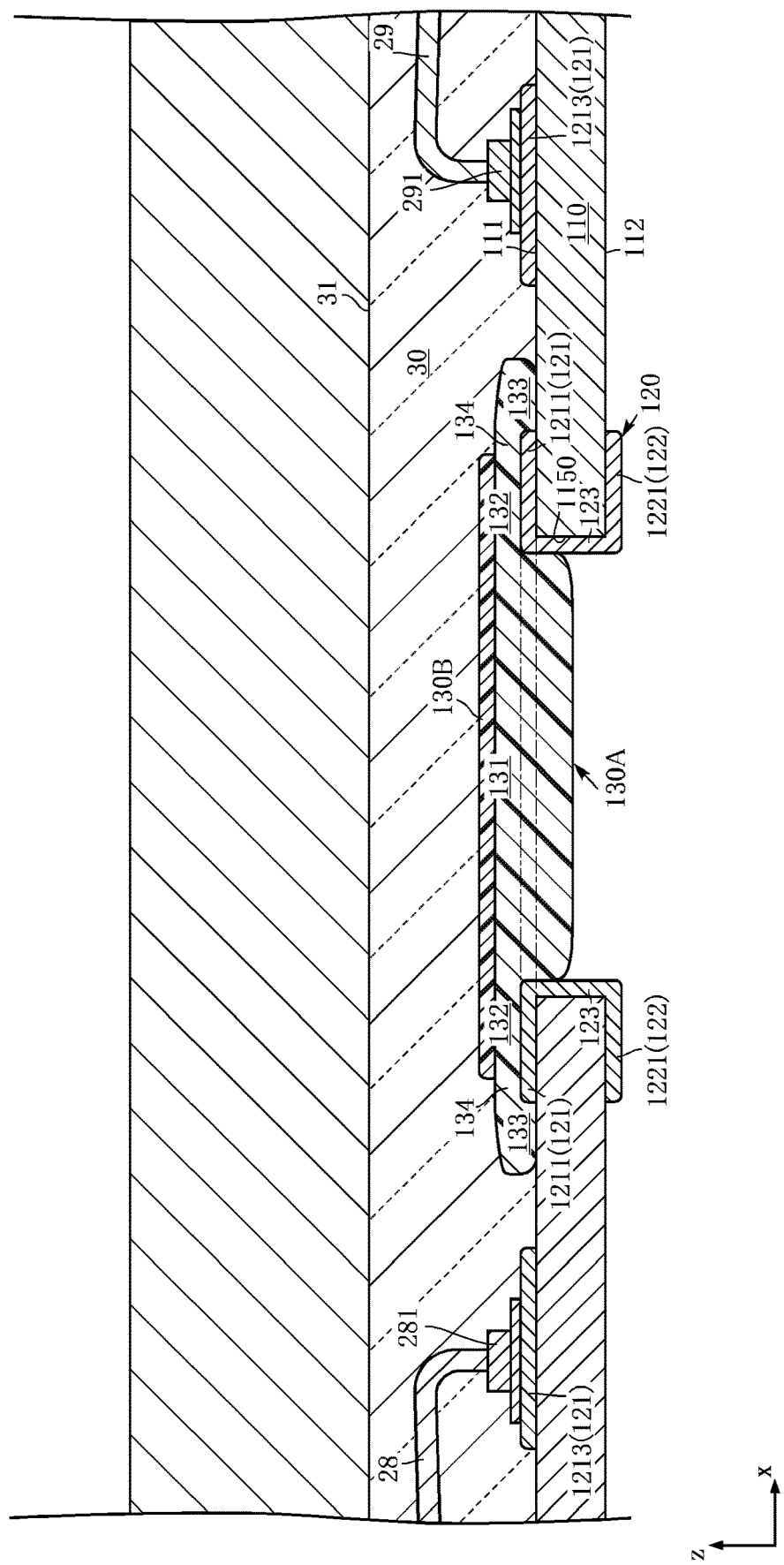
FIG. 43 is a fragmentary sectional view illustrating an example of the method of manufacturing a semiconductor light-emitting device according to the fourth embodiment of the present disclosure.

Next, as shown in FIG. 43, the cavity of the mold 71 is filled with a resin material. At this stage, each insulating-layer first part 131 closing the gap between the base third side surfaces 115 is such that the first thickness t1 is greater than the second thickness t2. As the stiffness of such a part is higher, the insulating-layer first part 131 remains flat despite the pressure of the injected resin material. The resin material then hardens to form a resin member 30.

Figure 44:
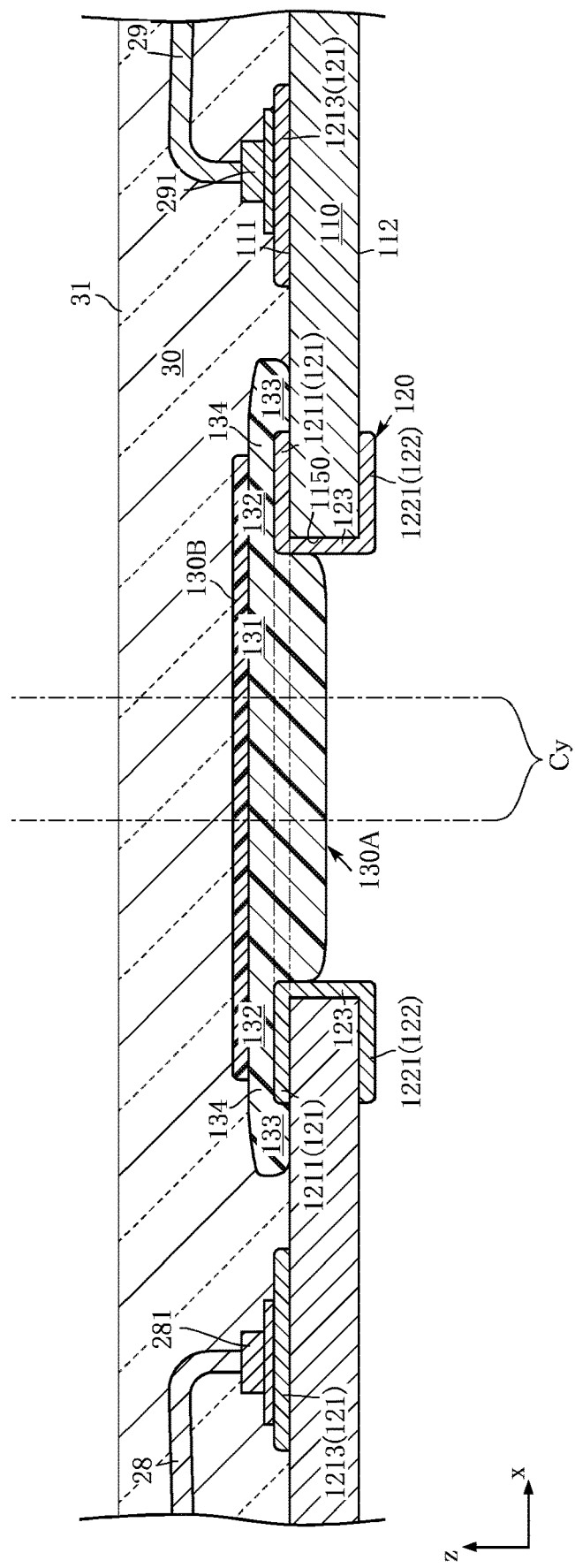
FIG. 44 is a fragmentary sectional view illustrating an example of the method of manufacturing a semiconductor light-emitting device according to the fourth embodiment of the present disclosure.

After filling with the resin material, the mold 71 is removed as shown in FIG. 44. Then, the substrate member 110, the conductive layer 120, the insulating layer 130 and the resin member 30 are cut along the lines Cy extending in the y direction (shown in the figure) and lines extending in the x direction (not shown in the figure). In this way, a plurality of semiconductor light-emitting devices A4 are obtained.

The following now describes advantages of the semiconductor light-emitting device A4.

As shown in FIGS. 32 to 37, the present embodiment provides that the first thickness t1 of the insulating-layer first parts 131 is greater than the second thickness of the insulating-layer second part 132. Thus, the insulating-layer first parts 131 have a higher stiffness. This achieves advantages during the manufacture of the semiconductor light-emitting device A4, for example. In the step of injecting a resin material as shown in FIG. 43, the insulating-layer first part 131 does not easily bend in the other direction along the z direction or the insulating-layer first part 131 does not easily break. In this way, the configuration of the semiconductor light-emitting device A4 ensures that variations in the shape of the resin member 3 are reduced. Thus, the semiconductor light-emitting device A4 is provided with the resin member 3 having a flat resin front surface 31.

According to the present embodiment, the insulating layer 13 is composed of the first insulating layer 13A and the second insulating layer 13B. Each insulating-layer first part 131 is formed by laminating a second insulating layer 13B on a first insulating layer 13A. In this way, the stiffness of the resulting insulating-layer first part 131 can be readily and reliably increased. This is preferable for reducing variations in the shape of the resin member 3.

Since the first insulating layer 13A is thicker than the second insulating layer 13B, the breakage of the first insulating layer 13A is prevented at the time of forming the second insulating layer 13B.

Each insulating-layer second part 132 is composed of the first insulating layer 13A and the second insulating layer 13B. This configuration ensures that the stiffness of the insulating-layer second part 132 is not extremely lower than that of the insulating-layer first part 131. This is preferable for preventing breakage of the insulating-layer second parts 132 and consequent falling of the insulating-layer first part 131 in the other direction along the z direction.

The edge 199 of the second insulating layer 13B is located between the base third side surface 115 and the edge 1219 of the front-surface first part 1211 as viewed in the z direction, and not reaching a location beyond the front-surface first part 1211 as viewed in the z direction. This reduces the risk that the second insulating layer 13B interferes with a bonding capillary used to form the first bonding part 281 of the wire 28 and the first bonding part 291 of the wire 29. This is preferable for further reducing the size of the semiconductor light-emitting device A4.

The insulating layer 13 has the insulating-layer third parts 133 that are directly bonded to the base front surface 111 of the base 11. In general, when bonded to the base 11 made of an insulating material such as resin, the insulating layer 13 made of e.g., resin achieves a higher bonding strength than the conductive layer 12 made of metal. Owing to this higher bonding strength, the insulating-layer third parts 133 can prevent detachment of the insulating layer 13 from the base 11.

Each insulating-layer sixth surface 146 has a profile that is curved inward as it is closer to the base front surface 111 of the base 11. Thus, a part of the resin member 3 is located between the insulating-layer sixth surface 146 and the base front surface 111. This helps to prevent detachment of the resin member 3 from the base front surface 111. Owing to its high bonding strength to the base 11, the insulating-layer third parts 133 are particularly suitable for preventing detachment of the resin member 3.

Each insulating-layer eighth surface 148 has a profile that is curved in the one direction along the z direction at a position closer to the base third side surface 115. Thus, the insulating layer 13 leaves a larger region of the base third side surface 115 uncovered. This allows solder to be applied to the larger uncovered region of the base third side surface 115 in addition to the back-surface first parts 1221. Consequently, the semiconductor light-emitting device A4 is more firmly mounted on, for example, a circuit board.

The resin member 3 has the resin first side surfaces 32 and the resin second side surfaces 33 that are respectively flush with the base first side surfaces 113 and the base second side surfaces 114 of the base 11. That is, the entire resin member 3 overlaps the base 11 and vice versa, as viewed in the z direction. This maximizes the volume of the resin member 3, allowing a larger semiconductor light-emitting element 2 to be mounted relative to the size of the base 11. According to the present embodiment, the semiconductor light-emitting element 2 is connected to the wires 28 and 29, which extend opposite in the x direction. Such wires 28 and 29 can be appropriately covered with the resin member 3, without compromising the compactness of the semiconductor light-emitting device A1.

As shown in FIG. 33, the fifth thickness t5 is substantially equal to the total thickness of the second thickness t2 and the thickness of the front-surface first part 1211. In addition, the first thickness t1 is greater than the fifth thickness t5. The insulating-layer first parts 131 having such a first thickness t1 has a sufficiently high stiffness and preferable for reducing variations in the shape of the resin member 3.

The thickness of the front-surface first parts 1211 is smaller than the second thickness t2 of the insulating-layer second parts 132. This makes it possible to reduce the z-direction dimension of the semiconductor light-emitting device A4. Note that the second thickness t2 of the insulating-layer second parts 132 should not be too thin in order to prevent the front-surface first parts 1211 from being unintentionally exposed. The present embodiment is configured to prevent such undesirable occurrences.

Figure 45:
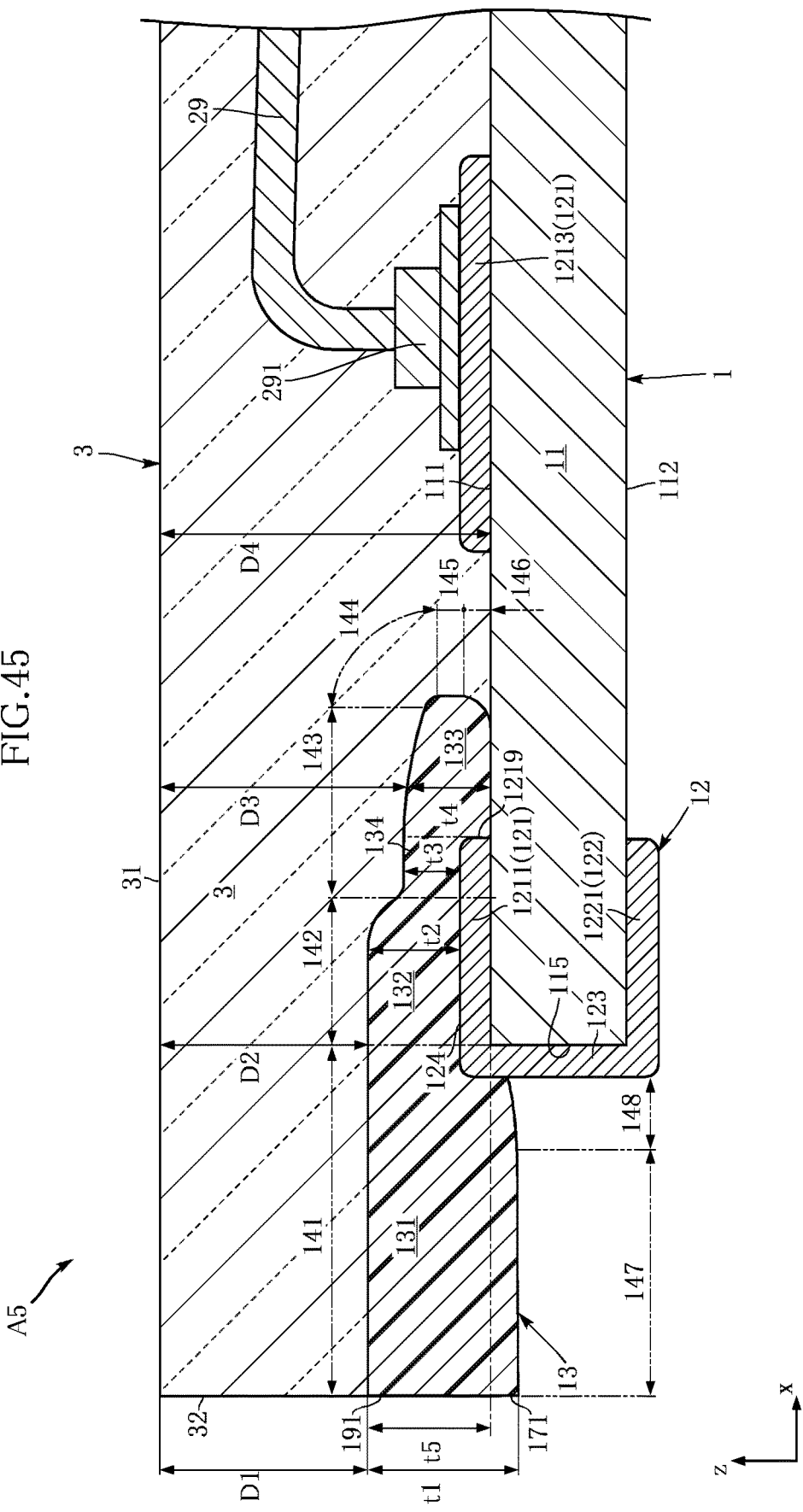
FIG. 45 is an enlarged fragmentary sectional view of a semiconductor light-emitting device according to a fifth embodiment of the present disclosure.
Figure 46:
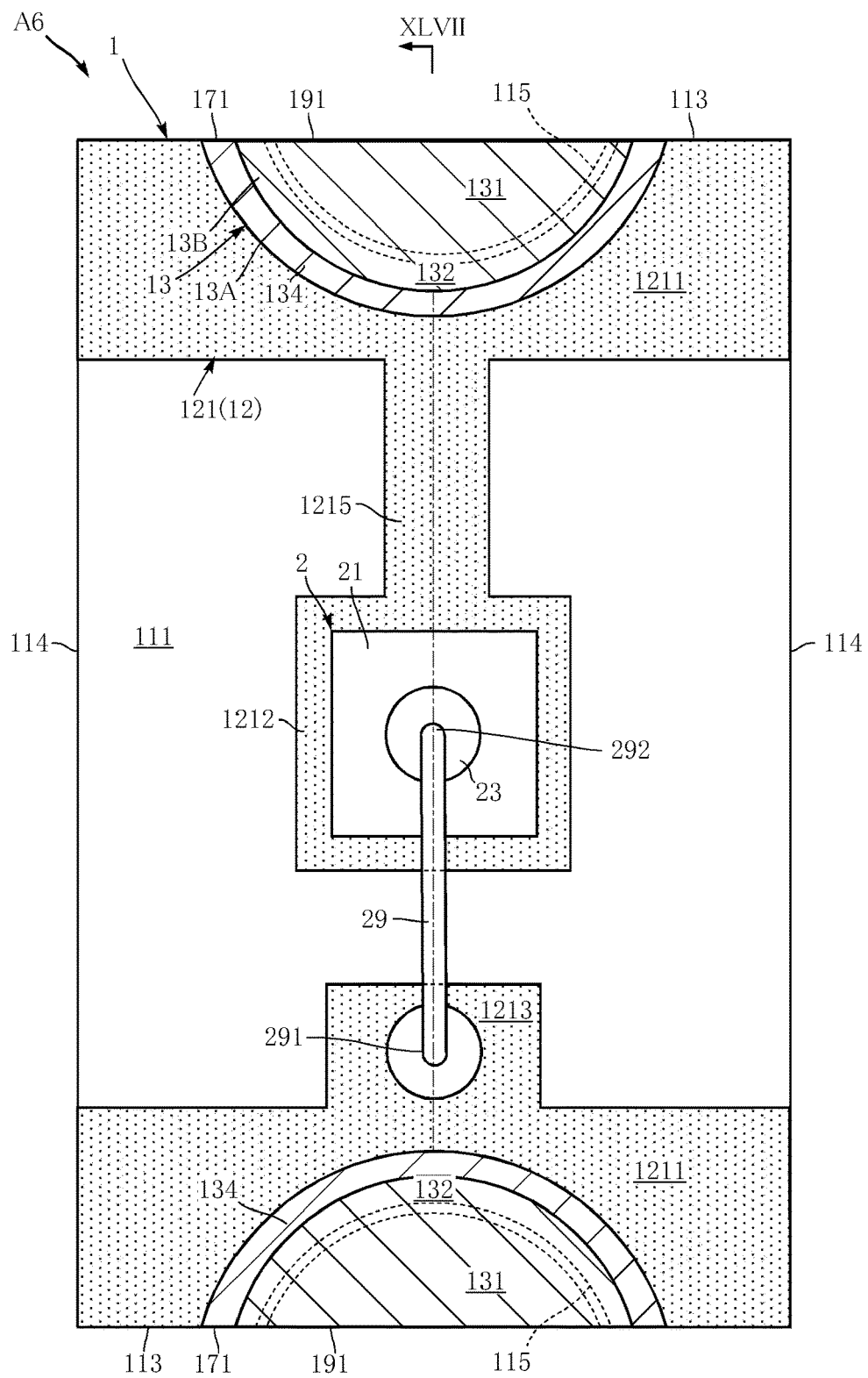
FIG. 46 is a fragmentary plan view of a semiconductor light-emitting device according to a sixth embodiment of the present disclosure.

FIGS. 45 to 47 show other embodiments of the present disclosure. In these figures, the same or similar elements as those described in the above-described embodiment are denoted by the same reference signs.

Fifth Embodiment

FIG. 45 shows a semiconductor light-emitting device according to a fifth embodiment of the present disclosure.

The semiconductor light-emitting device A5 of the present embodiment differs from that of the above-described embodiments in the configuration of the insulating layer 13.

In the present embodiment, the insulating layer 13 is composed of a single layer rather than a plurality of distinct layers. Yet, the present embodiment is similar to the above-described embodiments in that the insulating layer 13 has the insulating-layer first parts 131 and the insulating-layer second parts 132 and that the first thickness t1 is greater than the second thickness t2. In the in the example shown in the figures, the insulating layer 13 has parts that are similar in shape to the corresponding parts described in the above-described embodiments. Alternatively, however, the details of such parts may be modified.

The insulating layer 13 of this embodiment may be made by preparing a solder resist sheet (film) having a plurality of regions having different thicknesses and bonding the sheet to the base 11. Alternatively, after the insulating layer is formed to cover the through holes 1150, a resin material may be applied to be integral with the insulating layer. This provides a single-layer structure, rather than a plurality of layers that can be distinctly identified after they are formed.

The present embodiment can reduce variations in the shape of the resin members 3, in addition to the other advantages of the above-described embodiments. As can be understood from the present embodiment, the method of forming the insulating layer 13 is not specifically limited.

Sixth Embodiment

FIGS. 46 and 47 show a semiconductor light-emitting device according to a sixth embodiment of the present disclosure. The semiconductor light-emitting device A6 of the present embodiment differs from the above-described embodiments mainly in the number, position and shape of the base third side surfaces 115. For convenience, FIG. 46 omits the resin member 3.

The present embodiment provides two base third side surfaces 115. More specifically, the pair of base third side surfaces 115 are spaced apart from each other in the x direction. Each base third side surface 115 is located generally centrally of the base 11 in the y direction. The base third side surface 115 is generally in a semi-circular shape as viewed in the z direction.

In accordance with the position and shape of the base third side surfaces 115, the insulating layer 13 has the insulating-layer first parts 131 and the insulating-layer second parts 132 each of which is located generally at the center of the base 11 in the y direction. Each insulating-layer first part 131 is generally in a semi-circular shape as viewed in the insulating-layer second part, and each insulating-layer second part 132 is generally in a semi-annular shape as viewed in the z direction.

The semiconductor light-emitting element 2 has a first electrode 22 and a second electrode 23, one on the upper surface and the other on the lower surface of the element body 21 in the z direction. The first electrode 22 is bonded to the front-surface segment 121 using an electrically conductive bonding material 25. The second electrode 23 is connected to a wire 29.

The present embodiment is similar to the semiconductor light-emitting devices A4 and A5, as to the relative lengths of the first thickness t1, the second thickness t2, the third thickness t3, the fourth thickness t4 and the fifth thickness t5, as well as the relative lengths of the first distance D1, the second distance D2, the third distance D3 and the fourth distance D4.

The present embodiment can reduce variations in the shape of resin members 3, in addition to the other advantages of the above-described embodiments. In addition, as can be understood from the present embodiment, the number and the position of the base third side surfaces 115 of the base 11 are not specifically limited.

The semiconductor light-emitting devices according to the present disclosure are not limited to the above-described embodiments. The specific configuration of each component of the semiconductor light-emitting devices according to the present disclosure may be subjected to various design changes.

[Clause B1]

A semiconductor light-emitting device comprising:
  a substrate including
    an insulating base having a base front surface facing in one direction along a thickness direction and a base back surface facing in another direction along the thickness direction,
    a conductive layer formed on the base, and
    an insulating layer covering a part of the conductive layer;
  a semiconductor light-emitting element mounted on the base front surface of the substrate; and
  a resin member covering the semiconductor light-emitting element, the resin member being configured to transmit light from the semiconductor light-emitting element, wherein
    the base of the substrate has
      a pair of base first side surfaces connecting the base front surface and the base back surface and spaced apart from each other in a first direction, and
      third side surfaces connecting the base front surface and the base back surface and each being recessed from one of the base first side surfaces toward the semiconductor light-emitting element as viewed in the thickness direction,
    the conductive layer has a front-surface segment formed on the base front surface and a side surface segment formed on one of the base third side surfaces,
    the front-surface segment has a front-surface first part that is integral with the side surface segment and adjacent to the base third side surface at a position closer to the semiconductor light-emitting element,
    the insulating layer has
      an insulating-layer first part located opposite from the semiconductor light-emitting element across the base third side surface as viewed in the thickness direction, and
      an insulating-layer second part overlapping the front-surface first part of the conductive layer as viewed in the thickness direction,
    the resin member covers the insulating-layer first part and the insulating-layer second part of the insulating layer, and
    a first thickness of the insulating-layer first part is greater than a second thickness of the insulating-layer second part.

[Clause B2]

The semiconductor light-emitting device according to Clause B1, wherein
  the insulating layer includes a first insulating layer and a second insulating layer disposed on the first insulating layer such that the second insulating layer is located on a side in the one direction along the thickness direction, and
  the insulating-layer first part includes the first insulating layer and the second insulating layer.

[Clause B3]

The semiconductor light-emitting device according to Clause B2, wherein the first insulating layer has a greater thickness than the second insulating layer.

[Clause B4]
The semiconductor light-emitting device according to Clause B2 or B3, wherein the insulating-layer second part includes the first insulating layer and the second insulating layer.

[Clause B5]
The semiconductor light-emitting device according to Clause B3, wherein the second insulating layer has an edge located between the base third side surface and an edge of the front-surface first part as viewed in the thickness direction.

[Clause B6]
The semiconductor light-emitting device according to any one of Clauses B2 to B4, wherein the insulating layer has an insulating-layer third part that is adjacent to the front-surface first part and in contact with the base front surface.

[Clause B7]
The semiconductor light-emitting device according to Clause B6, wherein a first distance from the insulating-layer first part to a front surface of the resin member is shorter than a third distance from the insulating-layer third part to the front surface of the resin member.

[Clause B8]
The semiconductor light-emitting device according to Clause B7, wherein a second distance from the insulating-layer second part to the front surface of the resin member is shorter than the third distance.

[Clause B9]
The semiconductor light-emitting device according to any one of Clauses B6 to B8, wherein the insulating layer has an insulating-layer fourth part between the insulating-layer second part and the insulating-layer third part and on the front-surface first part, the insulating-layer fourth part being composed of the second insulating layer.

[Clause B10]
The semiconductor light-emitting device according to Clause B9, wherein a fourth thickness of the insulating-layer fourth part is smaller than a third thickness of the insulating-layer third part.

[Clause B11]
The semiconductor light-emitting device according to Clause B10, wherein the second thickness is greater than a thickness of the front-surface first part of the front-surface segment of the conductive layer.

[Clause B12]
The semiconductor light-emitting device according to Clause B11, wherein the fourth thickness is greater than the thickness of the front-surface first part of the front-surface segment of the conductive layer.

[Clause B13]
The semiconductor light-emitting device according to any one of Clauses B2 to B12, wherein
the base of the substrate has
a pair of base second side surfaces connecting the base front surface and the base back surface and spaced apart from each other in a second direction that is perpendicular to the first direction and the thickness direction, and
the base third side surfaces comprising four base third side surfaces, and
each of the base third side surfaces is present between one of the base first side surfaces and one of the base second side surfaces.

[Clause B14]
The semiconductor light-emitting device according to Clause B13, wherein
the resin member has
a pair of resin first side surfaces that are flush with the pair of base first side surfaces and
a pair of resin second side surfaces that are flush with the pair of base second side surfaces.

[Clause B15]
The semiconductor light-emitting device according to Clause B14, wherein the first insulating layer has
an insulating-layer first side surface that is flush with one of the base first side surfaces and
an insulating-layer second side surface that is flush with one of the base second side surfaces.

[Clause B16]
The semiconductor light-emitting device according to Clause B15, wherein the second insulating layer has
an insulating-layer third side surface that is flush with the insulating-layer first side surface and the one of the base first side surfaces and
an insulating-layer fourth side surface that is flush with the insulating-layer second side surface and the one of the base second side surfaces.

[Clause B17]
The semiconductor light-emitting device according to any one of Clauses B1 to B16, wherein a fifth thickness corresponding to a distance from the base front surface to an insulating-layer first surface of the insulating-layer first part on the side in the one direction of the thickness direction is greater than the second thickness.

The invention claimed is:
1. A semiconductor light-emitting device, comprising:
a substrate including: an insulating base having a base front surface facing in one direction along a thickness direction and a base back surface facing in another direction along the thickness direction; a conductive layer formed on the base; and an insulating layer covering a part of the conductive layer;
a semiconductor light-emitting element mounted on the base front surface of the substrate; and
a resin member covering the semiconductor light-emitting element, the resin member being configured to transmit light from the semiconductor light-emitting element, wherein
the base of the substrate includes: a pair of base first side surfaces connecting the base front surface and the base back surface and spaced apart from each other in a first direction; and a pair of base third side surfaces connecting the base front surface and the base back surface and each being recessed from one of the base first side surfaces toward the semiconductor light-emitting element as viewed in the thickness direction,
the conductive layer includes a front-surface segment formed on the base front surface and a side surface segment formed on one of the base third side surfaces,
the front-surface segment includes a front-surface first part that is integral with the side surface segment and adjacent to the base third side surface at a position closer to the semiconductor light-emitting element,
the insulating layer includes: an insulating-layer first part located opposite from the semiconductor light-emitting element across the base third side surface as viewed in the thickness direction; and an insulating-layer second part overlapping the front-surface first part of the conductive layer as viewed in the thickness direction,
the resin member covers the insulating-layer first part and the insulating-layer second part of the insulating layer,
the insulating-layer first part includes an insulating-layer first surface that is in contact with the resin member, the insulating-layer second part includes an insulating- layer second surface that is in contact with the resin member, wherein a first distance from an insulating-layer first region on the insulating-layer first surface to a resin first region on a resin front surface of the resin member is longer than a second distance from an insulating-layer second region on the insulating-layer second surface to a resin second surface on the resin front surface of the resin member, the resin first region overlapping the insulating-layer first region as viewed in the thickness direction, the resin second region overlapping the insulating-layer second region as viewed in the thickness direction.

2. The semiconductor light-emitting device according to claim 1, wherein
the resin front surface of the resin member has a resin third region overlapping the semiconductor light-emitting element as viewed in the thickness direction, and
the resin first region is shifted in position from the resin third region in the one direction along the thickness direction.

3. The semiconductor light-emitting device according to claim 2, wherein the resin first region is shifted in position from the resin second region in the one direction along the thickness direction.

4. The semiconductor light-emitting device according to claim 1, wherein the base of the substrate includes a pair of base second side surfaces connecting the base front surface and the base back surface and spaced apart from each other in a second direction that is perpendicular to the first direction and the thickness direction, the base third side surfaces comprising four base third side surfaces, and
each of the base third side surfaces is present between one of the base first side surfaces and one of the base second side surfaces.

5. The semiconductor light-emitting device according to claim 4, wherein the resin member includes: a pair of resin first side surfaces that are flush with the pair of base first side surfaces; and a pair of resin second side surfaces that are flush with the pair of base second side surfaces.

6. The semiconductor light-emitting device according to claim 5, wherein the insulating layer includes: an insulating-layer first side surface that is flush with one of the base first side surfaces; and an insulating-layer second side surface that is flush with one of the base second side surfaces.

7. The semiconductor light-emitting device according to claim 6, wherein the insulating-layer first region is where the insulating-layer first side surface, the insulating-layer second side surface and the insulating-layer first surface meet, and
the insulating-layer second region overlaps one of the base third side surfaces as viewed in the thickness direction.

8. The semiconductor light-emitting device according to claim 7, wherein the resin front surface of the resin member has a resin fourth region on a boundary with one of the resin second side surfaces, the resin fourth region overlapping the semiconductor light-emitting element as viewed in the first direction, and
the resin first region is shifted in position from the resin fourth region in the one direction along the thickness direction.

9. The semiconductor light-emitting device according to claim 7, wherein the resin front surface of the resin member has a resin fifth region on a boundary with one of the resin first side surfaces, the resin fifth region overlapping the semiconductor light-emitting element as viewed in the second direction, and
the resin first region is shifted in position from the resin fifth region in the one direction along the thickness direction.

10. The semiconductor light-emitting device according to claim 7, wherein the insulating-layer first region is shifted in position from the insulating-layer second region in the other direction along the thickness direction.

11. The semiconductor light-emitting device according to claim 10, wherein the insulating-layer first region is shifted in position from the base front surface in the other direction along the thickness direction.

12. The semiconductor light-emitting device according to claim 10, wherein the insulating-layer first region is located between the base front surface and a conductive-layer first surface of the front-surface first part in the thickness direction.

13. The semiconductor light-emitting device according to claim 10, wherein the insulating-layer first region is shifted in position from the base front surface and a conductive-layer first surface of the front-surface first part in the one direction along the thickness direction.

14. The semiconductor light-emitting device according to claim 7, wherein the insulating-layer first region is shifted in position from the insulating-layer second region in the one direction along the thickness direction.

15. The semiconductor light-emitting device according to claim 1, wherein the insulating layer has an insulating-layer third part that is adjacent to the insulating-layer second part and in contact with the base front surface.

16. The semiconductor light-emitting device according to claim 15, wherein the insulating-layer third part has a greater thickness than the insulating-layer second part.

17. The semiconductor light-emitting device according to claim 16, wherein the insulating-layer second part has a greater thickness than the front-surface first part of the front-surface segment of the conductive layer.

\* \* \* \* \*